(12) United States Patent
Tokita et al.

(10) Patent No.: US 8,178,872 B2
(45) Date of Patent: May 15, 2012

(54) MOLECULAR DEVICE, IMAGING DEVICE, PHOTOSENSOR, AND ELECTRONIC APPARATUS

(75) Inventors: Yuichi Tokita, Kanagawa (JP); Yoshio Goto, Kanagawa (JP); Jusuke Shimura, Kanagawa (JP); Seiji Yamada, Kanagawa (JP); Wei Luo, Kanagawa (JP); Daisuke Yamaguchi, Kanagawa (JP); Daisuke Ito, Kanagawa (JP)

(73) Assignee: Sony Corporation, Tokyo (JP)

( * ) Notice: Subject to any disclaimer, the term of this patent is extended or adjusted under 35 U.S.C. 154(b) by 231 days.

(21) Appl. No.: 12/756,555

(22) Filed: Apr. 8, 2010

(65) Prior Publication Data
US 2010/0264409 A1 Oct. 21, 2010

(30) Foreign Application Priority Data
Apr. 16, 2009 (JP) .................. P2009-099642

(51) Int. Cl.
*H01L 29/08* (2006.01)
*H01L 35/24* (2006.01)
*H01L 51/00* (2006.01)
(52) U.S. Cl. ............ 257/40; 257/69; 257/234; 257/274; 257/E51.045; 257/E51.001
(58) Field of Classification Search ............ 257/40, 257/69, 233, 234, 274, 351, 361, 423, 424, 257/E51.001, E39.007, E51.003, E51.045
See application file for complete search history.

(56) References Cited

U.S. PATENT DOCUMENTS

| 2003/0170913 A1* | 9/2003 | Fukushima et al. .......... 436/518 |
| 2008/0000525 A1 | 1/2008 | Shimura et al. |
| 2009/0090905 A1 | 4/2009 | Tokita et al. |
| 2009/0242879 A1* | 10/2009 | Carmeli et al. ................ 257/40 |
| 2010/0291655 A1* | 11/2010 | Sode ............................ 435/190 |

FOREIGN PATENT DOCUMENTS

| JP | 3-237769 | 10/1991 |
| JP | 3-252530 | 11/1991 |
| JP | 2007-220445 | 8/2007 |
| JP | 2009-21501 | 1/2009 |

OTHER PUBLICATIONS

Tokita, et al., J. Am. Chem. Soc., vol. 13, No. 15, pp. 5302-5310, 2008.
Fee, J.A., et al., Protein Sci., vol. 9, 2074, 2000.
Muresanu, L., et al., J. Biol. Chem, 281, 14503, 2006.
Bernad, S., et al., Eur. Biophys. J., 36, pp. 1039-1048, 2007.
Vanderkooi, J.M., et al., Eur. J. Biochem, 64, pp. 381-387, 1976.
Robert K., et al. "Isolation and modification of natural porphyrins", in The Porphyrins, vol. I., pp. 289-334, Academicpress, NY 1978.

(Continued)

*Primary Examiner* — Michelle Mandala
(74) *Attorney, Agent, or Firm* — K&L Gates LLP

(57) ABSTRACT

A molecular device includes a gold electrode, cytochrome c552 or a derivative or variant thereof immobilized on the gold electrode, and an electron transfer protein coupled to the cytochrome c552 or the derivative or variant thereof. Electrons or holes, or both, are transferred through the electron transfer protein by transition of electrons between molecular orbitals of the electron transfer protein.

15 Claims, 48 Drawing Sheets

OTHER PUBLICATIONS

Fuhrhop, et al., "Irreversible reactions on the porphyrin peripher" (excluding oxidation reductions, and photochemical reasons), in The Porphyrins, vol. 12, pp. 131-156, Academic Press, NY 1978.

McDonagh A.F., Bile pigments: "Bilatrienes and 5, 15-biladienes, in "The Porphyrins, vol. VI (Dolphin D. ed.) pp. 294-472, Academic Press, NY 1979.

Jackson AH., "Azaporphyrins", in The Porphyrins vol. 1 (Dolphin D ed.) pp. 366-379, Academic Press, New York, 1978.

Gouterman M., "Optical spectra and electronic structure of porphyrins and related rings", in The Porphyrinis, vol. 111 (Dolphin D. ed.), pp. 11-30, Academic Press, NY, 1978.

Sano S., Reconstitution of hemoproteins, in The Porphyrins, vol. VII (Dolphin D. ed.), pp. 391-396, Academic Press, NY, 1979.

* cited by examiner

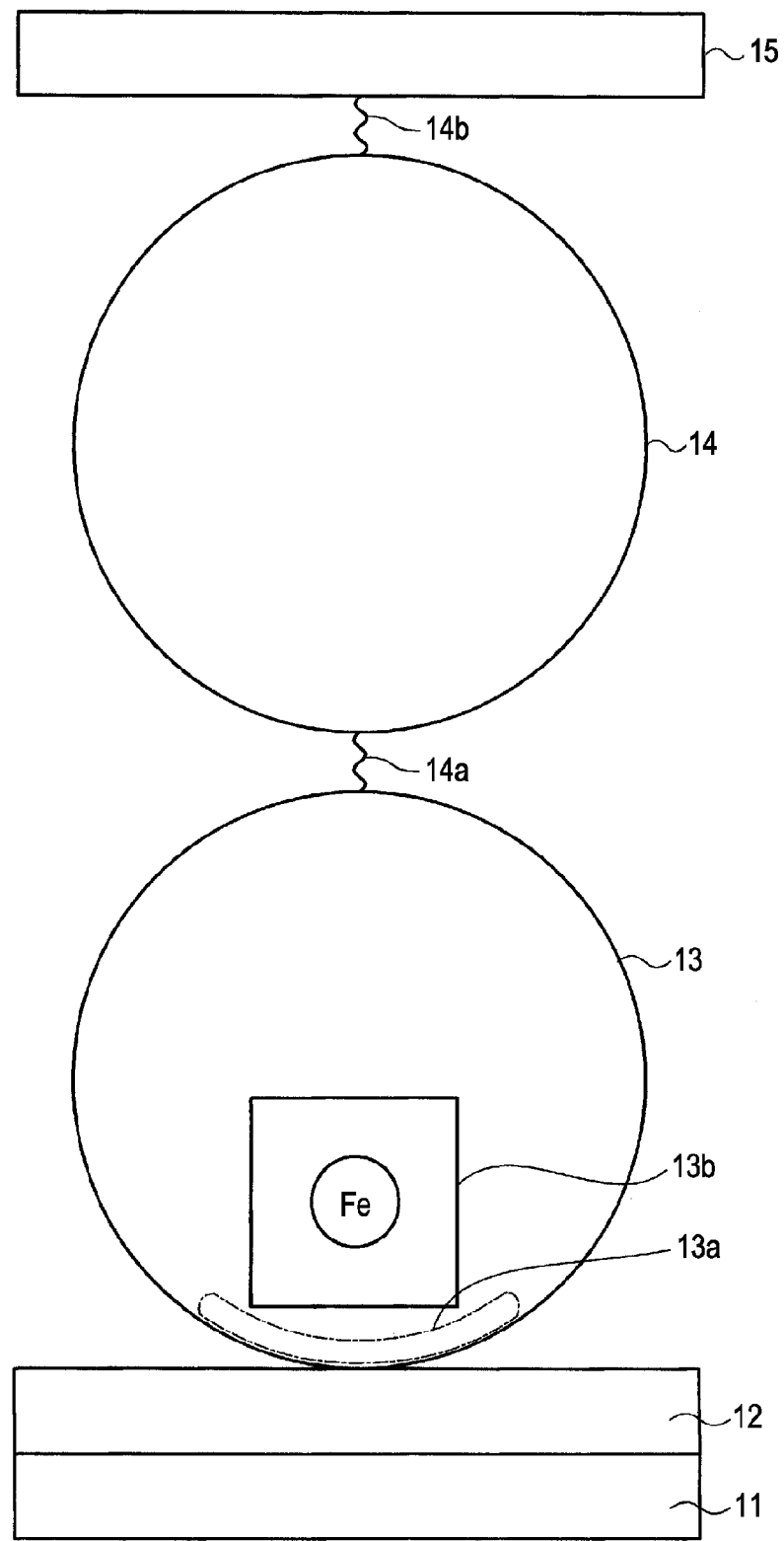

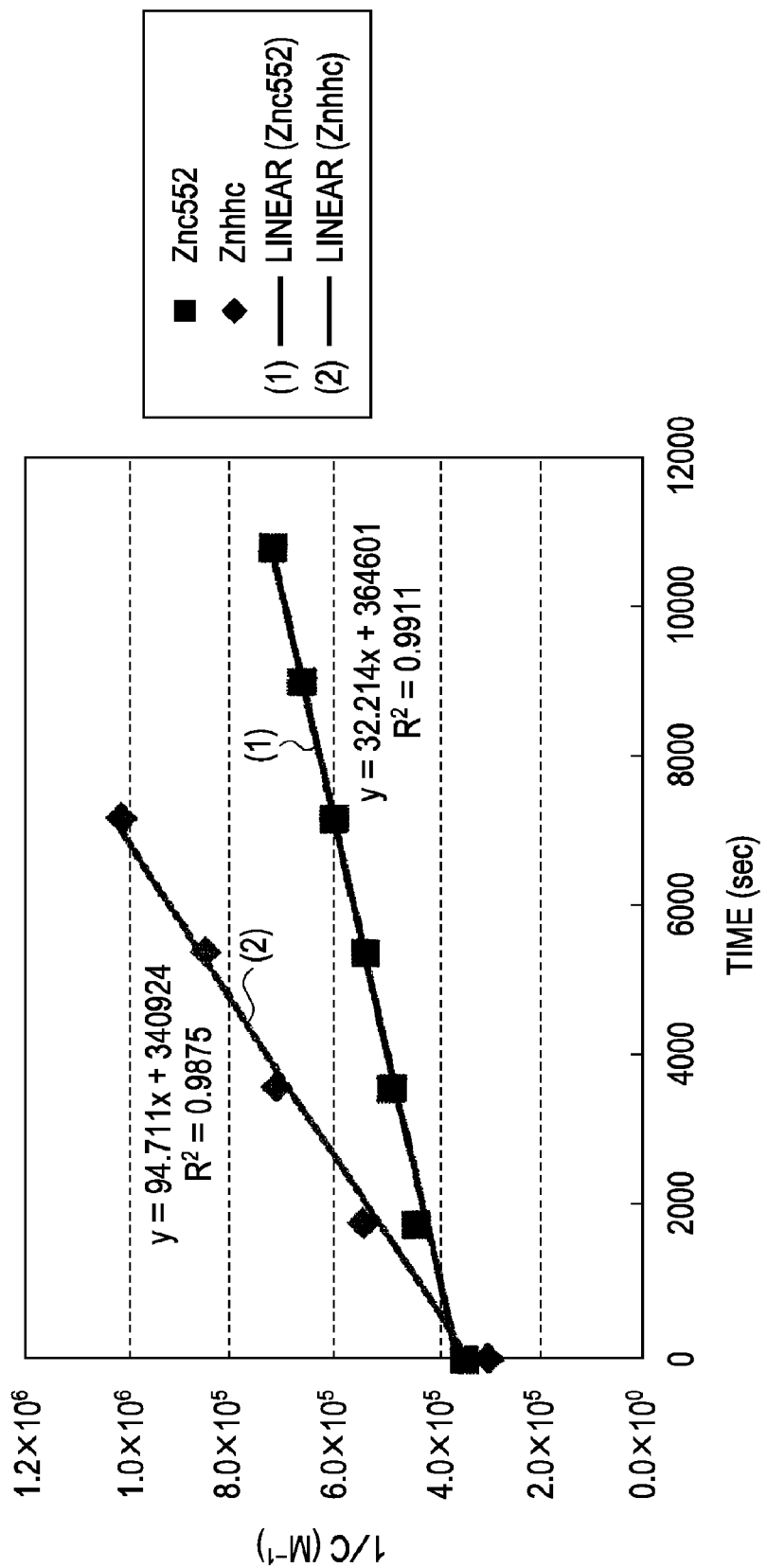

(1) —— TETRAAZAPORPHYRIN
(2) ----- COPPER TETRAAZAPORPHYRIN
(3) ········ TETRAHYDROTETRAAZAPORPHYRIN

MOLECULAR DEVICE, IMAGING DEVICE, PHOTOSENSOR, AND ELECTRONIC APPARATUS

CROSS REFERENCES TO RELATED APPLICATIONS

The present application claims priority to Japanese Priority Patent Application JP 2009-099642 filed in the Japan Patent Office on Apr. 16, 2009, the entire content of which is hereby incorporated by reference.

BACKGROUND

The present application relates to molecular devices, imaging devices, photosensors, and electronic apparatuses. More specifically, the present application relates to a molecular device using an electron transfer protein, such as zinc-substituted cytochrome c, and an imaging device, a photosensor, and an electronic apparatus using such a molecular device.

Imaging devices with higher definition and higher sensitivity have been developed, and the pixel size has been reduced to reproduce a high-definition image. For CCD and CMOS sensors in the related art, however, a reduction in pixel size decreases the amount of charge that can be accumulated in each pixel, thus decreasing sensitivity. There is therefore a trade-off between reducing the pixel size and maintaining the sensitivity. It is suggested that the extension of the CCD and CMOS sensor technology will reach a ceiling sooner or later. The major reasons include that the CCD and CMOS sensors generate only one electron (one charge) from one photon and that it is difficult to reduce the pixel size to the order of several square micrometers or less.

On the other hand, proteins are promising functional devices as an alternative to semiconductor devices. While the miniaturization of semiconductor devices is thought to be limited to a size of several tens of nanometers, proteins provide sophisticated functions with much smaller sizes, namely, 1 to 10 nm. As a photoelectric transducer using a protein, the inventors have proposed a photoelectric transducer including a protein-immobilized electrode having zinc-substituted cytochrome c (horse-heart cytochrome c having zinc substituted for the central metal of the heme, namely, iron) immobilized on a gold electrode and have reported that the protein-immobilized electrode provides a photocurrent (see Japanese Unexamined Patent Application Publication No. 2007-220445 (Patent Document 1)). Because zinc-substituted cytochrome c has a size of about 2 nm, it can be used in a photoelectric transducer to form an extremely small pixel.

Also proposed is a color-image light-sensitive device including light-sensitive units having a photoelectric conversion function and formed of oriented films of photosensitive dye proteins, such as bacteriorhodopsin, carried on electrodes (see Japanese Unexamined Patent Application Publication Nos. 3-237769 (Patent Document 2) and 3-252530 (Patent Document 3). This light-sensitive device includes sets of light-sensitive units having photosensitive dye proteins sensitive to different wavelengths.

Furthermore, recently, the inventors have theoretically and experimentally clarified the mechanism of intramolecular electron transfer in photoexcited zinc-substituted cytochrome c and have proposed a molecular device based on that mechanism (see Tokita, Y.; Shimura, J.; Nakajima, H.; Goto, Y.; Watanabe, Y., J. Am. Chem. Soc., 2008, 130, 5302-5310 (Non-Patent Document 1) and Japanese Unexamined Patent Application Publication No. 2009-21501 (Patent Document 4)).

SUMMARY

However, the photoelectric transducer, the color-image light-sensitive device, and the molecular device proposed in Patent Documents 1 to 4 have a problem in that they lack long-term stability because the proteins used in these devices, such as zinc-substituted cytochrome c and bacteriorhodopsin, are unstable ex vivo.

Accordingly, it is desirable to provide an imaging device and a photosensor, using a protein, that include extremely small pixels, that have high definition and high sensitivity because multiple electrons can be generated from one photon, and that can be stably used over an extended period of time.

It is also desirable to provide a molecular device, using a protein, that is suitable for use in an imaging device and a photosensor, that has a light amplification function, and that can be stably used over an extended period of time.

It is also desirable to provide an electronic apparatus including such a molecular device.

According to a study by the inventors, a molecular device using an electron transfer protein having a photoelectric conversion function, such as zinc-substituted cytochrome c, as proposed in Non-Patent Document 1 and Patent Document 4, can generate multiple electrons from one photon; in other words, it has a quantum yield of more than 100%. This means that the molecular device has a light amplification function. That is, as disclosed in Non-Patent Document 1 and Patent Document 4, electron transfer occurs in zinc-substituted cytochrome c as a result of transition from one molecular orbit to another molecular orbital at which the electron transfer rate $k_{ET}$ is maximized for that molecular orbital. In this case, $k_{ET}$ is about $10^{10}$ to $10^{11}$ sec$^{-1}$, depending on the combination of the molecular orbitals. On the other hand, the rate at which an electron photoexcited from a lower-energy molecular orbital to a higher-energy molecular orbital shifts to the lower-energy molecular orbital is about $10^8$ sec$^{-1}$. This shows that the incidence of one photon allows $10^2$ to $10^3$ ($10^{10}$ to $10^{11}/10^8$) electrons to be transferred. In other words, this molecular device provides an optical gain of $10^2$ to $10^3$.

In addition, the molecular device can be made extremely small, namely, to a size of 1 to 10 nm, because it uses an electron transfer protein. The molecular device having the light amplification function can thus be used as a photoelectric transducer serving as a pixel of an imaging device to realize an imaging device with high definition and high sensitivity. The same applies to photosensors.

On the other hand, cytochrome c552 derived from the thermophile Thermus thermophilus serves as an electron carrier in vivo, as does horse-heart cytochrome c. Cytochrome c552 has a much higher thermal stability than horse-heart cytochrome c (see Fee, J. A. and 13 others, Protein Sci. 9, 2074 (2000)). For example, whereas a typical protein has a denaturation point of 50° C. to 60° C. and horse-heart cytochrome c has a denaturation point of 85° C., cytochrome c552 has a higher denaturation temperature, namely, at least 100° C., because the temperature is not measurable in a typical aqueous solution (the upper temperature limit is 100° C.). In addition, it is reported that cytochrome c552 has a denaturation temperature of 60° C. to 70° C. in the presence of 4.2 M of guanidine hydrochloride (denaturant).

Cytochrome c552 is suitable as a device material because of its high thermal stability, as described above. Cytochrome c552 and horse-heart cytochrome c are similar in constituent amino acids and tertiary structure, but are different in the environment of the active-center heme pocket responsible for electron transfer. Specifically, whereas horse-heart cytochrome c has positively charged lysine residues dispersed over the entire molecule, cytochrome c552, being similar to horse-heart cytochrome c in the number of lysine residues, does not have its lysine residues around the heme pocket. It is reported that a complex of cytochrome c552 and its in-vivo redox partner is formed mainly by hydrophobic interaction, according to its complex structure (see Muresanu, L. and 13 others, J. Biol. Chem. 281, 14503 (2006)). To immobilize cytochrome c552 on an electrode while maintaining its electron transfer properties, therefore, its specific conditions may be identified.

One method for immobilizing horse-heart cytochrome c on an electrode uses a molecular monolayer ($HS(CH_2)_{10}COO^-$, 1-carboxy-10-decanethiol). Thus, one possible approach is to apply this immobilization method to the immobilization of cytochrome c552. However, the immobilization of cytochrome c552 on an electrode using a molecular monolayer used in the method for immobilizing horse-heart cytochrome c has so far been unsuccessful in providing an oxidation-reduction current from cytochrome c552.

Another report says that a protein-derived oxidation-reduction current has been provided using a protein-immobilized electrode having cytochrome c552 immobilized on a silver electrode (see Bernad, S. and 3 others, Eur. Biophys. J. 36, 1039 (2007)). This protein-immobilized electrode, however, has a problem in protein orientation control because a cyclic voltammogram obtained using the protein-immobilized electrode shows considerable peak separation between oxidation and reduction waves. In addition, silver is susceptible to corrosion and oxidation when used as an electrode material even in a normal environment. That is, a silver electrode is unsuitable for stable long-term use, and a chemically stable electrode is desirable instead of a silver electrode.

Through an intensive study to solve the above problem, the inventors have found by accident that cytochrome c552 can be immobilized on a gold electrode, which is chemically stable, without impairing its electron transfer properties. The inventors have also found that a metal-substituted cytochrome c552 having another metal, such as zinc, substituted for the central metal of the heme of cytochrome c552, namely, iron, can be similarly immobilized on a gold electrode without impairing its electron transfer properties. Thus, this immobilization method can therefore be applied to a molecular device as described above to improve its thermal stability.

The present application has been made as a result of an intensive study based on the above findings.

That is, a molecular device according to an embodiment includes a gold electrode, cytochrome c552 or a derivative or variant thereof immobilized on the gold electrode, and an electron transfer protein coupled to the cytochrome c552 or the derivative or variant thereof. Electrons or holes, or both, are transferred through the electron transfer protein by transition of electrons between molecular orbitals of the electron transfer protein.

If an electron transfer protein having a photoelectric conversion function, namely, a fluorescent protein, is used, the molecular device can be used as a photoelectric transducer.

An imaging device according to an embodiment includes molecular devices, each including a gold electrode, cytochrome c552 or a derivative or variant thereof immobilized on the gold electrode, and an electron transfer protein coupled to the cytochrome c552 or the derivative or variant thereof. Electrons or holes, or both, are transferred through the electron transfer protein by transition of electrons between molecular orbitals of the electron transfer protein.

The molecular devices constitute pixels of the imaging device.

A photosensor according to an embodiment includes a molecular device including a gold electrode, cytochrome c552 or a derivative or variant thereof immobilized on the gold electrode, and an electron transfer protein coupled to the cytochrome c552 or the derivative or variant thereof. Electrons or holes, or both, are transferred through the electron transfer protein by transition of electrons between molecular orbitals of the electron transfer protein.

The molecular device constitutes a sensor element of the photosensor.

An electronic apparatus according to an embodiment includes a molecular device including a gold electrode, cytochrome c552 or a derivative or variant thereof immobilized on the gold electrode, and an electron transfer protein coupled to the cytochrome c552 or the derivative or variant thereof. Electrons or holes, or both, are transferred through the electron transfer protein by transition of electrons between molecular orbitals of the electron transfer protein.

In the above embodiments, the molecular orbitals responsible for transition of electrons may be basically any molecular orbitals that allow electrons or holes, or both, to be transferred from one site to another site remote from that site in the electron transfer protein as a result of transition. Specifically, for example, the molecular orbitals may be a first molecular orbital localized in a first amino acid residue of the electron transfer protein and a second molecular orbital localized in a second amino acid residue of the electron transfer protein and having the maximum transition probability per unit time for the first molecular orbital. In this case, electrons or holes, or both, are transferred between the first and second amino acid residues. The first and second amino acid residues may constitute start and end points of the transfer of electrons or holes. Typically, electrons or holes are generated from one of the first and second molecular orbitals by photoexcitation, although they may be generated by another technique such as application of an electric field. In addition, for example, the molecular orbitals may be a molecular orbital localized in an amino acid residue of the electron transfer protein and a molecular orbital localized in another amino acid residue and having the maximum transition probability per unit time for the above molecular orbital. In this case, electrons or holes, or both, are transferred between the two amino acid residues.

In the above embodiments, preferably, the cytochrome c552 or the derivative or variant thereof is immobilized with a hydrophobic portion thereof facing the gold electrode. Typically, the cytochrome c552 or the derivative or variant thereof is coupled to the gold electrode with a self-assembled molecular monolayer therebetween. A derivative of cytochrome c552 refers to cytochrome c552 having a chemically modified amino acid residue or heme in the backbone thereof, whereas a variant of cytochrome c552 refers to cytochrome c552 having an amino acid residue substituted by another amino acid residue in the backbone thereof.

In the above embodiments, the electron transfer protein is typically an electron transfer protein containing a metal. This metal is preferably a transition metal (for example, zinc or iron), which has electrons in high-energy orbitals, namely, d-orbitals or higher. Examples of the electron transfer protein include, but not limited to, iron-sulfur proteins (such as rubredoxin, diiron ferredoxins, triiron ferredoxins, and tetrairon ferredoxins), blue-copper proteins (such as plastocyanin, azurin, pseudoazurin, plantacyanin, stellacyanin, and amicyanin), cytochromes (such as cytochrome c, zinc-substituted cytochrome c, a metal-substituted cytochrome c552 (cytochrome c552 having another metal, such as zinc, substituted for the central metal of the heme, namely, iron), cytochrome c552 modified zinc-porphyrin, cytochrome b, cytochrome b5, cytochrome c1, cytochrome a, cytochrome a3, cytochrome f, and cytochrome b6), and derivatives (those having a chemically modified amino acid residue in the backbone thereof) and variants (those having an amino acid residue substituted by another amino acid residue in the backbone thereof) of the above electron transfer proteins.

A molecular device according to an embodiment includes a metal-substituted cytochrome c552 or a derivative or variant thereof or a cytochrome c552 modified zinc-porphyrin. Electrons or holes, or both, are transferred through the metal-substituted cytochrome c552 or the derivative or variant thereof or the cytochrome c552 modified zinc-porphyrin by transition of electrons between molecular orbitals of the metal-substituted cytochrome c552 or the derivative or variant thereof or the cytochrome c552 modified zinc-porphyrin.

An imaging device according to an embodiment includes molecular devices, each including a metal-substituted cytochrome c552 or a derivative or variant thereof or a cytochrome c552 modified zinc-porphyrin. Electrons or holes, or both, are transferred through the metal-substituted cytochrome c552 or the derivative or variant thereof or the cytochrome c552 modified zinc-porphyrin by transition of electrons between molecular orbitals of the metal-substituted cytochrome c552 or the derivative or variant thereof or the cytochrome c552 modified zinc-porphyrin.

A photosensor according to an embodiment includes a molecular device including a metal-substituted cytochrome c552 or a derivative or variant thereof or a cytochrome c552 modified zinc-porphyrin. Electrons or holes, or both, are transferred through the metal-substituted cytochrome c552 or the derivative or variant thereof or the cytochrome c552 modified zinc-porphyrin by transition of electrons between molecular orbitals of the metal-substituted cytochrome c552 or the derivative or variant thereof or the cytochrome c552 modified zinc-porphyrin.

An electronic apparatus according to an embodiment includes a molecular device including a metal-substituted cytochrome c552 or a derivative or variant thereof or a cytochrome c552 modified zinc-porphyrin. Electrons or holes, or both, are transferred through the metal-substituted cytochrome c552 or the derivative or variant thereof or the cytochrome c552 modified zinc-porphyrin by transition of electrons between molecular orbitals of the metal-substituted cytochrome c552 or the derivative or variant thereof or the cytochrome c552 modified zinc-porphyrin.

In the above embodiments using a metal-substituted cytochrome c552 or a derivative or variant thereof or a cytochrome c552 modified zinc-porphyrin, the metal-substituted cytochrome c552 or the derivative or variant thereof or the cytochrome c552 modified zinc-porphyrin is most preferably immobilized on a gold electrode, although the electrode used may be formed of another material. Specifically, the material used for the electrode may be, for example, an inorganic material typified by metals such as platinum and silver and metal oxides such as indium tin oxide (ITO), fluorine-doped tin oxide (FTO), and Nesa glass (SnO2) or an organic material typified by various conductive polymers and charge transfer complexes (such as TTF-TCNQ) containing a tetrathiafulvalene derivative (such as TTF, TMTSF, or BEDT-TTF). The conductive polymer used may be, for example, polythiophene, polypyrrole, polyacetylene, polydiacetylene, poly(p-phenylene), or poly(p-phenylene sulfide).

When the devices according to the above embodiments, including the molecular devices, the imaging devices, and the photosensors, are used, a counter electrode may be provided in addition to the electrode on which a protein such as cytochrome c552, an electron transfer protein, a metal-substituted cytochrome c552, or a cytochrome c552 modified zinc-porphyrin is immobilized. This counter electrode is disposed opposite the electrode.

In the above embodiments, a protein such as cytochrome c552, a metal-substituted cytochrome c552, or a cytochrome c552 modified zinc-porphyrin has a higher thermal stability than a protein such as zinc-substituted cytochrome c or bacteriorhodopsin. In addition, the size of a protein such as cytochrome c552, a metal-substituted cytochrome c552, or a cytochrome c552 modified zinc-porphyrin is extremely small, namely, about 1 to 10 nm. In addition, a molecular device including a protein such as a metal-substituted cytochrome c552 or a cytochrome c552 modified zinc-porphyrin has a light amplification function. In addition, a protein such as zinc-substituted cytochrome c552 or a cytochrome c552 modified zinc-porphyrin can be used to form a photoelectric transducer that absorbs red, green, or blue light. In addition, a protein such as a metal-substituted cytochrome c552 or a cytochrome c552 modified zinc-porphyrin can be used to form a photoelectric transducer that absorbs light with a desired wavelength.

According to the above embodiments, a molecular device, using a protein, that is extremely small, that has a light amplification function, and that can be stably used over an extended period of time can be provided. In addition, an imaging device and a photosensor, using a protein, that have high definition and high sensitivity and that can be stably used over an extended period of time can be provided. In addition, such a superior molecular device, imaging device, or photosensor can be used to provide a high-performance electronic apparatus.

Additional features and advantages are described herein, and will be apparent from the following Detailed Description and the figures.

BRIEF DESCRIPTION OF THE FIGURES

FIG. 1 is a schematic diagram showing a photoelectric transducer according to a first embodiment;

FIG. 29 is a graph showing an example of the fitting of secondary reaction equations to the photodecomposition reaction of zinc-substituted cytochrome c552 and zinc-substituted cytochrome c;

DETAILED DESCRIPTION

Figure 2A:
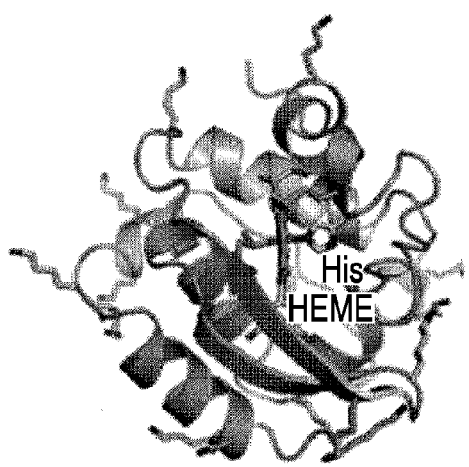
FIGS. 2A and 2B are schematic diagrams showing the structure of cytochrome c552 used in the photoelectric transducer according to the first embodiment.

The present application will now be described, according to an embodiment. The description will be given in the following order:

1. First embodiment (photoelectric transducer)
2. Second embodiment (blue-light photoelectric transducer)
3. Third embodiment (green-light or red-light photoelectric transducer)
4. Fourth embodiment (color imaging device)
5. Fifth embodiment (color imaging device)
6. Sixth embodiment (photosensor)
7. Seventh embodiment (photosensor)
8. Eighth embodiment (color CCD imaging device)
9. Ninth embodiment (inverter circuit)
10. Tenth embodiment (photosensor)

Photoelectric Transducer

FIG. 1 shows a photoelectric transducer according to a first embodiment.

As shown in FIG. 1, this photoelectric transducer has cytochrome c552 13 immobilized on a gold electrode 11 with a self-assembled molecular monolayer 12 therebetween. The cytochrome c552 13 is immobilized with a hydrophobic portion 13a thereof facing the gold electrode 11. Iron (Fe) is coordinated to a heme 13b inside the cytochrome c552 13 as its central metal. An electron transfer protein 14 having a photoelectric conversion function is immobilized on the cytochrome c552 13. The electron transfer protein 14 used may be, for example, one of those mentioned above. A first amino acid residue 14a of the electron transfer protein 14 is coupled to an amino acid residue of the cytochrome c552 13. In addition, a second amino acid residue 14b of the electron transfer protein 14 is coupled to a counter electrode 15, optionally with a linker, for example, therebetween. A first molecular orbital is localized in the first amino acid residue 14a of the electron transfer protein 14, whereas a second molecular orbital is localized in the second amino acid residue 14b of the electron transfer protein 14. The second molecular orbital has the maximum transition probability per unit time for the first molecular orbital. In this case, photoexcitation induces transition of electrons between the first and second molecular orbitals, thus transferring electrons or holes between the first amino acid residue 14a and the second amino acid residue 14b. The details are disclosed in Patent Document 4.

Figure 2B:
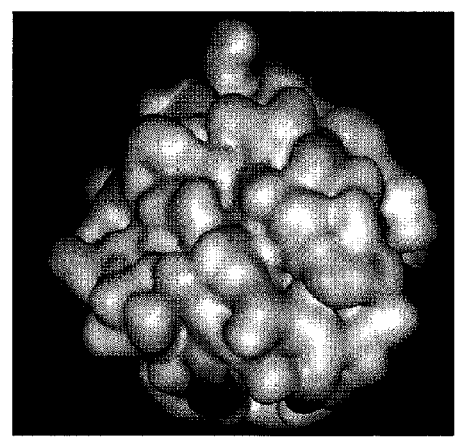
Figure 3A:
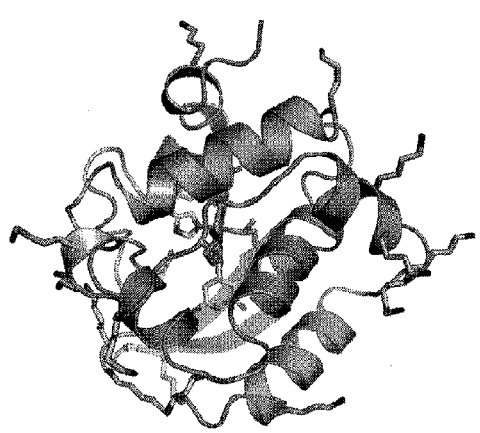
FIGS. 3A and 3B are schematic diagrams showing the structure of cytochrome c552 used in the photoelectric transducer according to the first embodiment.
Figure 3B:
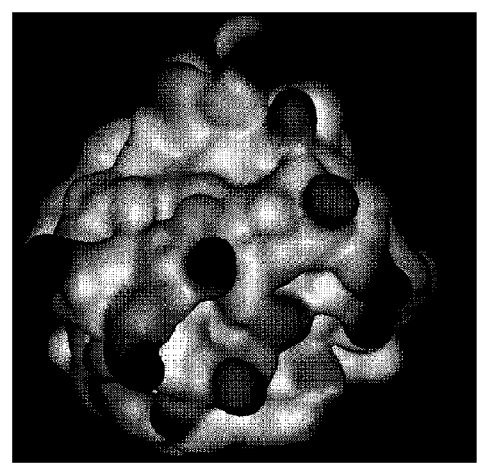

FIG. 2A schematically shows the structure of cytochrome c552. FIG. 2A shows a stick model of a heme of cytochrome c552, its axial ligands, namely, histidine (His) and methionine (Met), and lysine residues (positively charged amino acid). FIG. 2A is a front view of the heme of cytochrome c552, which is oriented such that the axial ligand histidine (His) is to the right. FIG. 2B shows a surface charge distribution diagram of cytochrome c552 in FIG. 2A. FIG. 3A shows a diagram of cytochrome c552 13 as viewed from the back of the heme. FIG. 3B shows a surface charge distribution diagram of cytochrome c552 in FIG. 3A.

Figure 4A:
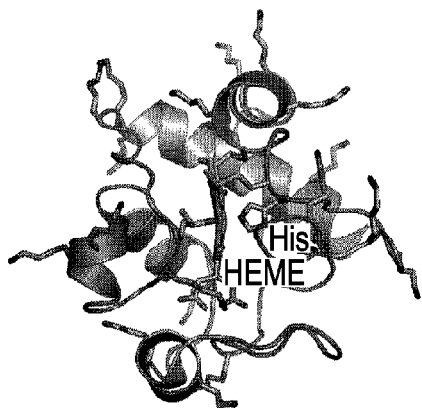
FIGS. 4A and 4B are schematic diagrams showing the structure of horse-heart cytochrome c.
Figure 4B:
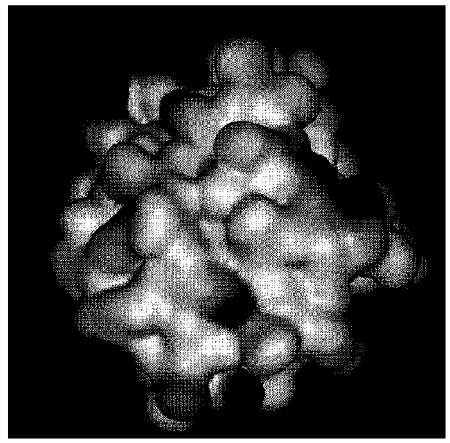
Figure 5A:
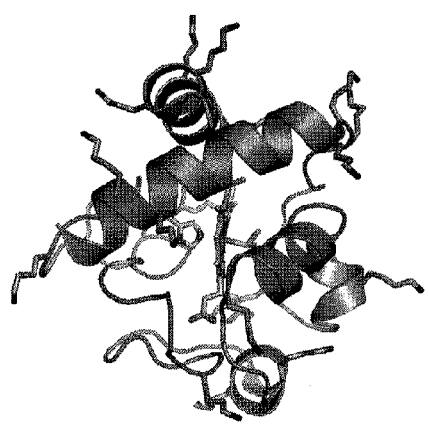
FIGS. 5A and 5B are schematic diagrams showing the structure of horse-heart cytochrome c.

For comparison, FIG. 4A shows a diagram of horse-heart cytochrome c as viewed from the front of the heme, and FIG. 4B shows a surface charge distribution diagram of horse-heart cytochrome c in FIG. 4A. FIG. 5A shows a diagram of horse-heart cytochrome c as viewed from the back of the heme, and FIG. 5B shows a surface charge distribution diagram of horse-heart cytochrome c in FIG. 5A.

Figure 5B:
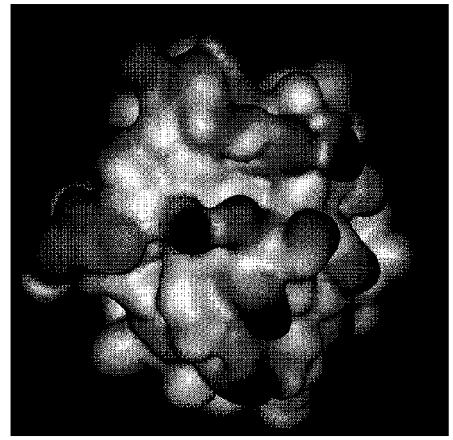

As shown in FIGS. 4B and 5B, horse-heart cytochrome c has positive charges dispersed over the entire molecule. As shown in FIGS. 2B and 3B, on the other hand, cytochrome c552 has positive charges concentrated in the back of the heme. In addition, the front of the heme of cytochrome c552 13 is occupied by hydrophobic residues and neutral polar residues. The hydrophobic portion 13a of the cytochrome c552 13 refers to that front portion of the heme.

Figure 6:
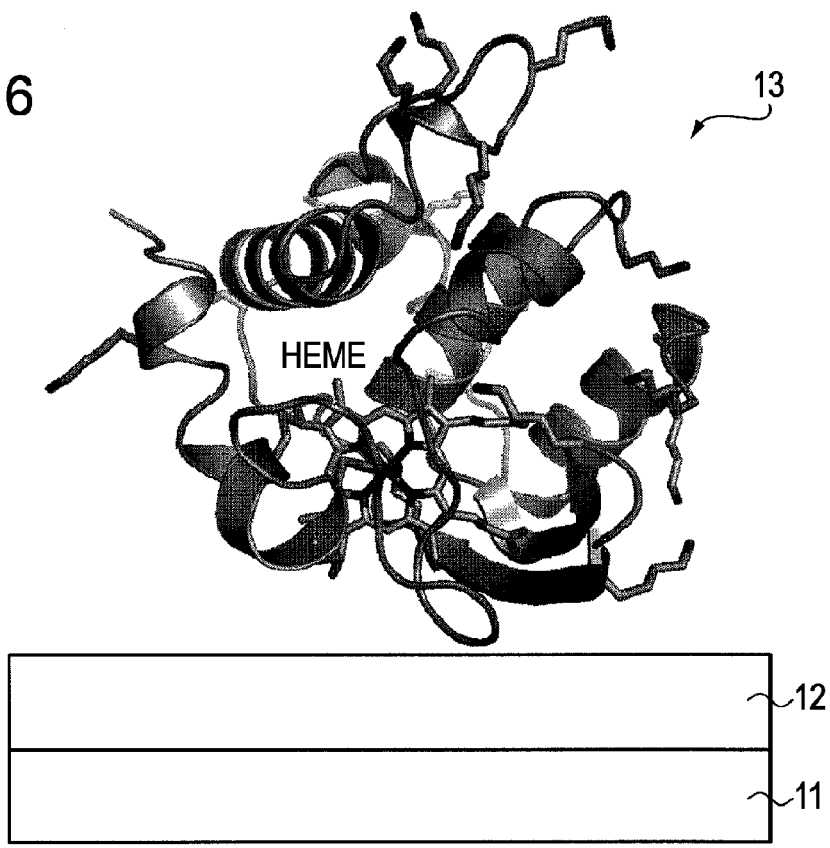
FIG. 6 is a schematic diagram showing the details of the structure of cytochrome c552 used in the photoelectric transducer according to the first embodiment.

FIG. 6 schematically shows the cytochrome c552 13 immobilized on the gold electrode 11 with the self-assembled molecular monolayer 12 therebetween. In FIG. 6, the axial ligand histidine is to the front of the cytochrome c552 13, and the sticks indicate lysine residues.

Figure 7:
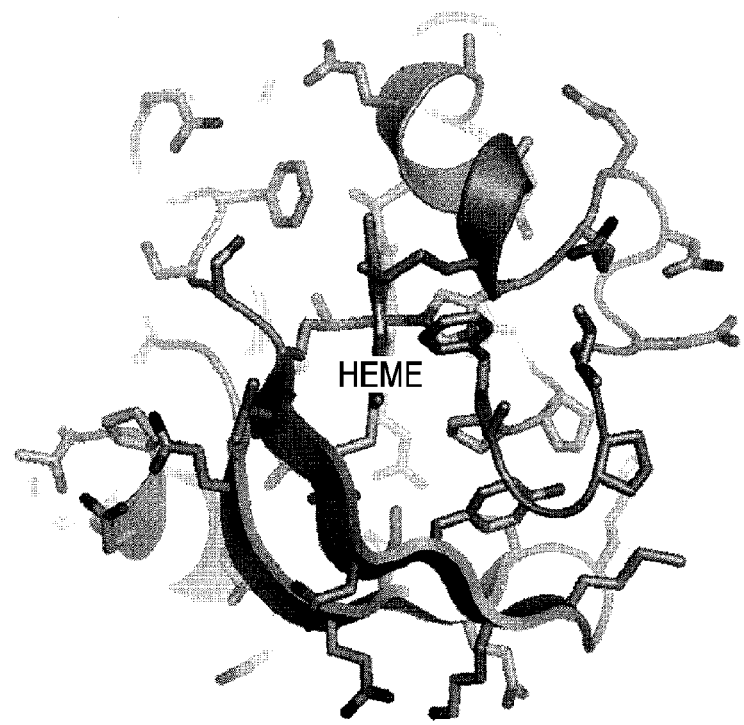
FIG. 7 is a schematic diagram showing the details of the structure of cytochrome c552 used in the photoelectric transducer according to the first embodiment.

FIG. 7 shows a diagram of the cytochrome c552 13 immobilized on the gold electrode 11 with the self-assembled molecular monolayer 12 therebetween as viewed from the gold electrode 11 side, where the axial ligand histidine is to the right (the front of the heme). In FIG. 7, the sticks indicate amino acid side chains.

Figure 8A:
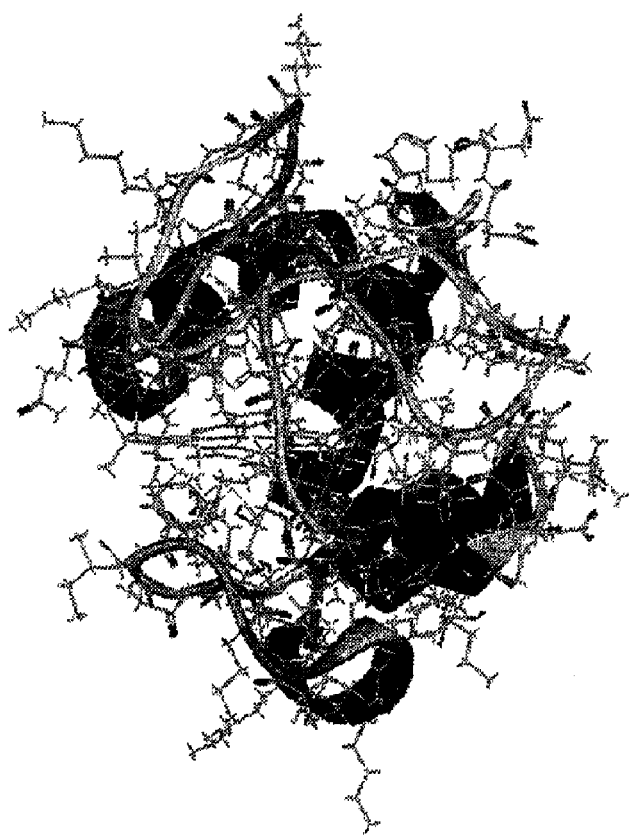
FIGS. 8A and 8B are schematic diagrams showing the structure of zinc-substituted cytochrome c as an example of an electron transfer protein used in the photoelectric transducer according to the first embodiment.
Figure 8B:
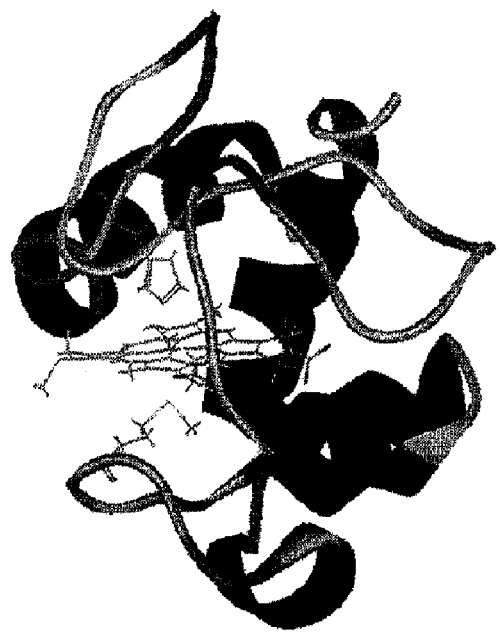

FIGS. 8A and 8B show ribbon models of zinc-substituted cytochrome c as an example of the electron transfer protein 14, where amino acid side chains are shown in FIG. 8A and are not shown in FIG. 8B. Zinc-substituted cytochrome c has 104 amino acid residues. Zinc is coordinated to porphyrin in the center of zinc-substituted cytochrome c as the central metal, thereby serving as the center of light absorption and photoinduced electron transfer reaction. The protein moiety surrounding the porphyrin of zinc-substituted cytochrome c is an insulator. Zinc-substituted cytochrome c can be photoexcited by visible light because it has characteristic absorption peaks called the Soret band and the Q band in the visible region.

The self-assembled molecular monolayer 12 is composed of three portions. A first portion is a bonding functional group (such as a thiol group (—SH)) that reacts with an atom in the surface of the gold electrode 11 on which the self-assembled molecular monolayer 12 is to be immobilized. A second portion is typically an alkyl chain. The Van der Waals force between the alkyl chains primarily determines the two-dimensional regular structure of the self-assembled molecular monolayer 12. Accordingly, in general, a stable, highly dense, highly oriented film is formed if the alkyl chains have a reasonable number of carbon atoms. A third portion is a terminal group. If the terminal group is a functional group with some functionality, it provides that functionality for the solid surface.

The self-assembled molecular monolayer 12 is formed using, for example, a hydrophobic thiol and a hydrophilic thiol. The proportions of the hydrophobic thiol and the hydrophilic thiol determine the ease of bonding between the cytochrome c552 13 and the gold electrode 11. The hydrophilic thiol has a hydrophilic group such as —OH, —NH$_2$, SO$_3^-$, OSO$_3^-$, COO$^-$, or NH$_4^+$. The hydrophobic thiol and the hydrophilic thiol may be selected as appropriate.

As a preferred example of the combination of the hydrophobic thiol and the hydrophilic thiol, the hydrophobic thiol is HS(CH$_2$)$_n$CH$_3$ (n=5, 8, or 10), and the hydrophilic thiol is HS(CH$_2$)$_n$CH$_2$OH (n=5, 8, or 10). Specifically, for example, the hydrophobic thiol is 1-undecanethiol ($HS(CH_2)_{10}CH_3$), and the hydrophilic thiol is 1-hydroxy-11-undecanethiol ($HS(CH_2)_{10}CH_2OH$). As another example of the combination of the hydrophobic thiol and the hydrophilic thiol, the hydrophobic thiol is $HS(CH_2)_mCH_3$, and the hydrophilic thiol is $HS(CH_2)_nCH_2OH$ (where m<n; m is, for example, 5 or more; and n is, for example, 10 or less). Specifically, for example, the hydrophobic thiol is $HS(CH_2)_9CH_3$, and the hydrophilic thiol is $HS(CH_2)_{10}CH_2OH$.

Figure 9:
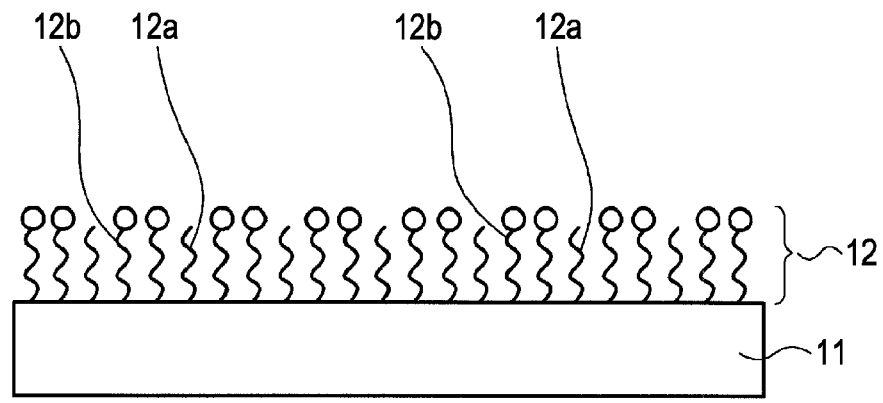
FIG. 9 is a schematic diagram showing the structure of a self-assembled molecular monolayer used in the photoelectric transducer according to the first embodiment.

FIG. 9 schematically shows the structure of the self-assembled molecular monolayer 12 formed using the hydrophobic thiol and the hydrophilic thiol. As shown in FIG. 9, the self-assembled molecular monolayer 12 is bonded to the surface of the gold electrode 11 on the side to which thiol groups (—SH) of a hydrophobic thiol 12a and a hydrophilic thiol 12b face. In addition, the self-assembled molecular monolayer 12 is bonded to the hydrophobic portion 13a (see FIG. 1) of the cytochrome c552 13 on the side to which hydrophobic groups of the hydrophobic thiol 12a and hydrophilic groups (indicated by the circles in FIG. 9) of the hydrophilic thiol 12b face.

Although one molecule of cytochrome c552 13 is shown in FIG. 1, the number of molecules immobilized on the gold electrode 11 may be determined as appropriate. Typically, a plurality of molecules are immobilized as a molecular monolayer, each coupled to the electron transfer protein 14. In addition, although the gold electrode 11 shown in FIG. 1 has a flat surface shape, it may have any surface shape, for example, a surface shape having recesses, a surface shape having protrusions, or a surface shape having recesses and protrusions, and the cytochrome c552 13 can be easily immobilized on any surface shape.

The material used for the counter electrode 15 may be, for example, an inorganic material typified by metals such as gold, platinum, and silver and metal oxides and glass such as indium tin oxide (ITO), fluorine-doped tin oxide (FTO), and Nesa glass (SnO2 glass). The material of the counter electrode 15 may also be, for example, a conductive polymer (such as polythiophene, polypyrrole, polyacetylene, polydiacetylene, poly(p-phenylene), or poly(p-phenylene sulfide)) or a charge transfer complex (such as TTF-TCNQ) containing a tetrathiafulvalene derivative (such as TTF, TMTSF, or BEDT-TTF). Preferably, the counter electrode 15 is transparent to visible light so that the entire, or almost entire, electron transfer protein 14 immobilized on the gold electrode 11 with the cytochrome c552 13 therebetween can be irradiated with light.

This photoelectric transducer can operate either in a solution (buffer) or in a dry environment unless it impairs the photoelectric conversion function and the electron transfer function of the electron transfer protein 14. For the photoelectric transducer to operate in a dry environment, typically, a solid electrolyte that does not adsorb the electron transfer protein 14, for example, a wet solid electrolyte such as agar or polyacrylamide gel, is held between the protein-immobilized electrode and the counter electrode 15, preferably with sealing walls provided around the solid electrolyte to prevent it from drying. In this case, the photoelectric transducer provides a photocurrent whose polarity is based on the difference between the natural electrode potentials of the protein-immobilized electrode and the counter electrode 15 when light is received by the light-sensitive element, namely, the electron transfer protein 14.

Use Form of Photoelectric Transducer

Figure 10:
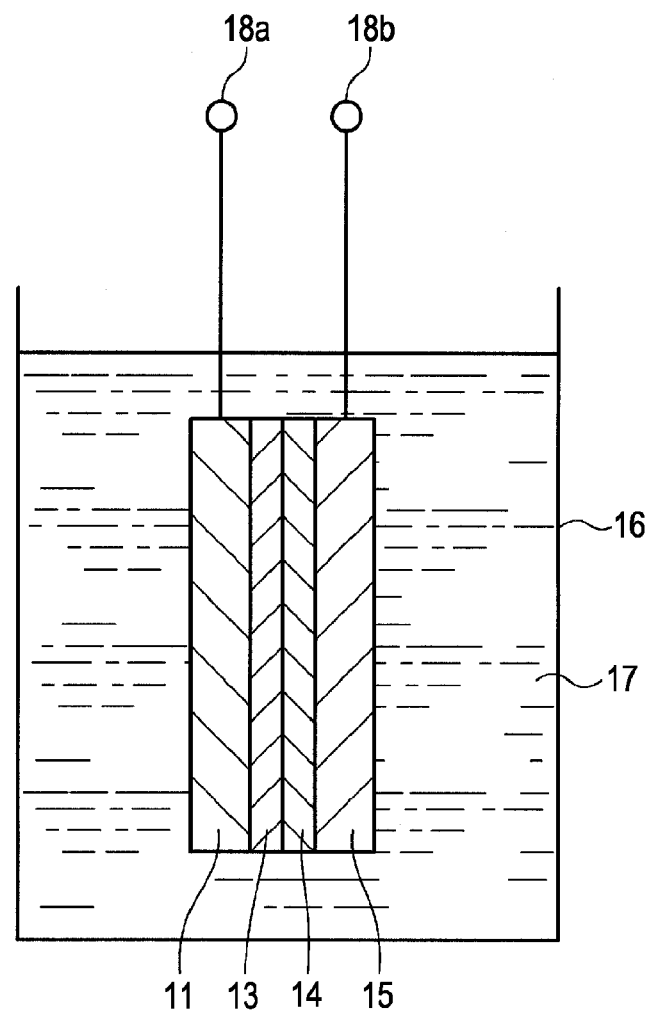
FIG. 10 is a schematic diagram showing a first or second example of the use form of the photoelectric transducer according to the first embodiment.

FIG. 10 shows a first example of the use form of the photoelectric transducer.

In the first example, as shown in FIG. 10, the protein-immobilized electrode and the counter electrode 15 are disposed opposite each other. The protein-immobilized electrode and the counter electrode 15 are dipped in a buffer 17 in a container 16. The buffer 17 used is one that does not impair the function of the electron transfer protein 14.

To cause photoelectric conversion in the photoelectric transducer, the electron transfer protein 14 of the protein-immobilized electrode is irradiated with light with a bias voltage being applied between the protein-immobilized electrode and the counter electrode 15 by a bias supply such that the protein-immobilized electrode side is at a higher potential. The light contains a wavelength component capable of photoexcitation of the electron transfer protein 14. In this case, at least one of the bias voltage, the intensity of the light used for irradiation, and the wavelength of the light used for irradiation can be controlled to change the magnitude and/or polarity of a photocurrent flowing through the transducer. The photocurrent is externally output from terminals 18a and 18b.

Next, a second example of the use form of the photoelectric transducer will be described.

In the second example, unlike the first example, the bias voltage is not applied using a bias supply; instead, the difference between the natural electrode potentials of the protein-immobilized electrode and the counter electrode 15 is used as a bias voltage. In other points, the second example is similar to the first example.

Figure 11:
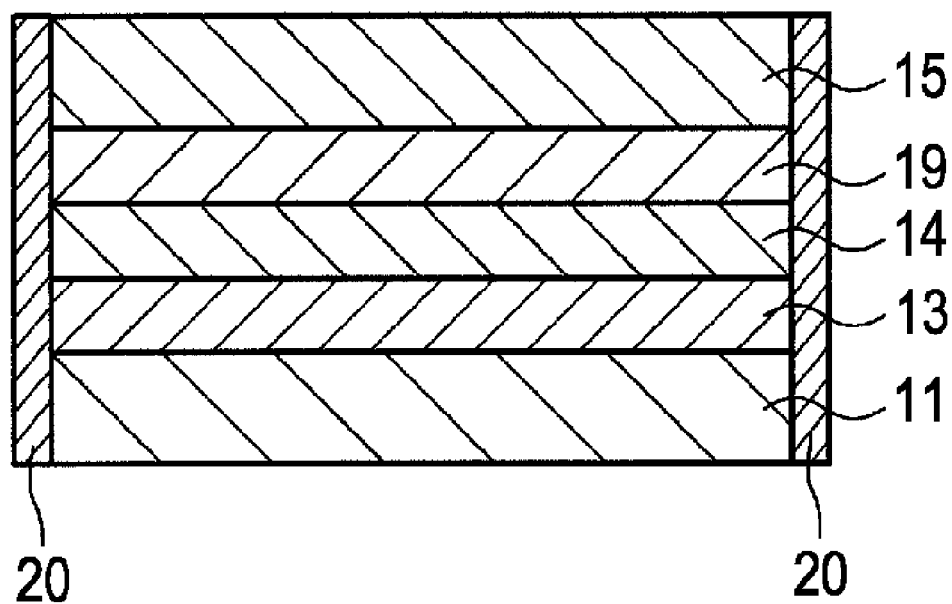
FIG. 11 is a schematic diagram showing a third example of the use form of the photoelectric transducer according to the first embodiment.

FIG. 11 shows a third example of the use form of the photoelectric transducer. Whereas the photoelectric transducers of the first and second examples operate in a solution, the photoelectric transducer of this example can operate in a dry environment.

As shown in FIG. 11, this photoelectric transducer has a solid electrolyte 19 held between the protein-immobilized electrode and the counter electrode 15. In addition, sealing walls 20 are provided around the solid electrolyte 19 to prevent it from drying. The solid electrolyte 19 used is one that does not impair the function of the electron transfer protein 14, such as agar or polyacrylamide gel, which does not adsorb protein. To cause photoelectric conversion in the photoelectric transducer, the electron transfer protein 14 of the protein-immobilized electrode is irradiated with light, where the bias voltage used is the difference between the natural electrode potentials of the protein-immobilized electrode and the counter electrode 15. The light contains a wavelength component capable of photoexcitation of the electron transfer protein 14. In this case, at least one of the difference between the natural electrode potentials of the protein-immobilized electrode and the counter electrode 15, the intensity of the light used for irradiation, and the wavelength of the light used for irradiation can be controlled to change the magnitude and/or polarity of a photocurrent flowing through the transducer. In other points, the third example is similar to the first example.

Method for Producing Photoelectric Transducer

An example of a method for producing the photoelectric transducer will be described.

First, the gold electrode 11 is dipped in a solution containing the hydrophobic thiol and the hydrophilic thiol in predetermined proportions (the solvent is, for example, ethanol) to form the self-assembled molecular monolayer 12 on the surface of the gold electrode 11, as shown in FIG. 1.

Next, the gold electrode 11 having the self-assembled molecular monolayer 12 is dipped in a solution containing the cytochrome c552 13, a buffer, and optionally a salt such as potassium chloride (KCl). As a result, the cytochrome c552 13 is adsorbed and immobilized on the self-assembled molecular monolayer 12 with the hydrophobic portion 13a thereof facing the gold electrode 11. Thus, a cytochrome-c552-immobilized electrode is formed.

Next, the first amino acid residue 14a of the electron transfer protein 14 is coupled to an amino acid residue of the cytochrome c552 13, and the second amino acid residue 14b of the electron transfer protein 14 is coupled to the counter electrode 15, optionally with a linker, for example, therebetween.

For a photoelectric transducer used in a dry environment, as shown in FIG. 11, the solid electrolyte 19 is held between the protein-immobilized electrode and the counter electrode 15.

In this way, a photoelectric transducer configured as in FIG. 10 or 11 is produced.

Operation of Photoelectric Transducer

Light incident on the electron transfer protein 14 of the photoelectric transducer causes photoexcitation to generate electrons that travel through the electron transfer protein 14, the cytochrome c552 13, and the self-assembled molecular monolayer 12 to the gold electrode 11. A photocurrent is then externally output from the gold electrode 11 and the counter electrode 15.

EXAMPLE 1

An example of the photoelectric transducer will be described.

Prepared was a 0.1 mM ethanol solution of 1-undecanethiol ($HS(CH_2)_{10}CH_3$), serving as a hydrophobic thiol, and 1-hydroxy-11-undecanethiol ($HS(CH_2)_{10}CH_2OH$), serving as a hydrophilic thiol, mixed at a ratio of 25:75. A clean gold drop electrode or gold planar electrode was then dipped in the solution and was left standing at room temperature for one day. Thus, a self-assembled molecular monolayer was formed on the surface of the gold electrode.

This electrode was rinsed with ultrapure water, was dipped in a 50 μM cytochrome c552 solution (containing 10 mM tris-hydrochloric acid buffer (pH 7.6) and 50 mM KCl), and was incubated at room temperature for more than 30 minutes. Thus, a cytochrome-c552-immobilized electrode was produced that had cytochrome c552 immobilized on the surface of the gold electrode with the self-assembled molecular monolayer therebetween.

Subsequently, cytochrome c was coupled to the cytochrome c552 as the electron transfer protein 14.

Figure 12:
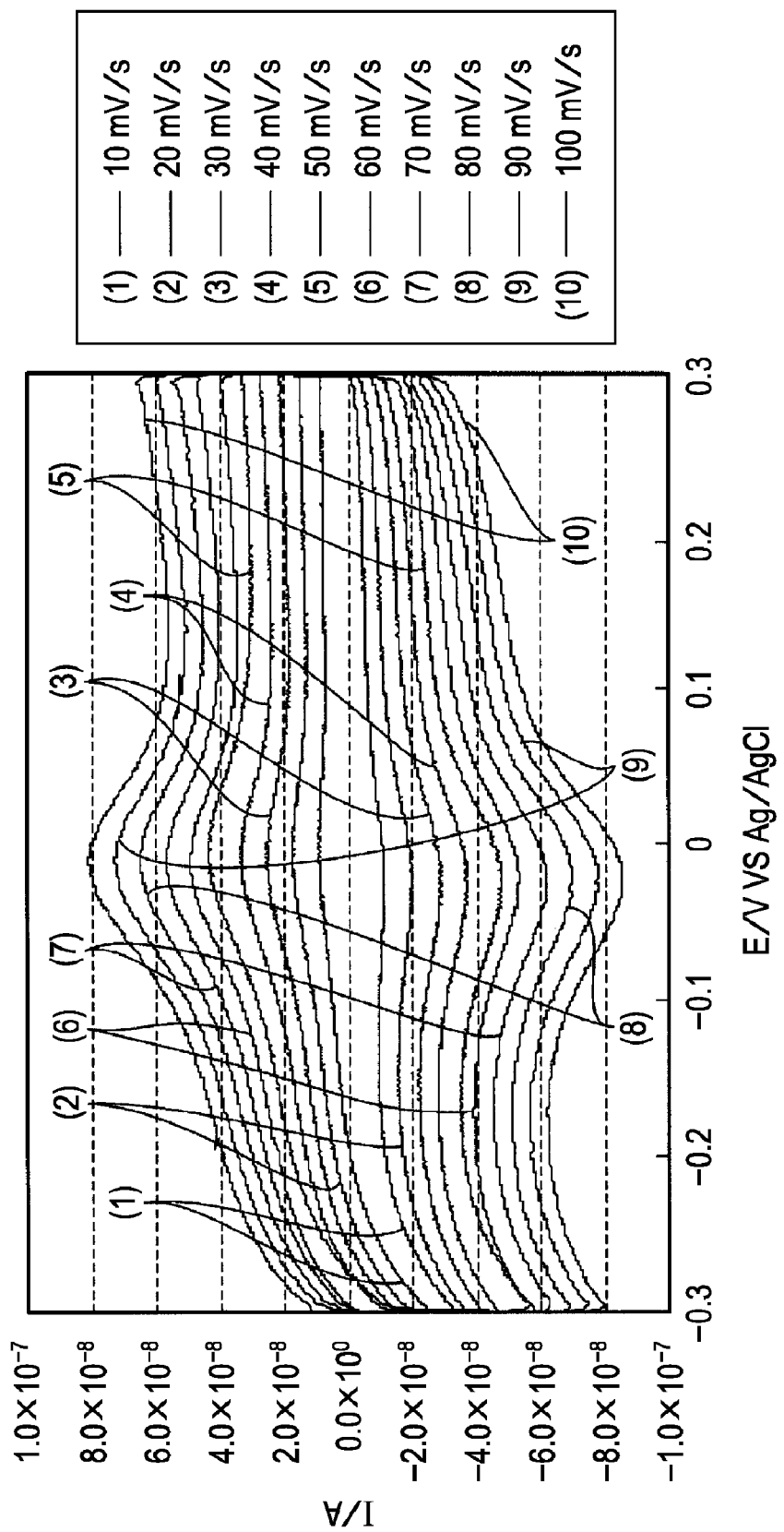
FIG. 12 is a graph showing the results of cyclic voltammetry carried out using a cytochrome-c552-immobilized electrode.
Figure 13:
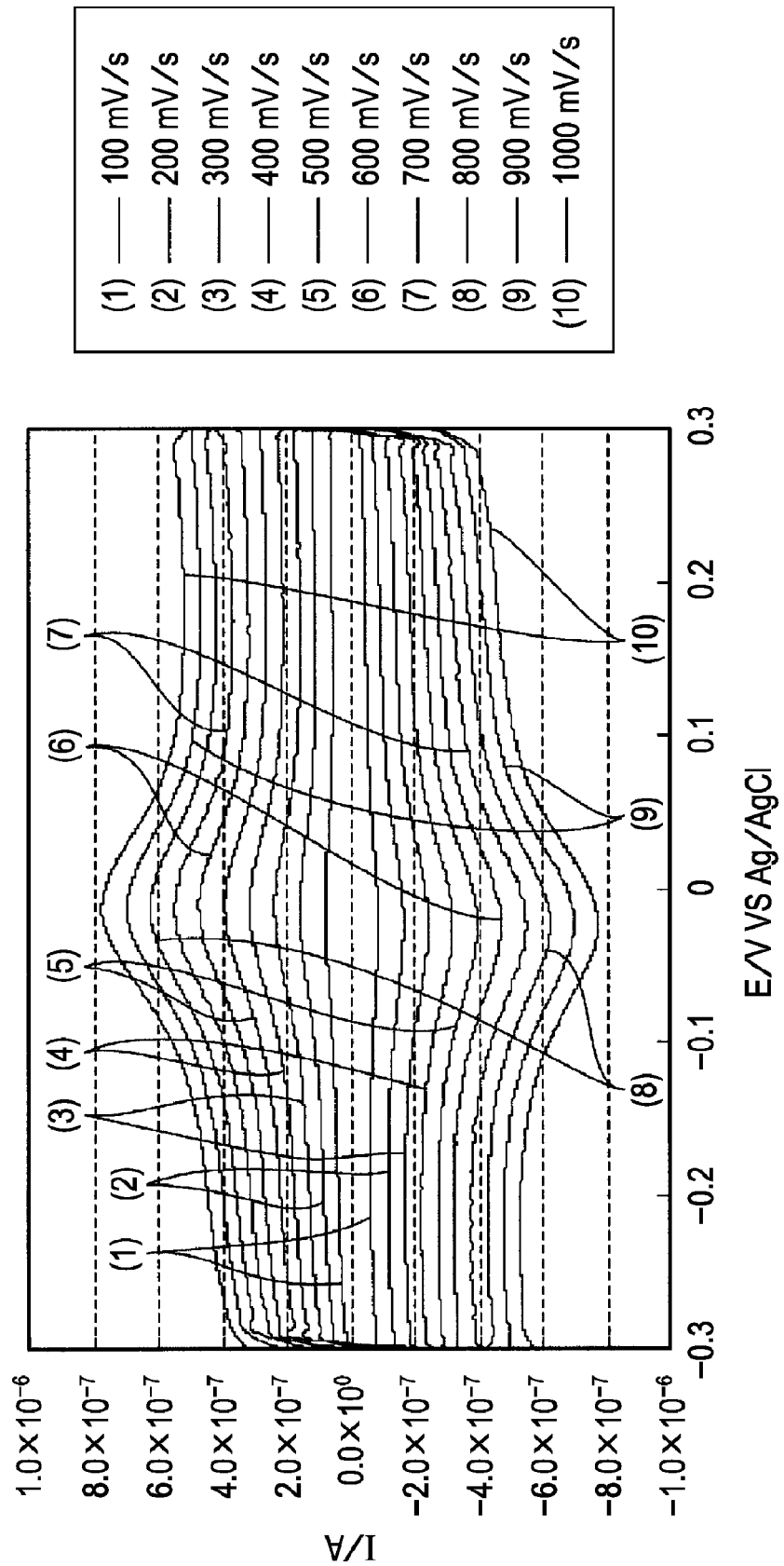
FIG. 13 is a graph showing the results of cyclic voltammetry carried out using the cytochrome-c552-immobilized electrode.

The cytochrome-c552-immobilized electrode having cytochrome c552 immobilized on the surface of the gold electrode with the self-assembled molecular monolayer therebetween was used to carry out cyclic voltammetry. The results are shown in FIGS. 12 and 13. In FIGS. 12 and 13, I is current (A), and E is the potential (V) with respect to a reference electrode (Ag/AgCl) (the same applies hereinafter). FIGS. 12 and 13 show typical adsorptive cyclic voltammograms without peak separation. The cyclic voltammograms shown in FIG. 12 are the results of measurement carried out with potential scan rates varying in steps of 10 mV/s in the range of 10 to 100 mV/s. In addition, the cyclic voltammograms shown in FIG. 13 are the results of measurement carried out with potential scan rates varying in steps of 100 mV/s in the range of 100 to 1,000 mV/s.

According to FIGS. 12 and 13, this cytochrome-c552-immobilized electrode had no peak separation in the range of potential scan rate of 10 to 1,000 mV/s. This means that the heme pocket of cytochrome c552 in the cytochrome-c552-immobilized electrode was optimally oriented to the gold electrode.

Figure 14:
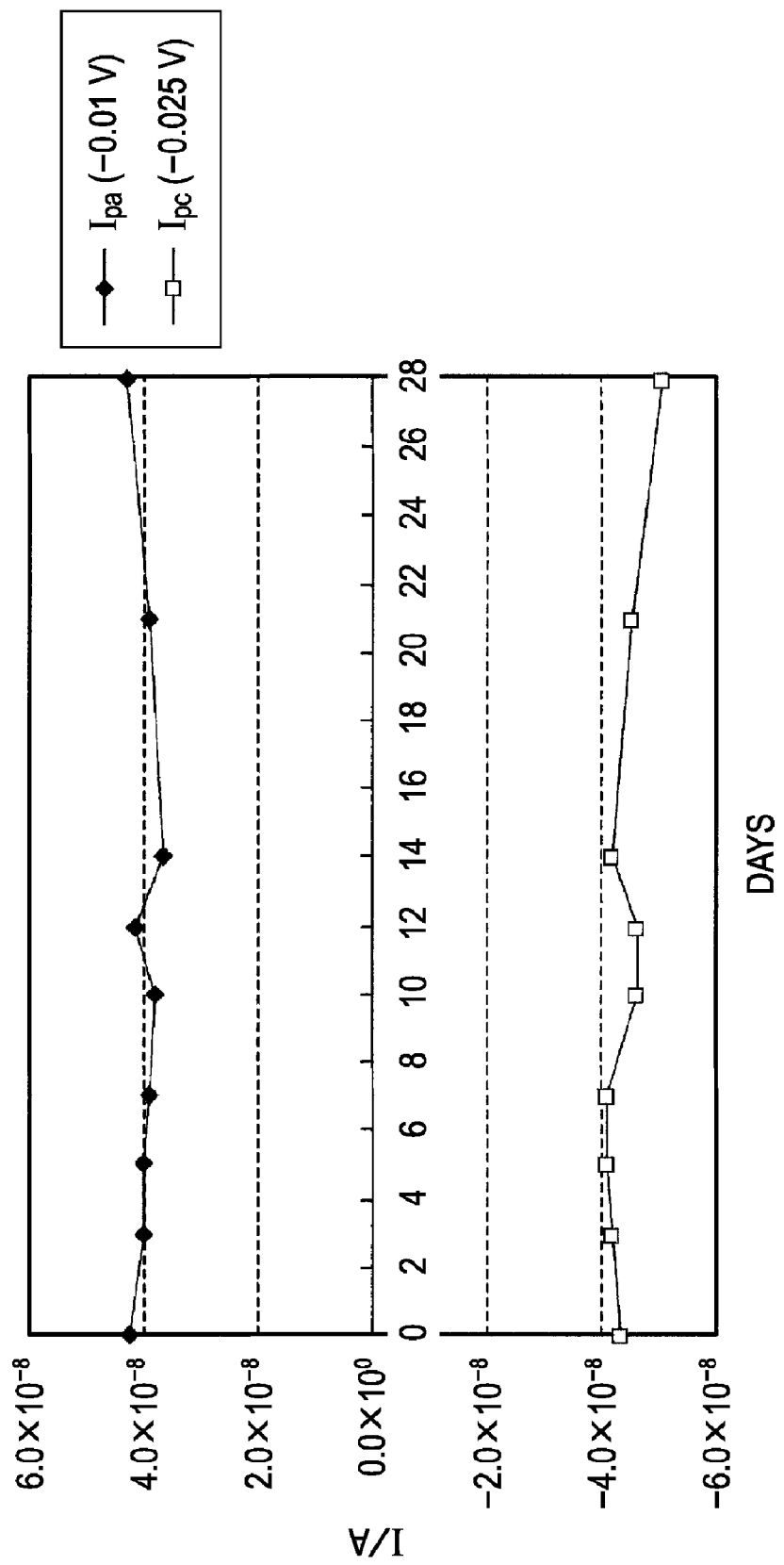
FIG. 14 is a graph showing daily changes in current occurring when the cytochrome-c552-immobilized electrode was stored in a protein solution at room temperature.

FIG. 14 shows daily changes in current (anodic current $I_{pa}$ and cathodic current $I_{ca}$) occurring when the cytochrome-c552-immobilized electrode was stored in a protein solution at room temperature. As shown in FIG. 14, this cytochrome-c552-immobilized electrode provided the same oxidation-reduction current after being stored in the protein solution at room temperature for one month. In contrast, according to a similar experiment using horse-heart cytochrome c, the current decreased gradually, and peak separation appeared in the cyclic voltammogram.

Next, comparison data for the case where the heme of cytochrome c552 in the cytochrome-c552-immobilized electrode was opposite in orientation to that of cytochrome c552 in the cytochrome-c552-immobilized electrode in Example 1, that is, the case where the heme faces away from the gold electrode, will be described. More specifically, data for the case where cytochrome c552 was immobilized on the gold electrode using a self-assembled molecular monolayer having a different terminal, that is, the case where cytochrome c552 was immobilized in a wrong orientation, will be described.

Specifically, cyclic voltammetry was carried out using cytochrome-c552-immobilized electrodes having cytochrome c552 immobilized on gold electrodes using thiols ($HS(CH2)10R$) having ten carbon atoms and different terminal groups (—R). The resultant cyclic voltammograms are shown in FIG. 15, where the buffer used was a 10 mM sodium phosphate solution (pH 7.0) and the potential scan rate was 50 mV/s.

Figure 15:
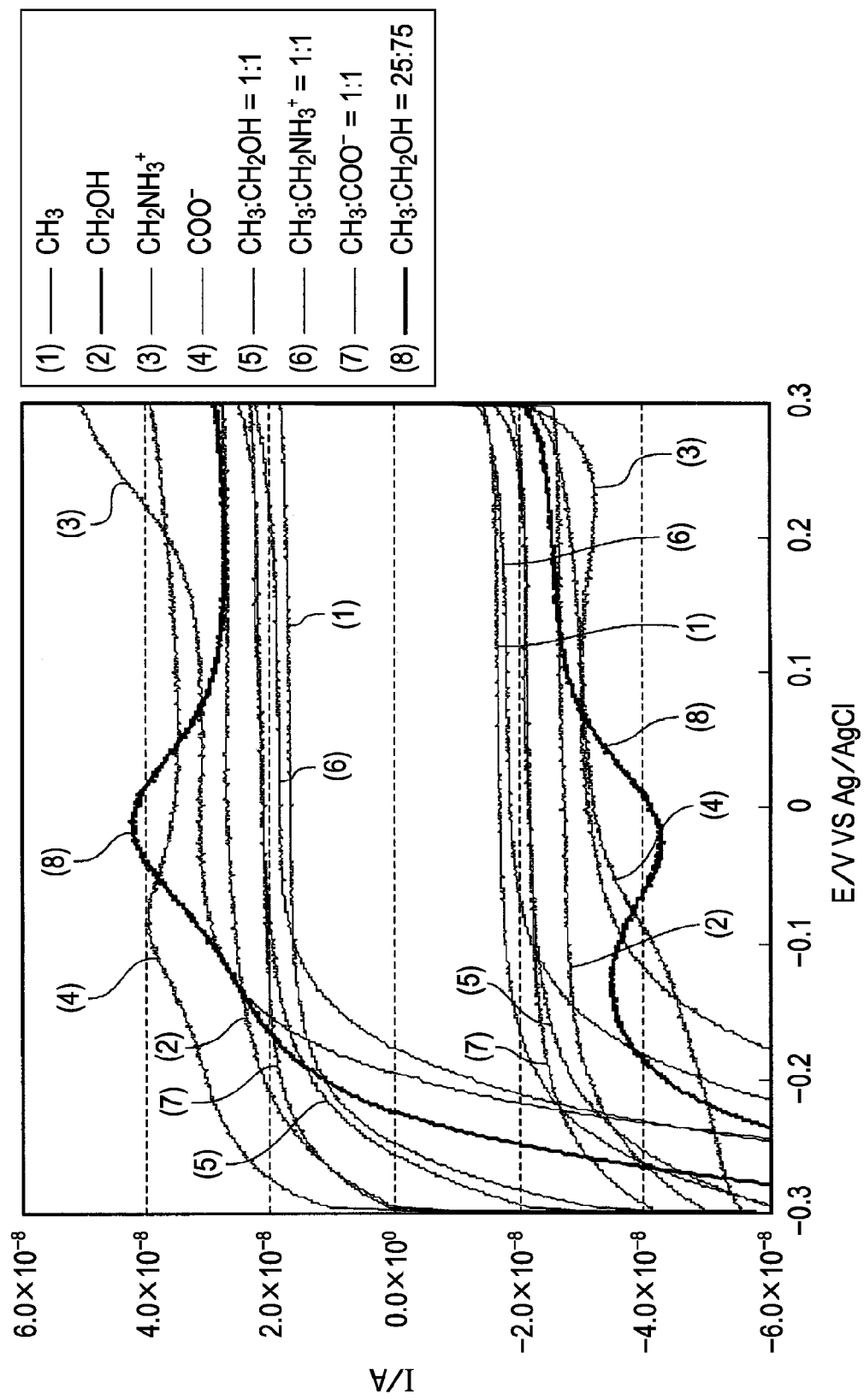
FIG. 15 is a graph showing the results of cyclic voltammetry carried out using cytochrome-c552-immobilized electrodes.

According to FIG. 15, protein-like oxidation and reduction peaks appeared in the case where the terminal (—R) was —COO$^-$, although it disappeared soon after repeated oxidation-reduction cycles. This demonstrates that the function of cytochrome c552 is not maintained if it is immobilized on a gold electrode in a wrong orientation.

Next, the results of cyclic voltammetry carried out using cytochrome-c552-immobilized electrodes formed using cytochrome c552 solutions having varying KCl concentrations will be described.

In the measurement, the buffer used was a 10 mM sodium phosphate solution (pH 7.0), and the potential scan rate was 50 mV/s. The cytochrome-c552-immobilized electrodes used, as above, had cytochrome c552 immobilized on gold drop electrodes with self-assembled molecular monolayers formed using $HS(CH_2)_{10}CH_3$ and $HS(CH_2)_{10}CH_2OH$ therebetween, where the diameter of the gold drop electrodes was 2.5 mm.

Figure 16:
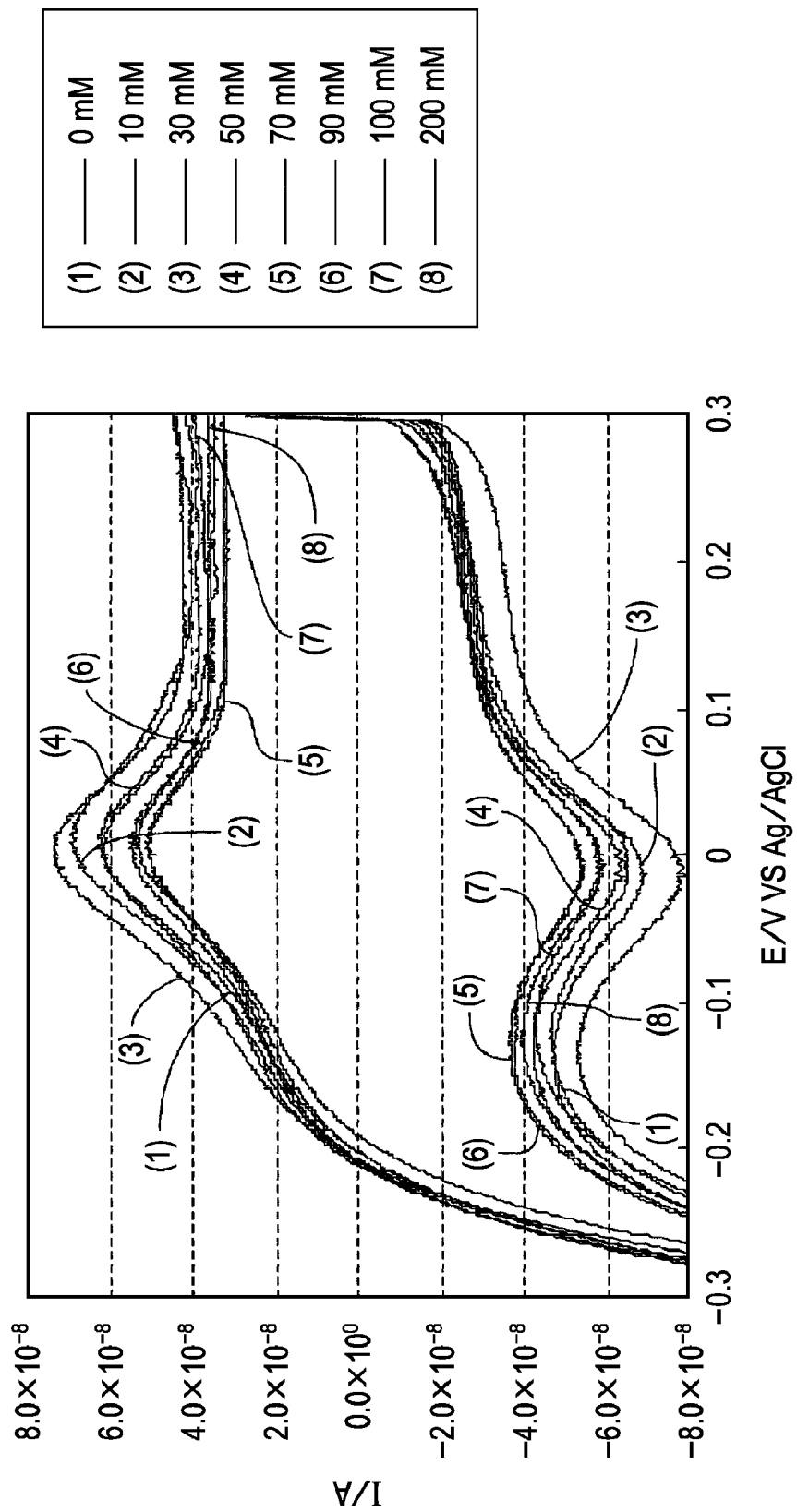
FIG. 16 is a graph showing the results of cyclic voltammetry carried out using cytochrome-c552-immobilized electrodes formed using cytochrome c552 solutions with varying KCl concentrations.

The resultant cyclic voltammograms are shown in FIG. 16, where the buffer used in the cytochrome c552 solutions was a 10 mM tris-hydrochloric acid buffer (pH 7.6). Because the range of KCl concentration of the cytochrome c552 solutions in which cytochrome c552 can be immobilized is 0 to 200 mM, cyclic voltammetry was carried out with KCl concentrations varying within that range.

Figure 17:
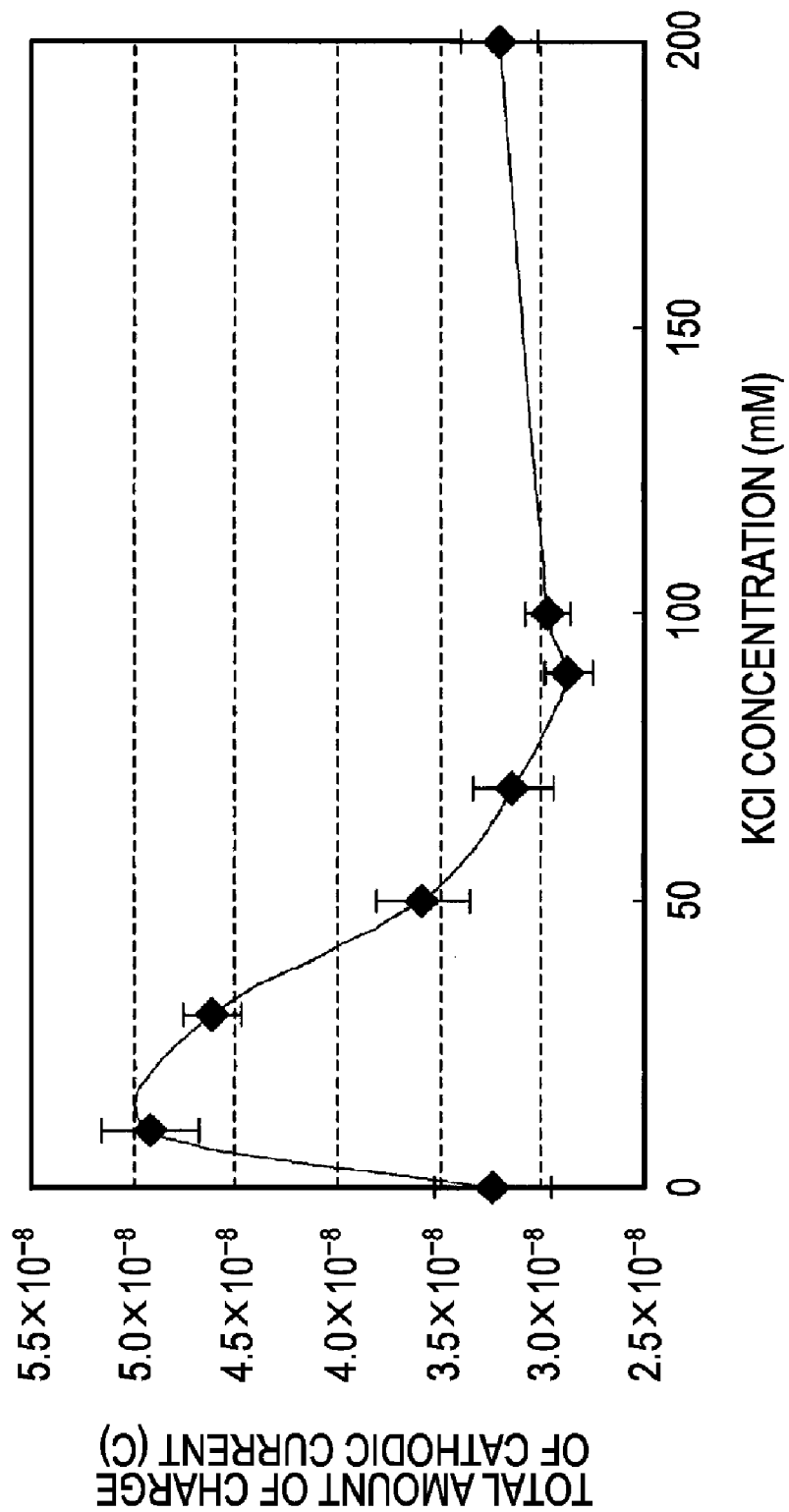
FIG. 17 is a graph showing the total amount of charge of cathodic current determined from the results of the measurement carried out using the cytochrome-c552-immobilized electrodes.

FIG. 17 shows a graph obtained by integrating the cathodic current (downward peak) of the cyclic voltammograms shown in FIG. 16, thus determining the total amount of charge, and then plotting it against the KCl concentration. According to FIG. 17, the optimum KCl concentration is 10 to 30 mM. If the concentration falls within the optimum range, the amount of cytochrome c552 13 immobilized is about 1.5 times that of the case where the cytochrome c552 solution contains no KCl, that is, the KCl concentration is 0 mM, or that of the case where the KCl concentration is 50 mM or more.

Next, self-assembled molecular monolayers were formed using ethanol solutions of $HS(CH_2)_{10}CH_3$ and HS $(CH_2)_{10}CH_2OH$ mixed with varying ratios of the amount of $HS(CH_2)_{10}CH_3$ to that of $HS(CH_2)_{10}CH_2OH$. Cytochrome-c552-immobilized electrodes formed by immobilizing cytochrome c552 on the gold electrodes with the self-assembled molecular monolayers therebetween were subjected to cyclic voltammetry. In the measurement, the buffer used was a 10 mM sodium phosphate solution (pH 7.0), and the potential scan rate was 50 mV/s.

Figure 18:
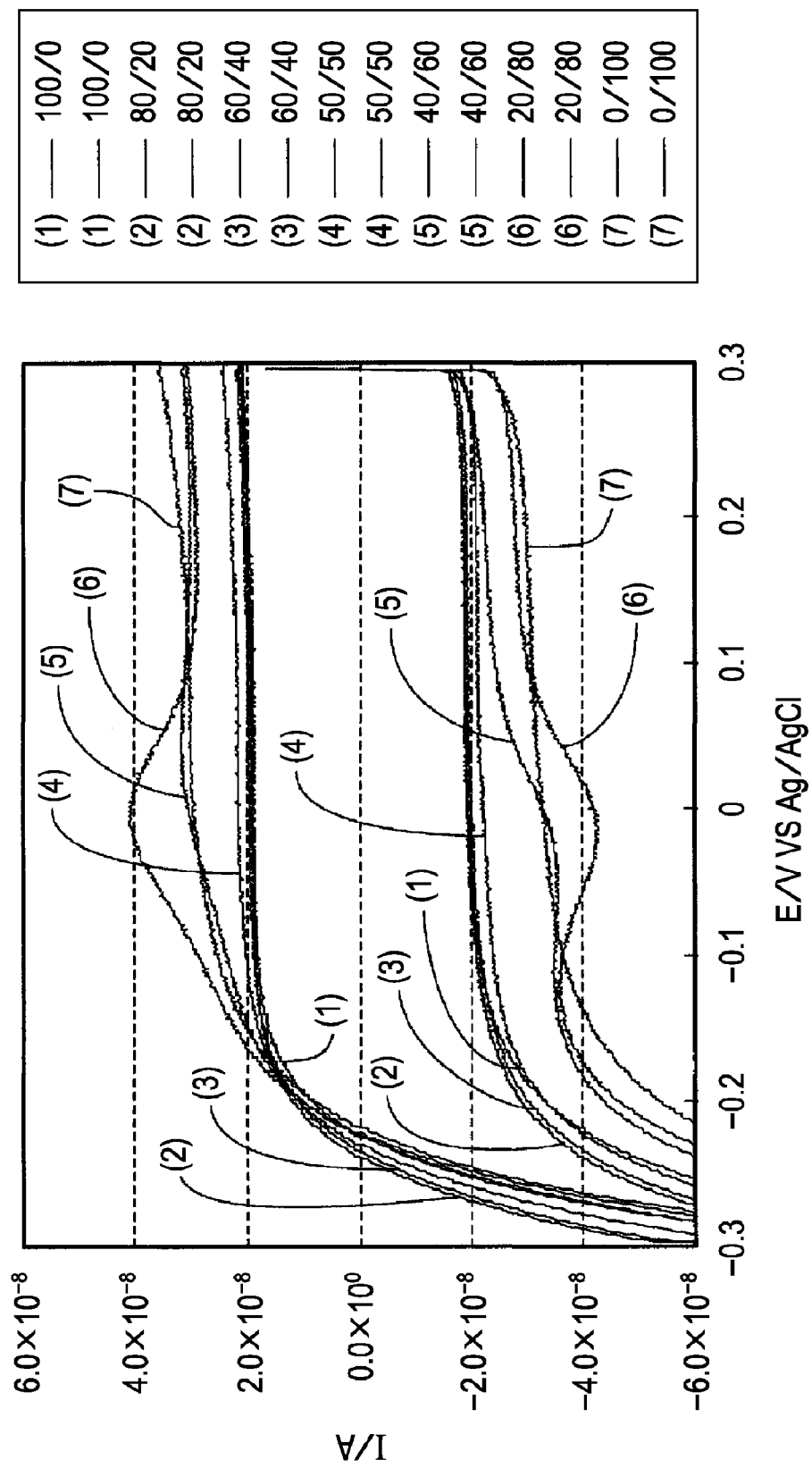
FIG. 18 is a graph showing the results of cyclic voltammetry carried out using cytochrome-c552-immobilized electrodes having self-assembled molecular monolayers formed using solutions with varying $HS(CH_2)_{10}CH_2OH$ contents.

The resultant cyclic voltammograms are shown in FIG. 18, where the ratios to the right of the graph represent [HS $(CH_2)_{10}CH_3$]/[HS$(CH_2)_{10}CH_2OH$]. For example, "20/80" means that the content of $HS(CH_2)_{10}CH_3$ is 20% and the content of $HS(CH_2)_{10}CH_2OH$ is 80%.

Based on the results shown in FIG. 18, a further measurement was carried out by finely changing the proportion of $HS(CH_2)_{10}CH_2OH$ in the total amount of $HS(CH_2)_{10}CH_3$ and $HS(CH_2)_{10}CH_2OH$ in steps of 5% in the range of 60% to 95%. The results are shown in FIG. 19.

Figure 19:
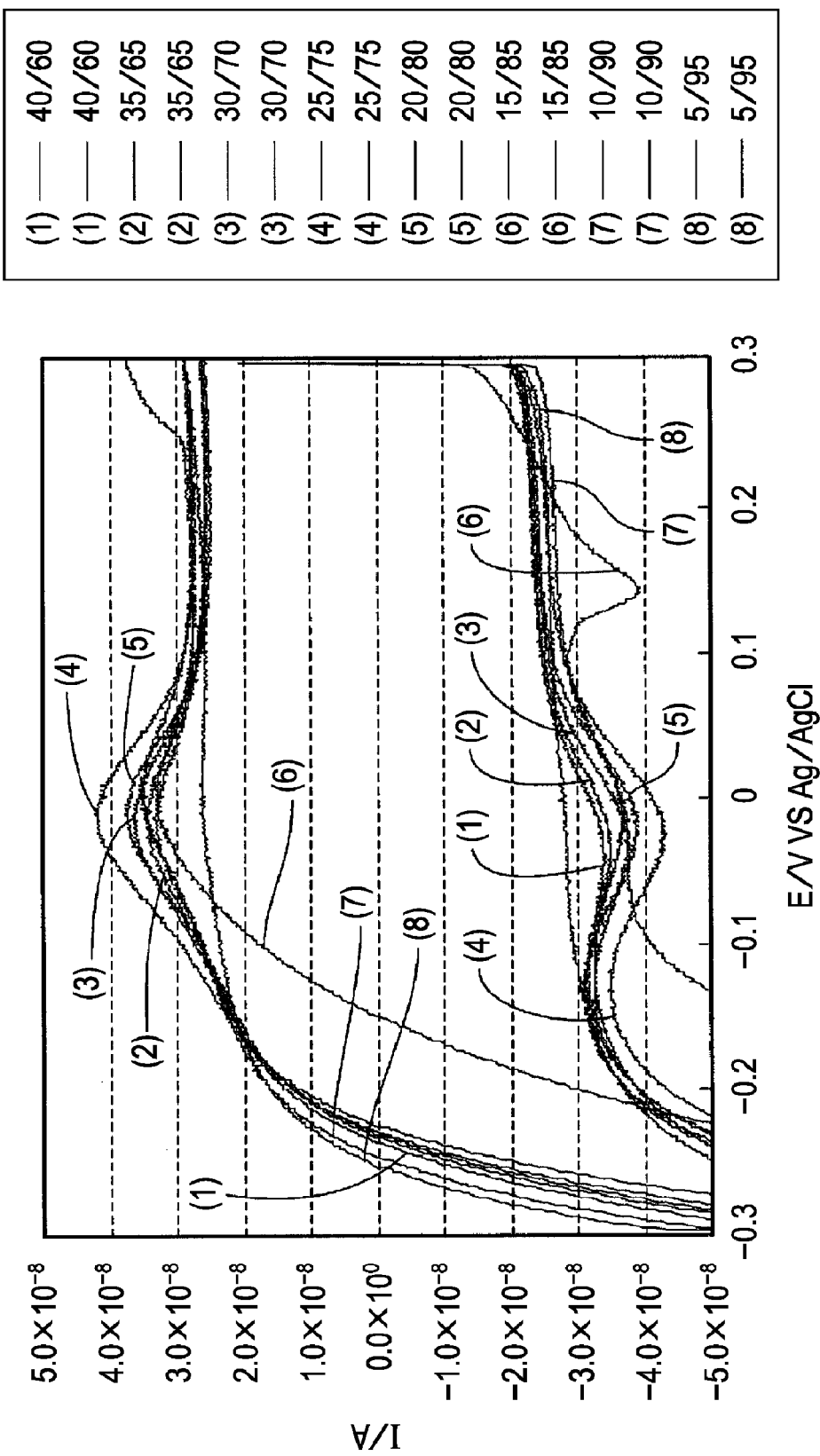
FIG. 19 is a graph showing the results of cyclic voltammetry carried out using cytochrome-c552-immobilized electrodes having self-assembled molecular monolayers formed using solutions with varying $HS(CH_2)_{10}CH_2OH$ contents.
Figure 20:
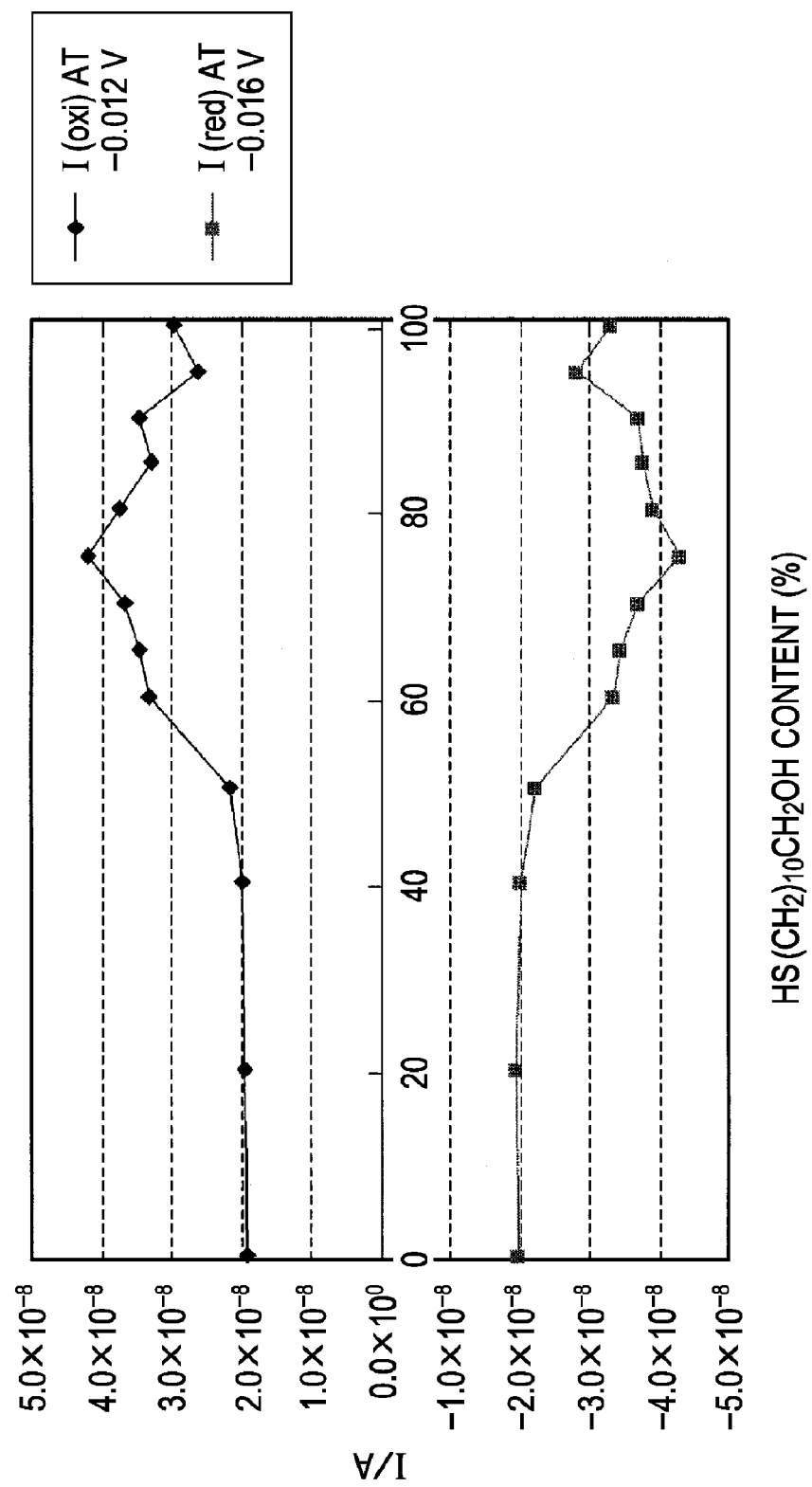
FIG. 20 is a graph obtained by plotting peak current against $HS(CH_2)_{10}CH_2OH$ content in the cyclic voltammograms obtained by the cyclic voltammetry carried out using the cytochrome-c552-immobilized electrodes having the self-assembled molecular monolayers formed using the solutions with varying $HS(CH_2)_{10}CH_2OH$ contents.

FIG. 20 shows a graph obtained by plotting currents at oxidation and reduction peaks in the results shown in FIGS. 18 and 19 against the content of $HS(CH_2)_{10}CH_2OH$. According to FIG. 20, cytochrome c552 can be properly immobilized if the content of $HS(CH_2)_{10}CH_2OH$ falls within the range of 60% to 90%. Although the details are not shown, another experiment confirmed that cytochrome c552 can be properly immobilized if the content of $HS(CH_2)_{10}CH_2OH$ falls within the range of 60% to 90% in every case where the hydrophobic thiol is $HS(CH_2)_nCH_3$ (n=5, 8, or 10) and the hydrophilic thiol is $HS(CH_2)_nCH_2OH$ (n=5, 8, or 10).

Next, the results of cyclic voltammetry carried out using cytochrome-c552-immobilized electrodes having self-assembled molecular monolayers formed using hydrophobic thiols and hydrophilic thiols with varying lengths will be described. Specifically, the self-assembled molecular monolayers were formed using various combinations of hydrophobic thiols having a methyl terminal and five or ten carbon atoms, namely, $HS(CH_2)_5CH_3$ and $HS(CH_2)_{10}CH_3$, and hydrophilic thiols having a hydroxymethyl terminal and five or ten carbon atoms, namely, $HS(CH_2)_{10}CH_2OH$ and $HS(CH_2)_5CH_2OH$. Cytochrome c552 was then immobilized on the gold electrodes with the self-assembled molecular monolayers therebetween. The cytochrome-c552-immobilized electrodes thus formed were used to carry out cyclic voltammetry. The resultant cyclic voltammograms are shown in FIG. 21.

Figure 21:
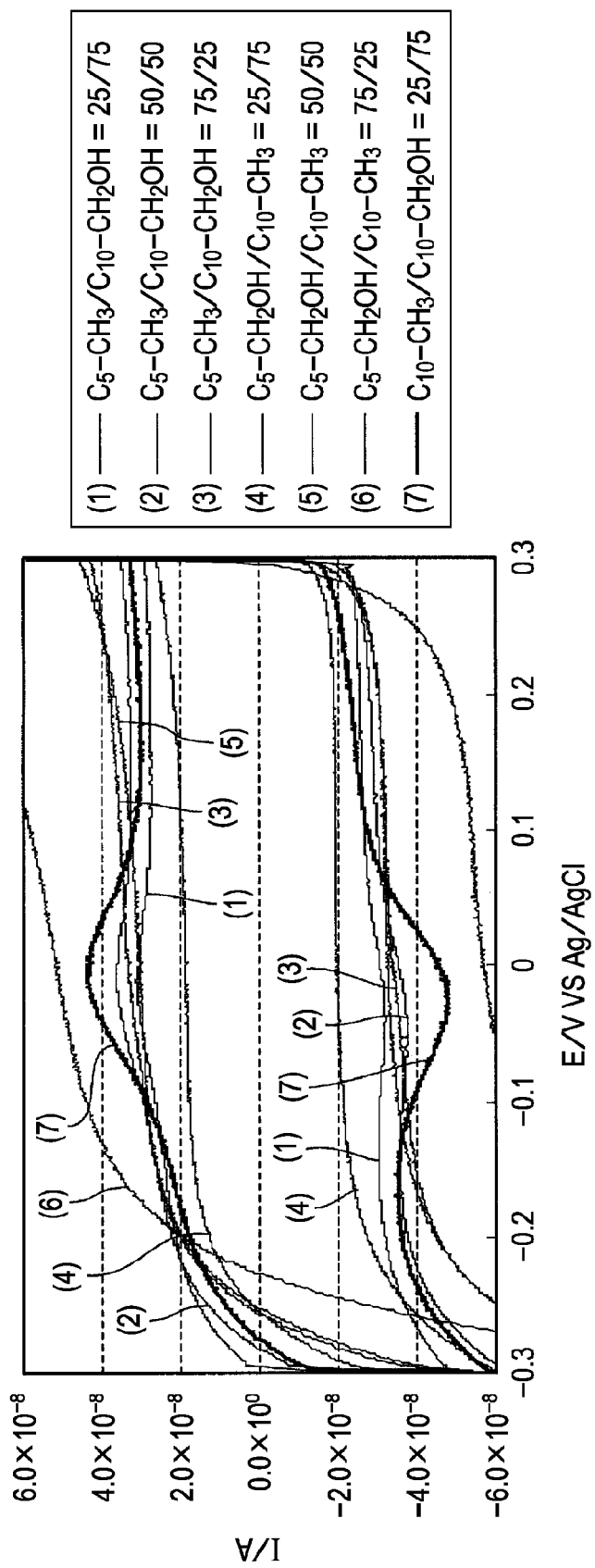
FIG. 21 is a graph showing the results of cyclic voltammetry carried out using cytochrome-c552-immobilized electrodes having self-assembled molecular monolayers formed using hydrophobic thiols and hydrophilic thiols with varying lengths.

The curves (1), (2), (3), and (7) shown in FIG. 21 had protein-derived peaks around 0 V. This means that cytochrome c552 can be immobilized in a similar orientation even if the number of carbons of the hydrophobic thiol or the hydrophilic thiol is changed if a balance is maintained between the methyl group of the hydrophobic thiol and the hydroxyl group of the hydrophilic thiol used in the formation of the self-assembled molecular monolayer, that is, if a balance is maintained between the distributions of the hydrophobic group and the hydrophilic group on the surface of the self-assembled molecular monolayer. As for the hydrophilic thiol, better results were obtained in the case where the hydrophilic group had ten carbon atoms than in the case where the hydrophilic group had five carbon atoms.

According to the first embodiment, as described above, the cytochrome c552 13, which has high stability, is immobilized on the gold electrode 11, which is chemically stable, with the self-assembled molecular monolayer 12 therebetween such that the hydrophobic portion 13*a* faces the gold electrode 11. This allows the cytochrome c552 13 to be immobilized on the gold electrode 11 while maintaining its electron transfer properties. In addition, a photoelectric transducer can be realized by coupling the electron transfer protein 14 having a photoelectric conversion function to the cytochrome c552 13. The absorption wavelength of the photoelectric transducer can be selected by selecting the electron transfer protein 14. For example, a green-light photoelectric transducer can be formed using zinc-substituted cytochrome c as the electron transfer protein 14, and a blue-light photoelectric transducer can be formed using zinc-substituted cytochrome c552 as the electron transfer protein 14. In addition, a photoelectric transducer that can be stably used over an extended period of time can be realized using an electron transfer protein 14 having thermal stability, such as zinc-substituted cytochrome c552 or a cytochrome c552 modified zinc-porphyrin. In addition, the photoelectric transducer is highly sensitive because it has a light amplification function. In addition, the size of the photoelectric transducer can be made extremely small because the sizes of the cytochrome c552 13 and the electron transfer protein 14 are extremely small, namely, about 1 to 10 nm. Thus, a photoelectric transducer that is extremely small, that is highly sensitive, and that can be stably used over an extended period of time can be realized.

This photoelectric transducer can be used in, for example, an imaging device or a photosensor, optionally in combination with a circuit for amplifying a photocurrent. The photosensor can be used for various applications including detection of optical signals, and can also be applied to, for example, artificial retinas.

This photoelectric transducer can be used in various equipment and apparatuses using photoelectric conversion, for example, electronic apparatuses having light-sensitive elements. The type of electronic apparatus is basically not limited and may be either portable or stationary, and specific examples include digital cameras and camcorders.

2. Second Embodiment

Blue-Light Photoelectric Transducer

Figure 22:
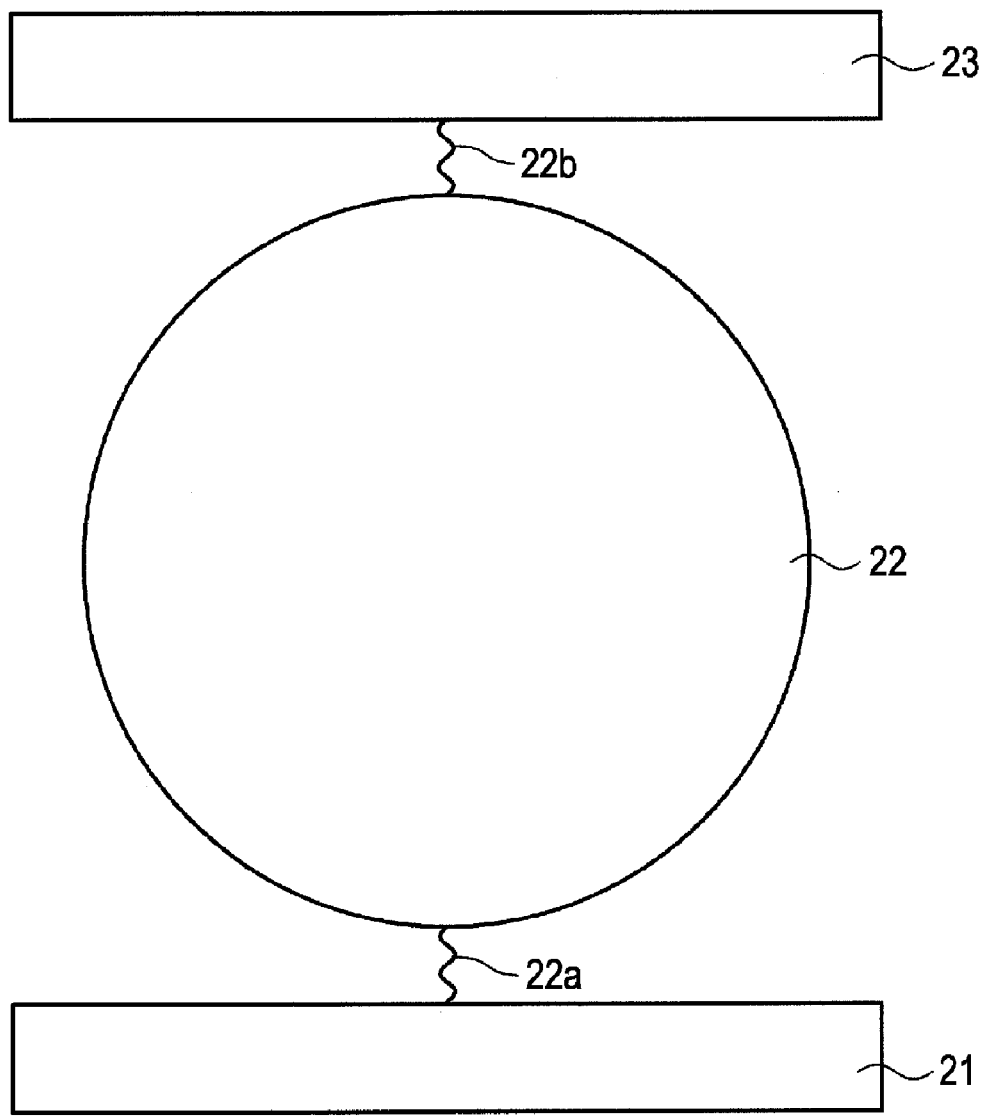
FIG. 22 is a schematic diagram showing a photoelectric transducer according to a second embodiment.

FIG. 22 shows a blue-light photoelectric transducer according to a second embodiment.

As shown in FIG. 22, this photoelectric transducer has zinc-substituted cytochrome c552 22 immobilized on an electrode 21. A first amino acid residue 22*a* of the zinc-substituted cytochrome c552 22 is coupled to the electrode 21, optionally with a linker, for example, therebetween. In addition, a second amino acid residue 22*b* of the zinc-substituted cytochrome c552 22 is coupled to a counter electrode 23, optionally with a linker, for example, therebetween. A first molecular orbital is localized in the first amino acid residue 22*a* of the zinc-substituted cytochrome c552 22, whereas a second molecular orbital is localized in the second amino acid residue 22*b* of the zinc-substituted cytochrome c552 22. The second molecular orbital has the maximum transition probability per unit time for the first molecular orbital. In this case, photoexcitation induces transition of electrons between the first and second molecular orbitals, thus transferring electrons or holes between the first amino acid residue 22*a* and the second amino acid residue 22*b*. The details are disclosed in Patent Document 4. The electrode 21 used may be one of those mentioned above, including a gold electrode, and may be selected as appropriate. The same applies to the counter electrode 23.

The zinc-substituted cytochrome c552 22 is cytochrome c552 having zinc substituted for the central metal of the heme, namely, iron. The zinc-substituted cytochrome c552 22 is a florescent protein that has high thermal stability, as does cytochrome c552, and that absorbs blue light.

Operation of Photoelectric Transducer

Light incident on the zinc-substituted cytochrome c552 22 of the photoelectric transducer causes photoexcitation to generate electrons and/or holes that travel through the zinc-substituted cytochrome c552 22 to the electrode 21. A photocurrent is then externally output from the electrode 21 and the counter electrode 23.

In other points, the second embodiment is similar to the first embodiment.

EXAMPLE 2 a. Method for Synthesizing Zinc-Substituted Cytochrome c552

The starting material used is recombinant cytochrome c552 (the central metal is iron) prepared by cultivating, crushing, and purifying *E. coli* carrying a vector containing the cytochrome c552 gene of the thermophile *Thermus thermophilus*. Fifty to a hundred milligrams of a freeze-dried powder of the cytochrome c552 is mixed with 6 mL of 70% hydrofluoric acid/pyridine and is incubated at room temperature for ten minutes to remove the central metal, namely, iron, from the cytochrome c552. The mixture is then mixed with 9 mL of 50 mM ammonium acetate buffer (pH 5.0) and, after the reaction is completed, is subjected to gel filtration column chromatography (column volume: 150 mL; resin: Sephadex G-50; developing solvent: 50 mM sodium acetate buffer; pH 5.0) to yield metal-free cytochrome c552 (MFc552) having the central metal removed therefrom.

The Mfc552 solution thus yielded is condensed as much as possible and is mixed with glacial acetic acid to a pH of 2.5 (±0.05). The solution is then mixed with 30 mg of an acetic anhydride-zinc powder and is incubated at 50° C. for two to three hours in the dark. The incubation is continued while the absorption spectrum is measured every 30 minutes until the ratio of the absorption intensity at the wavelength corresponding to the protein, namely, 280 nm, to the absorption intensity at the wavelength corresponding to zinc-porphyrin, namely, 420 nm, becomes constant.

The following procedures are all carried out in the dark. The solution is mixed with a saturated sodium monohydrogen diphosphate solution to a neutral pH (above 6.0) and is incubated at 70° C. for five to ten minutes. The resultant precipitate and concentrate are dissolved in a small amount of 7.2 M guanidine hydrochloride. The solution is gradually dropped into a ten-fold volume of 10 mM sodium phosphate buffer (pH 7.0). After the concentration and the buffer exchange to 10 mM sodium phosphate buffer (pH 7.0), a monomer fraction is recovered by cation exchange column chromatography (eluted with a linear concentration gradient of 10 to 150 mM sodium phosphate buffer (pH 7.0)). Thus, zinc-substituted cytochrome c552 (Znc552) is synthesized.

b. Properties of Zinc-Substituted Cytochrome c552

Figure 23:
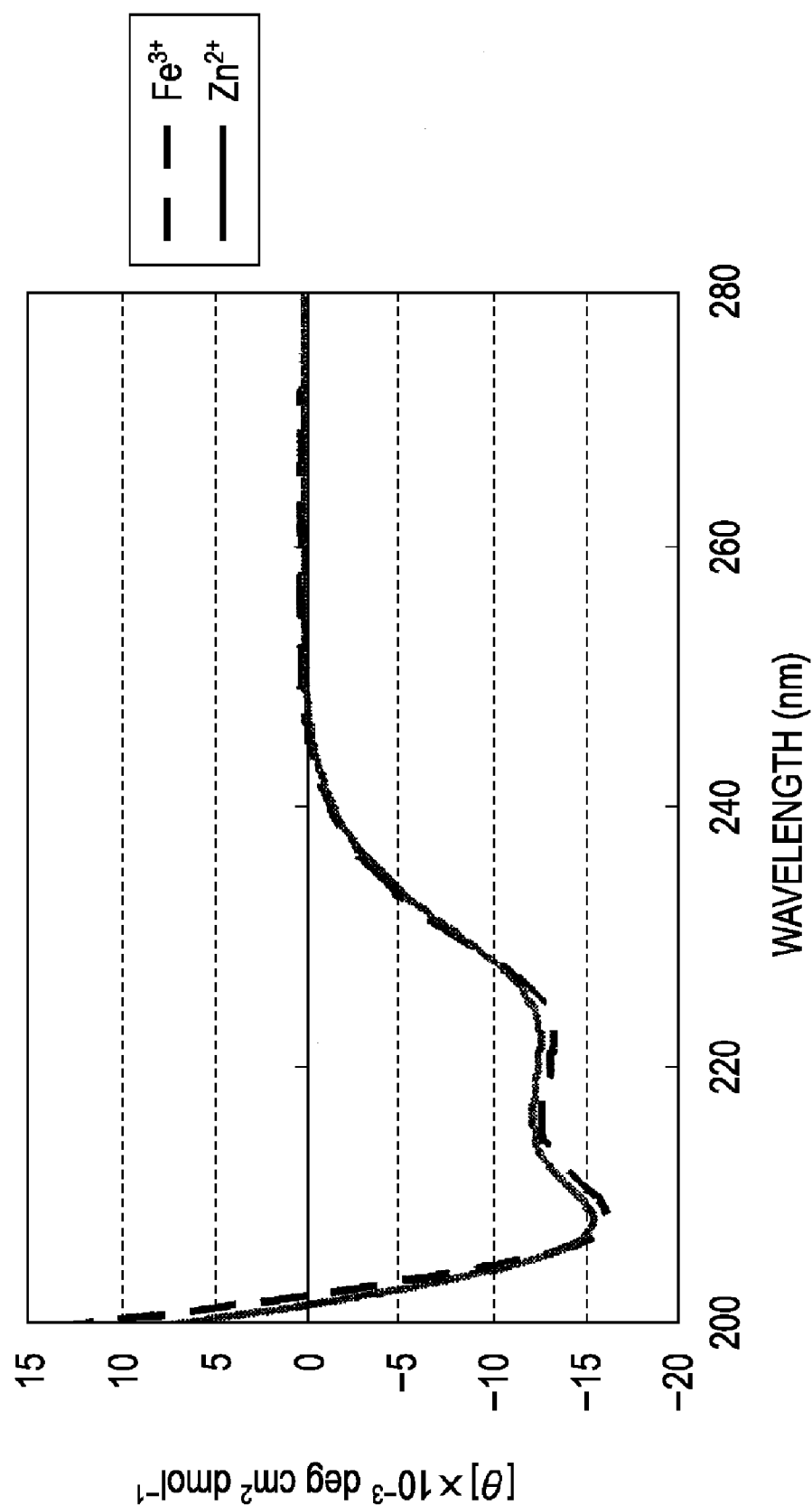
FIG. 23 is a graph showing the results of circular dichroism spectrum measurement of zinc-substituted cytochrome c552.

Circular dichroism spectrum measurement confirmed that zinc-substituted cytochrome c552 synthesized in the above manner had the same protein folding pattern as native (iron) cytochrome c552 (see FIG. 23). In the circular dichroism spectrum measurement, the sensitivity was 100 mdeg, the wavelength scan rate was 100 nm/min, the response time was two seconds, the band width was 2.0 nm, the integrate was 5, and a 10 mM sodium phosphate buffer (pH 7.0) was used.

Figure 24:
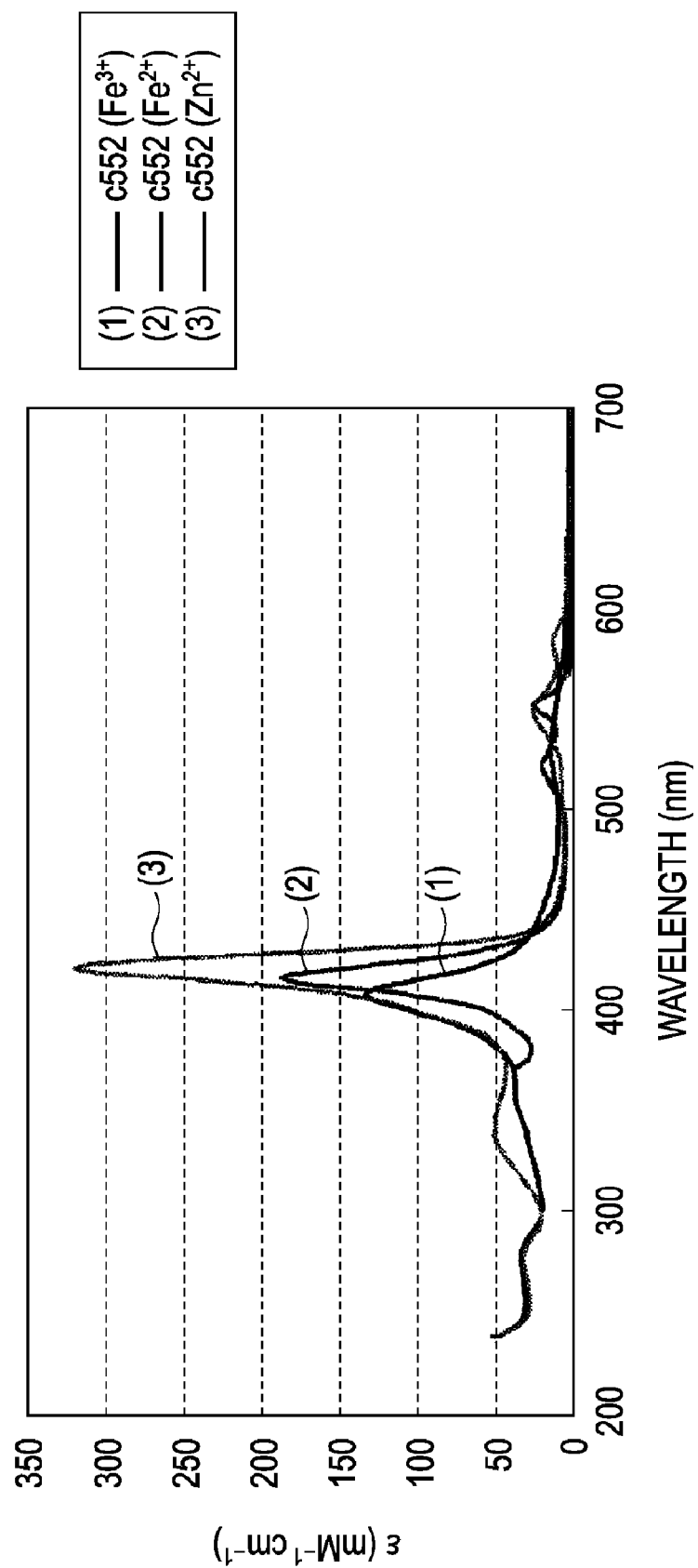
FIG. 24 is a graph showing the results of absorption spectrum measurement of various types of cytochrome c552.
Figure 25A:
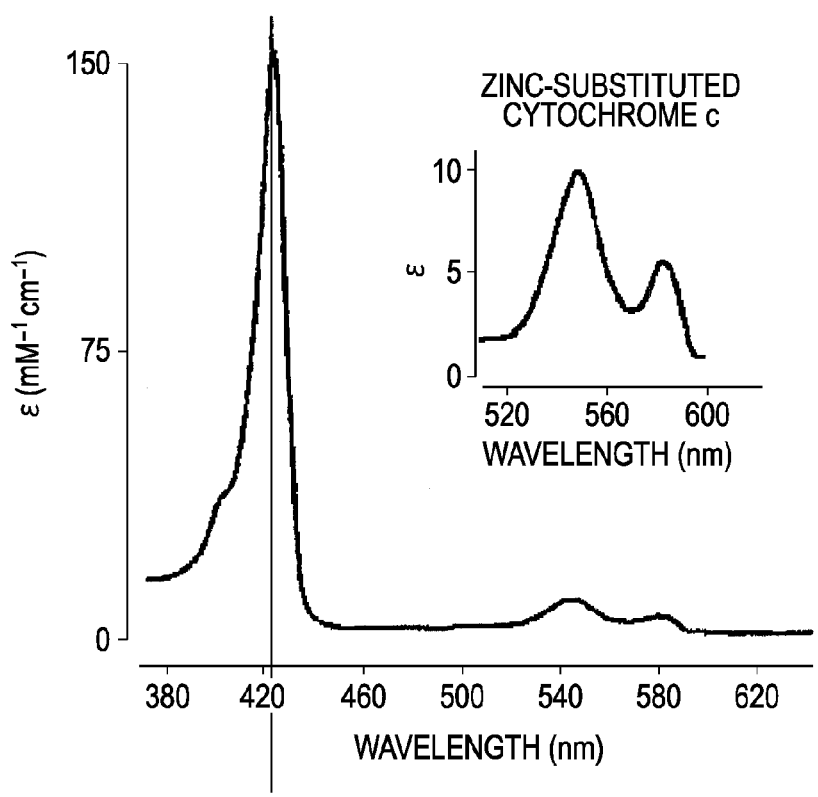
FIGS. 25A and 25B are a graph showing the absorption spectrum of zinc-substituted cytochrome c and a schematic diagram showing the structure of zinc-porphyrin serving as a chromophore of zinc-substituted cytochrome c, respectively.
Figure 25B:
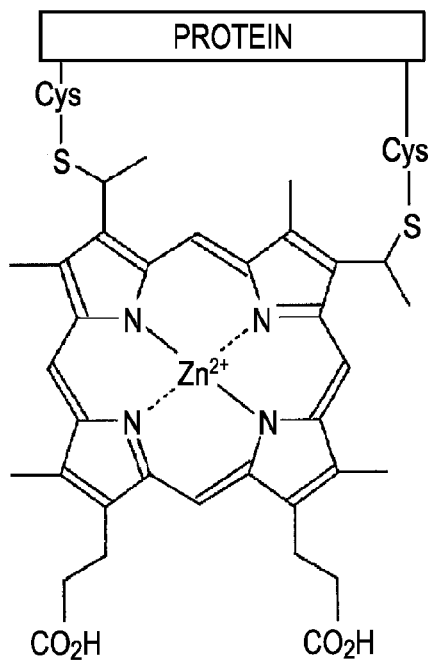

FIG. 24 shows the results of absorption spectrum measurement of zinc-substituted cytochrome c552 and cytochrome c552. For comparison, FIG. 25A shows the results of absorption spectrum measurement of zinc-substituted cytochrome c (Znhhc), that is, horse-heart cytochrome c having zinc substituted for the central metal of the heme, namely, iron (see Vanderkooi, J. M. and 2 others, Eur. J. Biochem. 64, 381-387 (1976)). FIG. 25B shows the structure of zinc-porphyrin serving as a chromophore of zinc-substituted cytochrome c (Znhhc). As shown in FIG. 25B, zinc is coordinated to the center of protoporphyrin IX, and vinyl groups of the porphyrin and cysteine residues of the cytochrome protein form thioether bonds.

According to FIGS. 24 and 25A, zinc-substituted cytochrome c552 had an absorption spectrum with absorption maximums at wavelengths of 422, 549, and 583 nm and had substantially the same pattern as the zinc-substituted cytochrome c (Znhhc) synthesized from horse-heart cytochrome c. The absorption coefficients ε of zinc-substituted cytochrome c552 at the individual absorption maximums were higher than those of zinc-substituted cytochrome c (see Table 1).

TABLE 1

Absorption maximum of cytochrome c552 (nm)/
illimolar absorption coefficient ε
($mM^{-1}cm^{-1}$)

|  | Protein | Soret | β | α |
|---|---|---|---|---|
| Znc552 | 280/31.7 | 422/316 | 549/23.4 | 583/11.3 |
| $Fe^{3+}$c552 | 280/33.6 | 409/131 |  | 531/13.3 |
| $Fe^{2+}$c552 |  | 417/184 | 522/19.3 | 552/23.7 |
| Znhhc* |  | 423/243 | 549/15.5 | 585/7.9 |

*Vanderkooi, JM. and 2 others, Eur. J. Biochem. 64, 381 (1976).

Figure 26A:
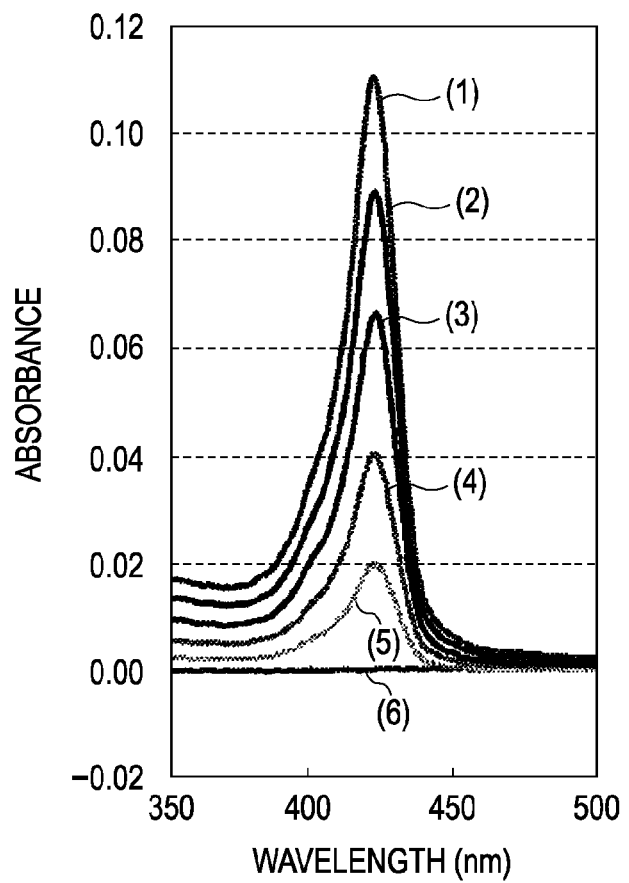
FIGS. 26A and 26B are graphs showing the results of measurement of the absorption spectrum and the fluorescence spectrum, respectively, of zinc-substituted cytochrome c552.
Figure 26B:
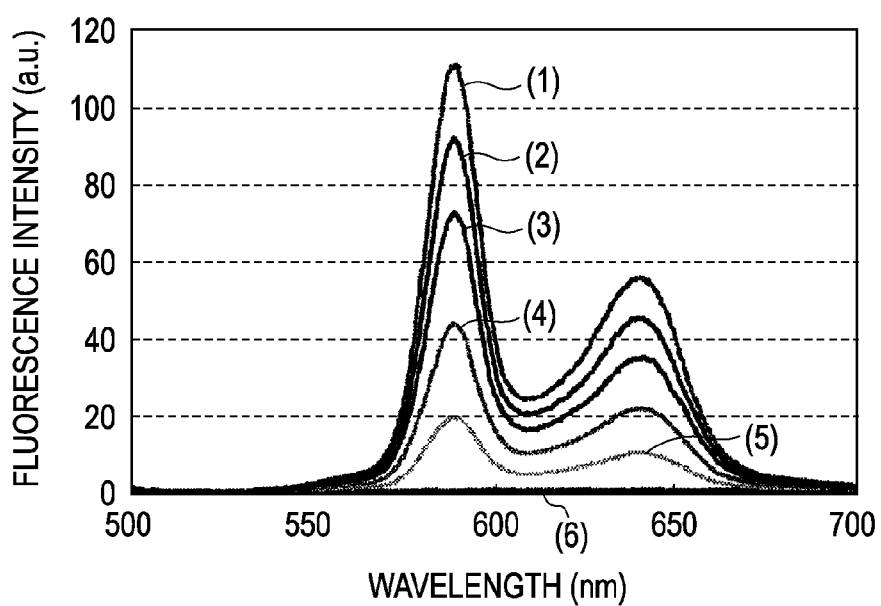

FIG. 26A shows absorption spectra of zinc-substituted cytochrome c552, and FIG. 26B shows fluorescence spectra of zinc-substituted cytochrome c552 excited by light with a wavelength of 424 nm. In FIGS. 26A and 26B, the same numbers assigned to the curves correspond to the absorption/fluorescence spectra for the same concentrations. As shown in FIG. 26B, the fluorescence spectra of zinc-substituted cytochrome c552 had maximum wavelengths of 590 and 641 nm, which are the same as those of zinc-substituted cytochrome c.

Figure 27:
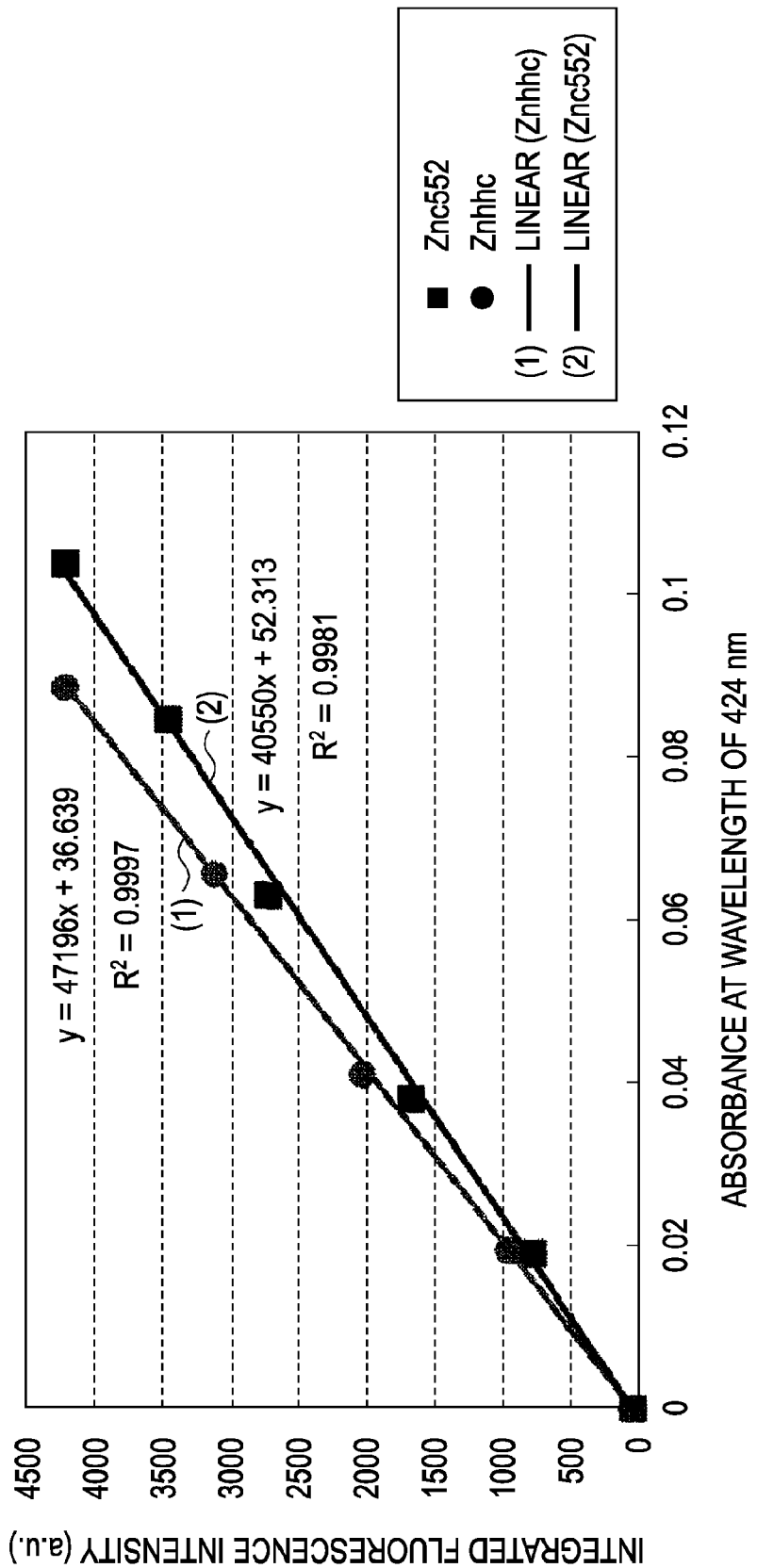
FIG. 27 is a graph showing the results of quantum yield measurement of zinc-substituted cytochrome c552 and zinc-substituted cytochrome c.

FIG. 27 shows a graph obtained by measuring absorption/fluorescence spectra of different concentrations of zinc-substituted cytochrome c552 and plotting the integrated fluorescence intensity in the wavelength range of 568 to 668 nm against the absorbance at a wavelength of 424 nm. The same procedure was also performed using zinc-substituted cytochrome c. The relative quantum yields were determined from the gradients of the resultant lines. The results show that, assuming that the gradient of the line for zinc-substituted cytochrome c is equal to a relative quantum yield φ of 1, the relative quantum yield φ of the zinc-substituted cytochrome c552 is 0.86, that is, nearly the same as that of zinc-substituted cytochrome c.

Figure 28A:
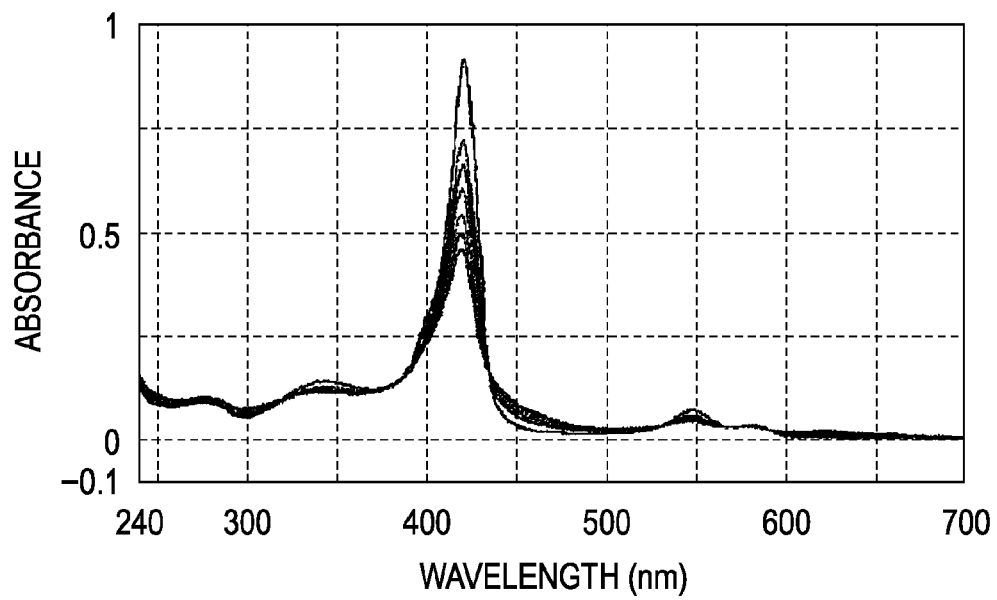
FIGS. 28A and 28B are graphs illustrating the photodecomposition of zinc-substituted cytochrome c552 and zinc-substituted cytochrome c.
Figure 28B:
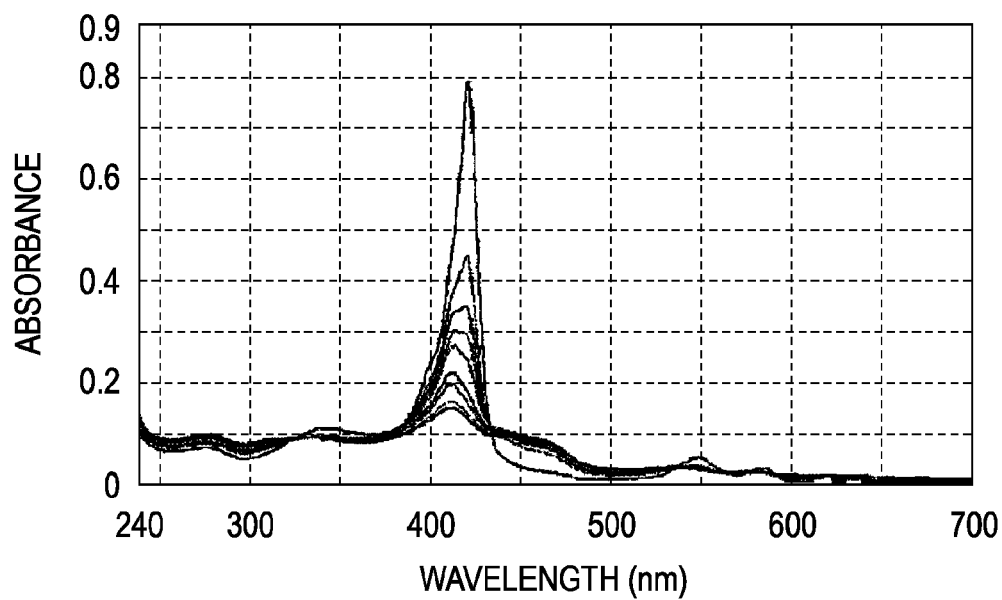

Zinc-substituted cytochrome c is rapidly decomposed by irradiation with light. Accordingly, the photodecomposition rates of samples of zinc-substituted cytochrome c552 and zinc-substituted cytochrome c were determined by irradiation with the absorption maximum wavelength to which they are most susceptible, namely, blue light with a wavelength of 420 nm. One milliliter of about 3 μM protein solution was placed into a quartz spectrophotometer cuvette and was irradiated with blue light with a wavelength of 420 nm (1,630 μW) while the absorption spectrum was measured every 30 minutes. FIGS. 28A and 28B show the results of absorption spectrum measurement of zinc-substituted cytochrome c552 and zinc-substituted cytochrome c, respectively. According to FIGS. 28A and 28B, the absorption spectrum of zinc-substituted cytochrome c changed considerably, whereas the absorption spectrum of zinc-substituted cytochrome c552 changed less. This means that zinc-substituted cytochrome c552 is stable to irradiation with light.

The concentration (C) was calculated from the absorbance at a wavelength of 422 nm using the millimolar absorption coefficient (see Table 1), and the reciprocal of the concentration (C), namely, 1/C, was plotted against time. The results are shown in FIG. 29. According to FIG. 29, the photodecomposition rate constant k, determined from the gradient of the resultant line, was 33 (±1.5) $M^{-1}s^{-1}$, which is one third of that of zinc-substituted cytochrome c (k=96±7.1 $M^{-1}s^{-1}$). These results demonstrate that the decomposition of zinc-substituted cytochrome c552 by irradiation with light is three times slower than that of zinc-substituted cytochrome c, in other words, that zinc-substituted cytochrome c552 is three times more stable than zinc-substituted cytochrome c. This photodecomposition reaction is a secondary reaction between zinc-substituted cytochrome c552 or zinc-substituted cytochrome c with oxygen.

Figure 30:
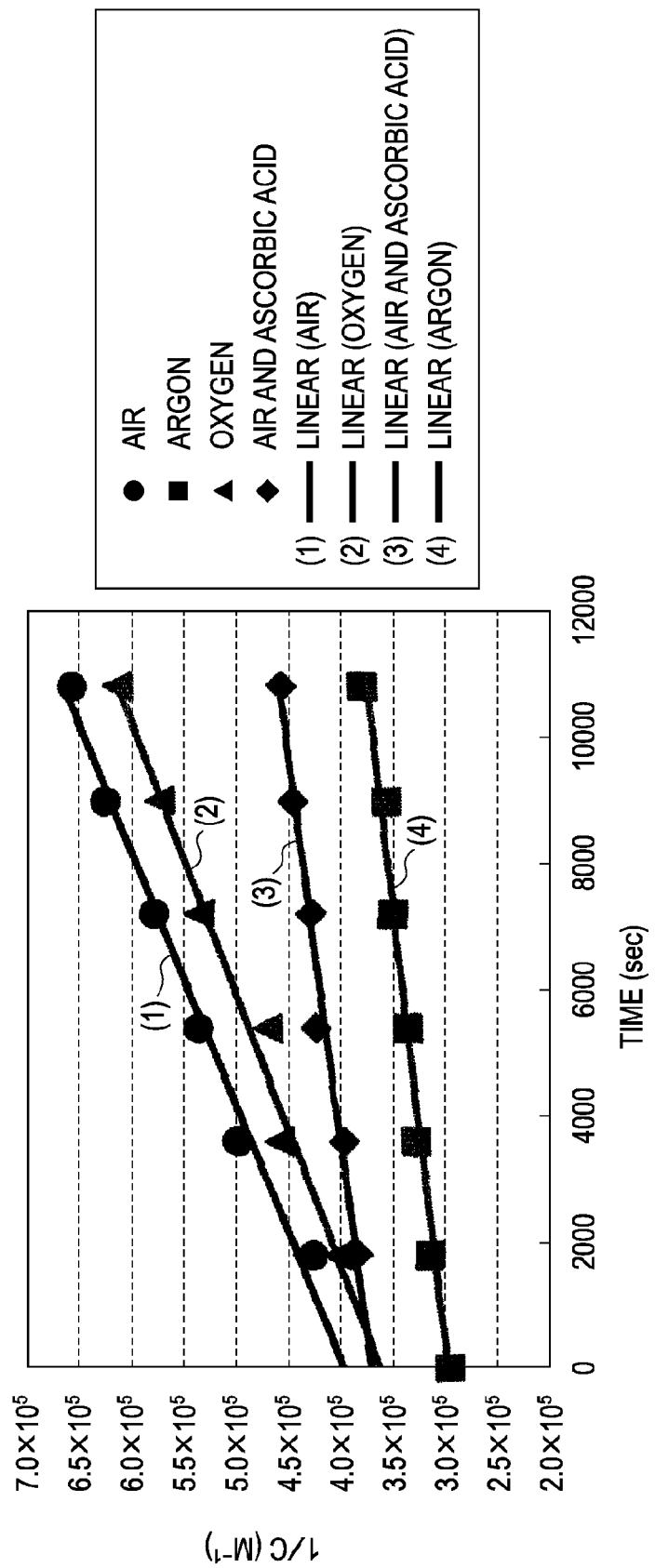
FIG. 30 is a graph illustrating the effect of suppressing the photodecomposition reaction of zinc-substituted cytochrome c552 by removing oxygen or radicals.

FIG. 30 shows the results of measurement of the photodecomposition rate of zinc-substituted cytochrome c552 under irradiation with light in air, in argon, in oxygen, and in a mixed gas of air and ascorbic acid. Specifically, the irradiation with light in argon was carried out by hermetically sealing the cuvette and aerating it with pure argon for 15 minutes to remove oxygen. The irradiation with light in oxygen was carried out by hermetically sealing the cuvette and aerating it with pure oxygen for 15 minutes. The irradiation with light in ascorbic acid in an air atmosphere was carried out by opening the cuvette and adding 10 mM of ascorbic acid (pH 7.0) as a radical-trapping agent. According to FIG. 30, the photodecomposition rate constant k for irradiation with light in an oxygen-free atmosphere was 7.1 $M^{-1}s^{-1}$, and the photodecomposition rate constant k for irradiation with light in a radical-free atmosphere was 8.1 $M^{-1}s^{-1}$, the gradients of the lines being gentler than those for irradiation with light in air and in oxygen. This means that the photodecomposition reaction of zinc-substituted cytochrome c552 can be suppressed by making the atmosphere oxygen-free (substituted by argon) or by adding ascorbic acid.

As shown above, zinc-substituted cytochrome c552 is a superior fluorescent protein for a blue-light photoelectric transducer having the same optical properties (such as photon absorption and light emission) as zinc-substituted cytochrome c and also having a higher chemical and physical stability.

c. Photocurrent of Zinc-Substituted-Cytochrome-c552-Immobilized Electrode

To confirm that zinc-substituted cytochrome c552 has a photoelectric conversion function for blue light, a zinc-substituted-cytochrome-c552-immobilized electrode having zinc-substituted cytochrome c552 immobilized on a gold electrode was produced and was subjected to photocurrent measurement.

The zinc-substituted-cytochrome-c552-immobilized electrode was produced as follows.

Prepared was a 0.1 mM ethanol solution of 1-undecanethiol ($HS(CH_2)_{10}CH_3$), serving as a hydrophobic thiol, and 1-hydroxy-11-undecanethiol ($HS(CH_2)_{10}CH_2OH$), serving as a hydrophilic thiol, mixed at a ratio of 25:75. A clean gold drop electrode was then dipped in the solution and was left standing at room temperature for one day. Thus, a self-assembled molecular monolayer was formed on the surface of the gold drop electrode.

This electrode was rinsed with ultrapure water, was dipped in a 50 μM zinc-substituted cytochrome c552 solution (containing 10 mM tris-hydrochloric acid buffer (pH 7.6) and 50 mM KCl), and was incubated at room temperature for more than 30 minutes. Thus, a zinc-substituted-cytochrome-c552-immobilized electrode was produced that had cytochrome c552 immobilized on the surface of the gold drop electrode with the self-assembled molecular monolayer therebetween.

An optical experimental system capable of uniformly irradiating the entire surface of the zinc-substituted-cytochrome-c552-immobilized electrode with monochromatic light was arranged. The zinc-substituted-cytochrome-c552-immobilized electrode, serving as a working electrode, a silver-silver chloride electrode, serving as a reference electrode, and a platinum wire, serving as a counter electrode, were connected to a potentiostat and were dipped in a 10 mM phosphoric acid buffer aqueous solution (pH 7.0) containing 0.25 mM potassium ferrocyanide. The light source used as a xenon lamp (150 W).

Figure 31:
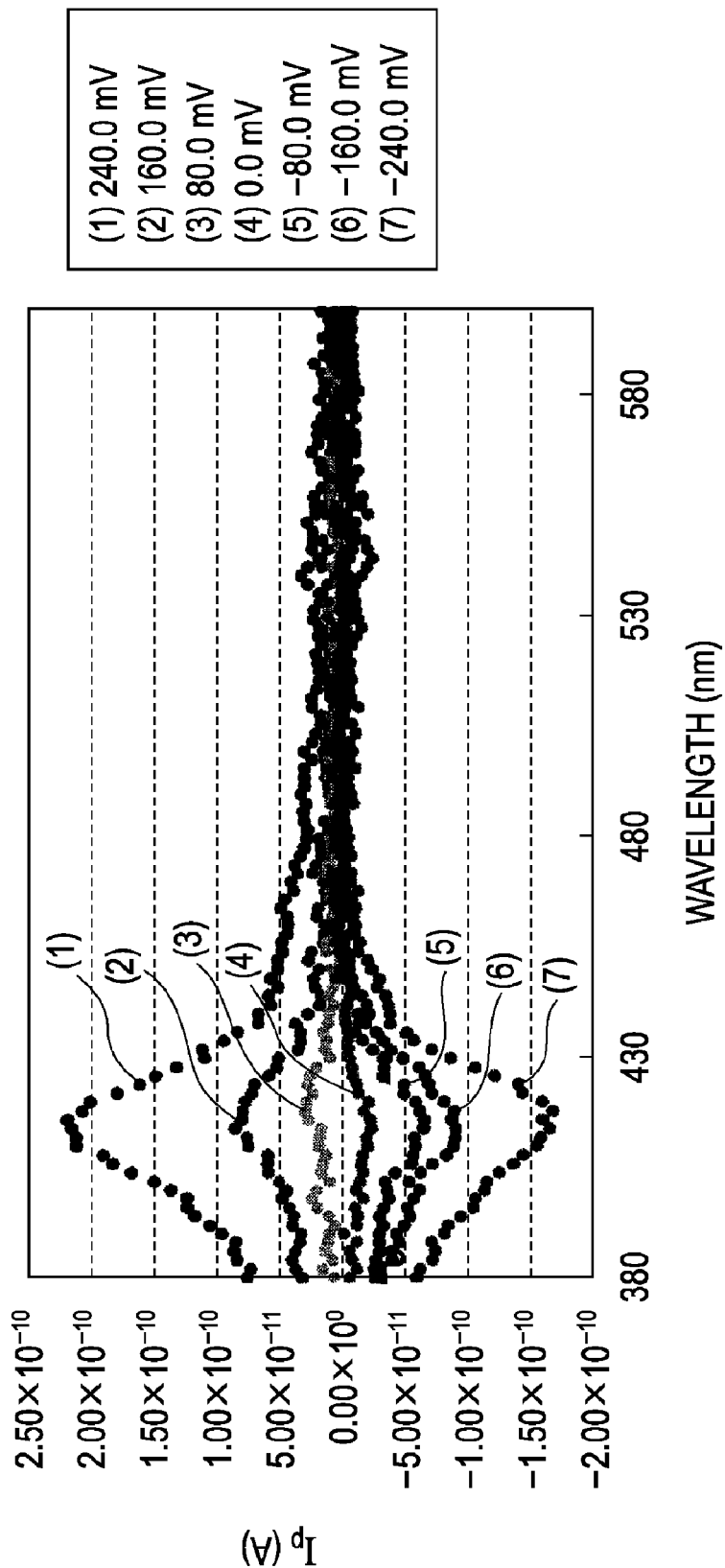
FIG. 31 is a graph showing the results of photocurrent action spectrum measurement of a zinc-sub substituted-cytochrome-c552-immobilized gold drop electrode.

With a bias voltage being applied to the silver-silver chloride electrode, serving as a reference electrode, the zinc-substituted-cytochrome-c552-immobilized electrode was irradiated with light while scanning the wavelength in steps of 1 nm to measure the resultant photocurrent. The bias voltage was set to 240.0 mV, 160.0 mV, 80.0 mV, 0.0 mV, −80.0 mV, −160.0 mV, and −240.0 mV. The resultant photocurrent action spectra are shown in FIG. 31, where the horizontal axis is wavelength, and the vertical axis is current Ip. According to FIG. 31, the largest photocurrent occurs around a wavelength of 420 nm. This means that zinc-substituted cytochrome c552 serves as a fluorescent protein for blue-light photoelectric conversion. According to FIG. 31, additionally, the polarity of the photocurrent (flow direction) can be controlled by adjusting the bias voltage applied to the zinc-substituted-cytochrome-c552-immobilized electrode. This is a noteworthy feature of the zinc-substituted-cytochrome-c552-immobilized electrode as compared to a zinc-substituted-cytochrome-c-immobilized electrode, which provides a photocurrent only in a positive direction despite the adjustment of the bias voltage.

The second embodiment provides the same advantages as the first embodiment.

3. Third Embodiment

Green-Light or Red-Light Photoelectric Transducer

Figure 32:
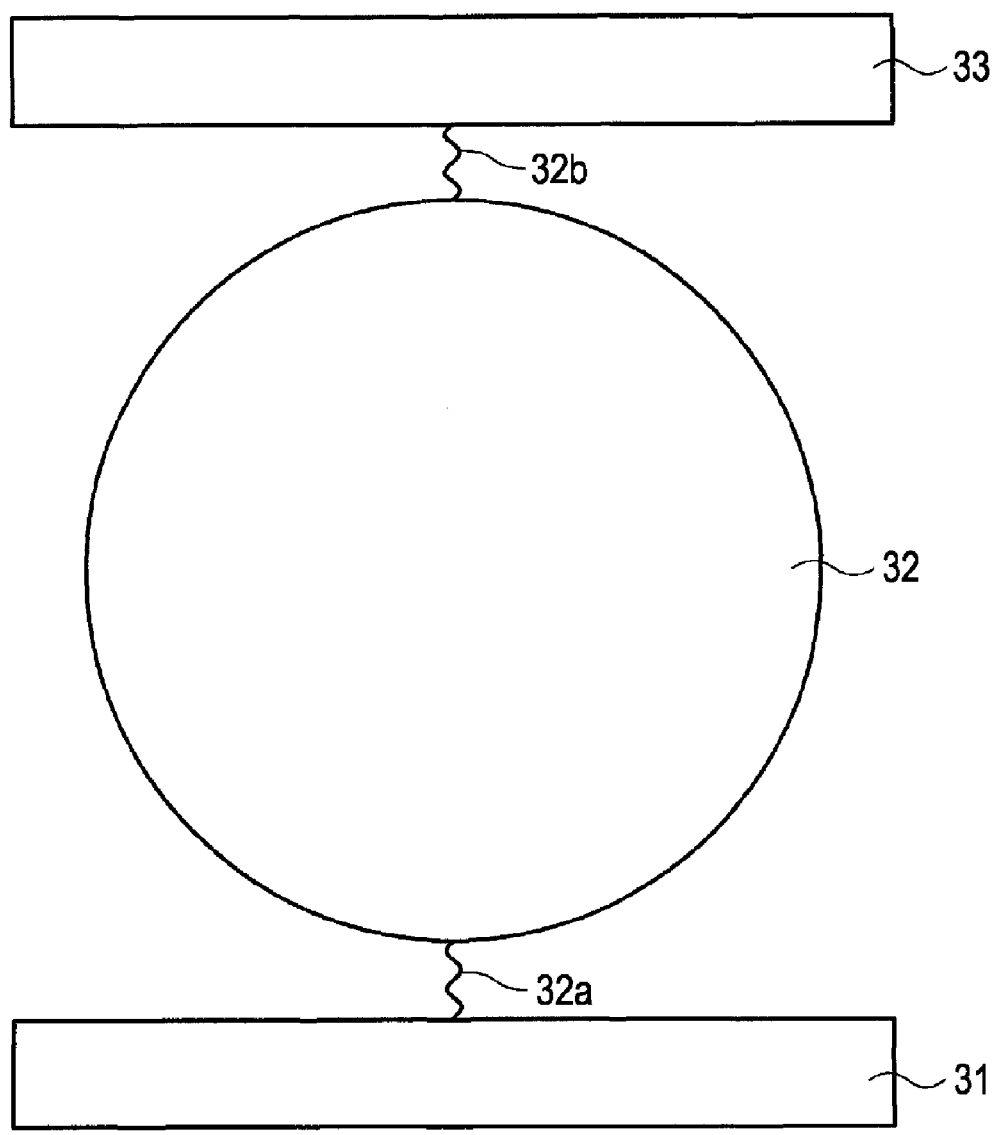
FIG. 32 is a schematic diagram showing a photoelectric transducer according to a third embodiment.

FIG. 32 shows a photoelectric transducer according to a third embodiment.

As shown in FIG. 32, this photoelectric transducer has a cytochrome c552 modified zinc-porphyrin 32 immobilized on an electrode 31. A first amino acid residue 32a of the cytochrome c552 modified zinc-porphyrin 32 is coupled to the electrode 31, optionally with a linker, for example, therebetween. In addition, a second amino acid residue 32b of the cytochrome c552 modified zinc-porphyrin 32 is coupled to a counter electrode 33. A first molecular orbital is localized in the first amino acid residue 32a of the cytochrome c552 modified zinc-porphyrin 32, whereas a second molecular orbital is localized in the second amino acid residue 32b of the cytochrome c552 modified zinc-porphyrin 32. The second molecular orbital has the maximum transition probability per unit time for the first molecular orbital. In this case, photoexcitation induces transition of electrons between the first and second molecular orbitals, thus transferring electrons or holes between the first amino acid residue 32a and the second amino acid residue 32b. The details are disclosed in Patent Document 4. The electrode 31 used may be one of those mentioned above, including a gold electrode, and may be selected as appropriate. The same applies to the counter electrode 33.

The cytochrome c552 modified zinc-porphyrin 32 is cytochrome c552 having a modified porphyrin and zinc coordinated inside the porphyrin as the central metal. The cytochrome c552 modified zinc-porphyrin 32 is a florescent protein that has high thermal stability, as does cytochrome c552, and that absorbs green or red light.

Operation of Photoelectric Transducer

Light incident on the cytochrome c552 modified zinc-porphyrin 32 of the photoelectric transducer causes photoexcitation to generate electrons that travel through the cytochrome c552 modified zinc-porphyrin 32 to the electrode 31. A photocurrent is then externally output from the electrode 31 and the counter electrode 33.

In other points, the third embodiment is similar to the first embodiment.

Figure 33:
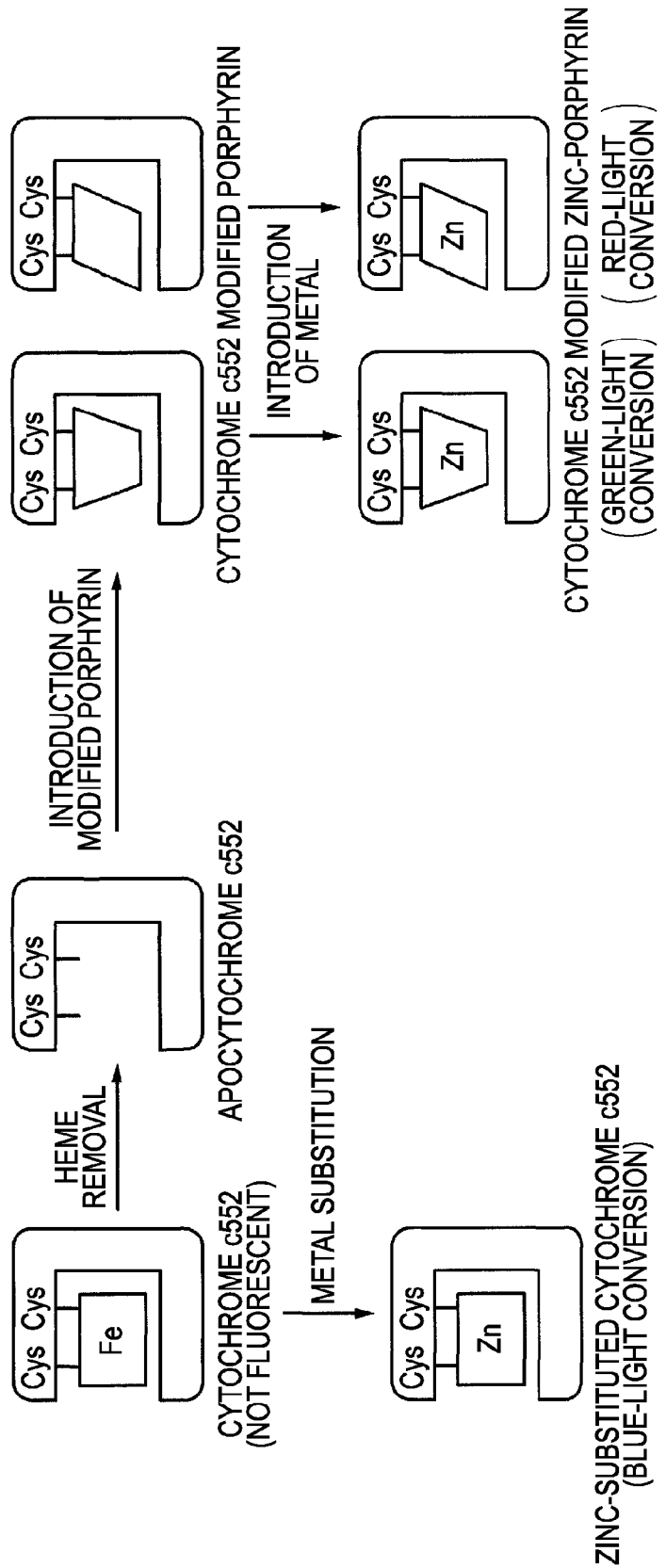
FIG. 33 is a schematic diagram showing a method for synthesizing a cytochrome c552 modified zinc-porphyrin.

The cytochrome c552 modified zinc-porphyrin 32 that can absorb green or red light can be synthesized as follows. That is, the absorption wavelength of cytochrome c552 can be changed by modifying the porphyrin. Accordingly, first, the absorption wavelength of cytochrome c552 is adjusted to the red or green wavelength range by modifying the porphyrin. After the synthetic porphyrin thus modified is reconstituted into cytochrome c552, zinc, serving as a metal for providing fluorescence properties, is introduced as the central metal of the porphyrin. The method for synthesizing the cytochrome c552 modified zinc-porphyrin 32 is summarized in FIG. 33.

The method for synthesizing the cytochrome c552 modified zinc-porphyrin 32 will now be described in detail.

Absorption Wavelength Control by Modification of Porphyrin

In general, the absorption wavelength can be greatly changed by modifying the porphyrin backbone. A method for controlling the absorption wavelength by modifying the porphyrin backbone will be described.

(1) Absorption Properties of Protoporphyrin

The absorption maximums (absorption maximum wavelengths $\lambda_{max}$) of protoporphyrin (see FIG. 34) obtained by removing the metal from the heme contained in cytochrome c552 are shown in Table 2 (see Robert K. and 2 others, Isolation and modification of natural porphyrins, in "The Porphyrins, vol. I" (Dolphin D. ed.), pp. 289-334, Academic Press, New York, 1978). A fluorescent porphyrin precursor for green-light or red-light conversion is prepared by shifting the absorption maximums, particularly the Soret band, toward the long-wavelength side.

| Absorption Properties of protoporphyrin | | | | | | | |
|---|---|---|---|---|---|---|---|
| Solvent | | Soret band | | | Q band | | |
| CHCl$_3$ | λ max (nm) | 407 | 505 | 541 | 575 | 603 | 630 |
| | ε (mM$^{-1}$cm$^{-1}$) | 171 | 14.15 | 11.6 | 7.44 | 2.03 | 5.38 |
| Pyridine | λ max (nm) | 409 | 506 | 541 | 576 | 605 | 631 |
| | ε (mM$^{-1}$cm$^{-1}$) | 163 | 14.89 | 11.87 | 7.48 | 2.0 | 5.54 |
| Pyridine hemochrome *1 | λ max (nm) | 418.5 | 526 | | 557 | | |
| | ε (mM$^{-1}$cm$^{-1}$) | 191.4 | 17.5 | | 34.4 | | |

Figure 34:
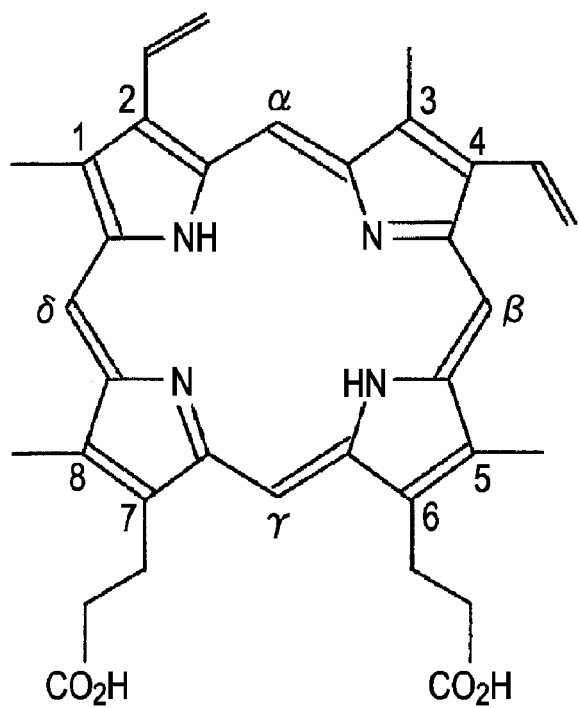
FIG. 34 is a schematic diagram showing protoporphyrin.

*1 Porphyrin having divalent iron in center thereof and pyridine coordinated thereto In FIG. 34, the vinyl groups at the 2- and 4-positions of protoporphyrin serve to form covalent bonds with cytochrome c552, whereas the propionic acid groups at the 6- and 7-positions are responsible for the electron transfer function of cytochrome c552. Hence, the methyl groups at the 1-, 3-, 5-, and 8-positions of protoporphyrin or the carbon atoms at the α-, β-, γ-, and δ-positions are modified or substituted.

In some cases, protoporphyrin is used as the starting material or is totally synthesized.

(2) Porphyrin for Green-Light Photoelectric Conversion (a) Acetylporphyrin

Figure 35:
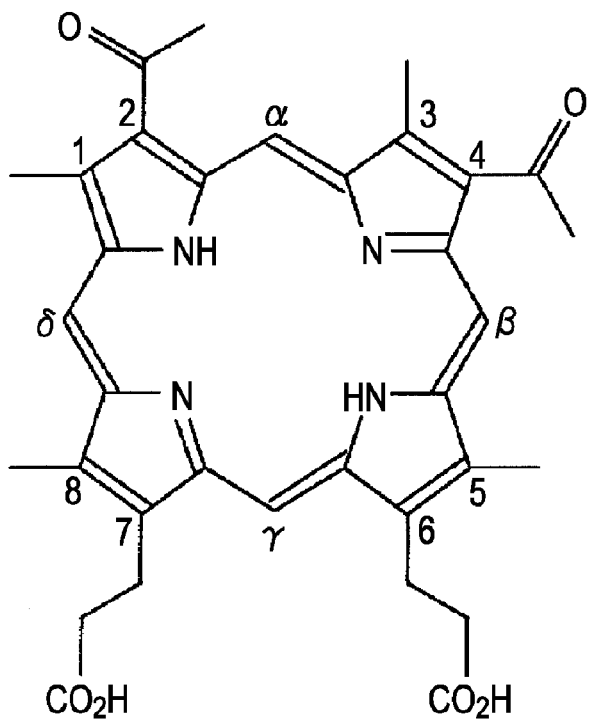
FIG. 35 is a schematic diagram showing 2,4-diacetyldeuteroporphyrin.

The absorption wavelength of protoporphyrin can be shifted toward the long-wavelength side by adding an acetyl group, which is highly electrophilic, to the 1-, 3-, 5-, or 8-position thereof. As a practical example, the absorption properties of 2,4-diacetyldeuteroporphyrin (see FIG. 35) are shown in Table 3 (see Robert K. and 2 others, Isolation and modification of natural porphyrins, in "The Porphyrins, vol. I" (Dolphin D. ed.), pp. 289-334, Academic Press, New York, 1978). According to Table 3, the Soret band is shifted from that of protoporphyrin by about 20 nm.

| Absorption properties of diacetylporphyrin | | | | | | |
|---|---|---|---|---|---|---|
| Solvent | | Soret band | | Q band | | |
| CHCl$_3$ | λ max (nm) | 424.5 | 517 | 552 | 587 | 640 |
| | ε (mM$^{-1}$cm$^{-1}$) | 144 | 13.3 | 7.3 | 6.1 | 3.3 |
| Pyridine hemochrome | λ max (nm) | 440 | 540 | | 574 | |
| | ε (mM$^{-1}$cm$^{-1}$) | 115.4 | 12.6 | | 13.8 | |

(b) Formylporphyrin

The absorption wavelength of protoporphyrin can be shifted by adding a formyl group, which is highly electrophilic, to the 1-, 3-, 5-, or 8-position thereof. As a practical example, the absorption properties of 2,4-diformyldeuteroporphyrin (see FIG. 36) are shown in Table 4 (see Robert K. and 2 others, Isolation and modification of natural porphyrins, in "The Porphyrins, vol. I" (Dolphin D. ed.), pp. 289-334, Academic Press, New York, 1978). Table 4 shows that the Soret band is shifted from that of protoporphyrin by about 30 nm.

| Absorption properties of diformylporphyrin | | | | | | |
|---|---|---|---|---|---|---|
| Solvent | | Soret band | | Q band | | |
| CHCl$_3$ | λ max (nm) | 436 | 526 | 562 | 595 | 650.5 |
| | ε (mM$^{-1}$cm$^{-1}$) | 137.5 | 12.6 | 7.7 | 6.48 | 3.48 |

-continued

| Absorption properties of diformylporphyrin | | | | |
|---|---|---|---|---|
| Solvent | | Soret band | | Q band |
| Pyridine hemochrome | λ max (nm) | 450 | 549.5 | 586.5 |
| | ε (mM$^{-1}$cm$^{-1}$) | 131 | 15.4 | 19.9 |

(c) Halogenated Porphyrin

The absorption wavelength of protoporphyrin can be shifted by adding a halogen atom to the carbon atom at a meso position (α-, β-, γ-, or δ-position) thereof. As a practical example, the absorption spectrum of mesotetrachlorooctaethylporphyrin (see FIG. 37) are shown in FIG. 38 (see Fuhrhop J. H., Irreversible reactions on the porphyrin periphery (excluding oxidations reductions, and photochemical reactions), in "The Porphyrins, vol. II" (Dolphin D ed.) pp. 131-156, Academic Press, New York, 1978). As shown in FIG. 38, an intense absorption can be achieved around a wavelength of 480 nm. A mesotetrachloroporphyrin having vinyl groups added to the 2- and 4-positions thereof and propionic acid groups added to the 6- and 7-positions thereof, as shown in FIG. 39, can combine with cytochrome c552.

(d) Bilirubin

Figure 40:
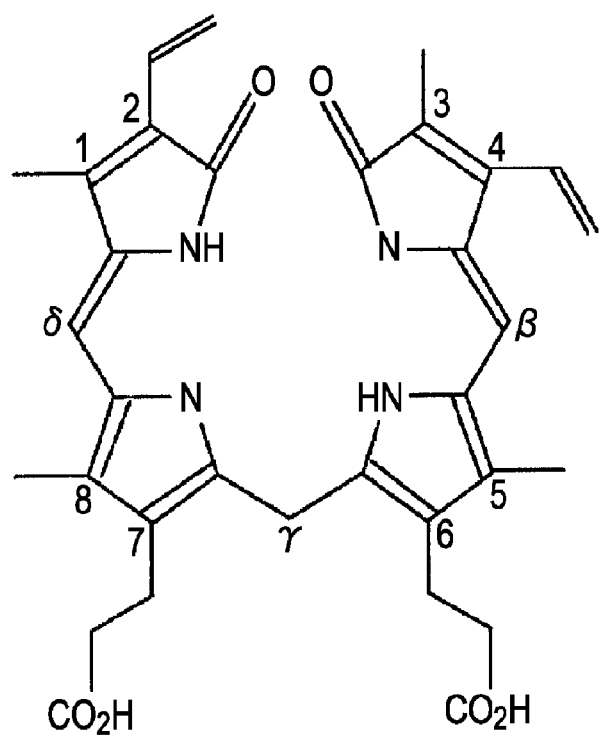
FIG. 40 is a schematic diagram showing bilirubin obtained by opening a protoporphyrin ring at the α-position thereof and adding oxygen atoms.
Figure 41:
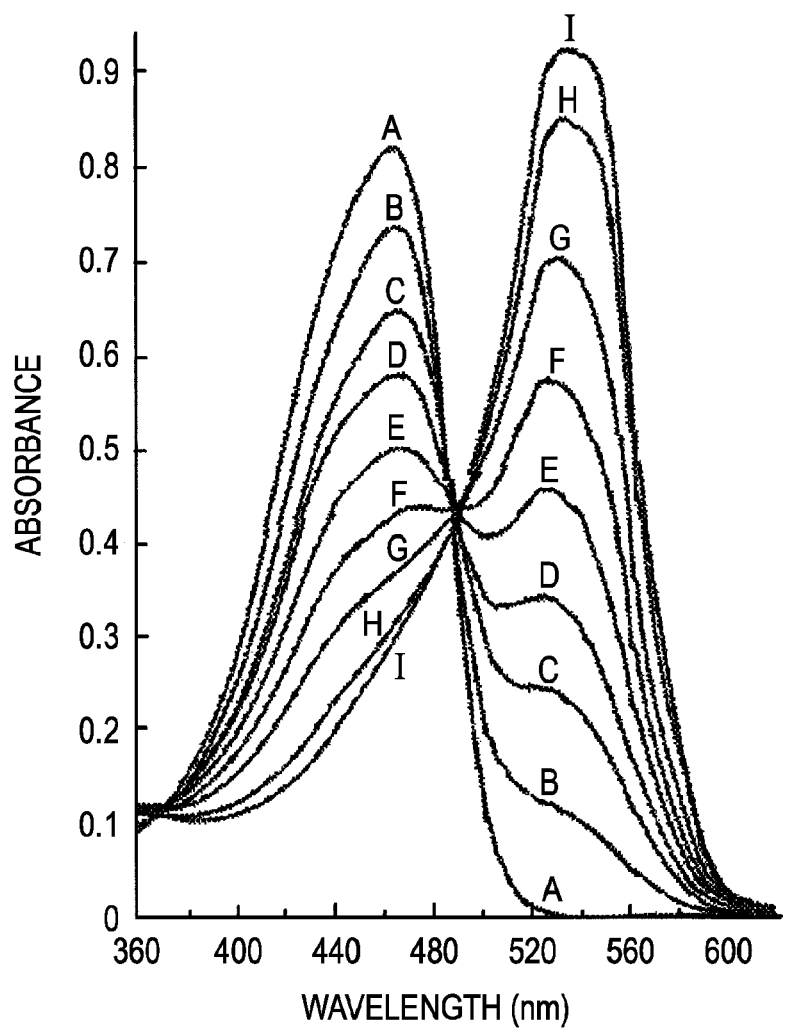
FIG. 41 is a graph showing the results of measurement of spectral changes of bilirubin in zinc titration.

Bilirubin obtained by opening the protoporphyrin ring at the α-position thereof and adding oxygen atoms is shown in FIG. 40. FIG. 41 shows spectral changes of bilirubin in zinc titration, where the curve A indicates the spectrum of bilirubin, and the curve I indicates the spectrum after the addition of two equivalents of zinc (see McDonagh A. F., Bile pigments: bilatrienes and 5,15-biladienes, in "The Porphyrins, vol. VI" (Dolphin D ed.) pp. 294-472, Academic Press, New York, 1979). As indicated by the curve A in FIG. 41, bilirubin has an intense absorption at a wavelength of 450 nm. As indicated by the curve I, additionally, the absorption maximum wavelength of bilirubin is shifted to 530 nm if zinc is coordinated thereto.

(3) Porphyrin for Red-Light Photoelectric Conversion

An example of a porphyrin for red-light photoelectric conversion is azaporphyrin (see Jackson A. H., Azaporphyrins, in "The Porphyrins, vol. I" (Dolphin D ed.), pp. 365-387, Academic Press, New York, 1978).

Figure 42:
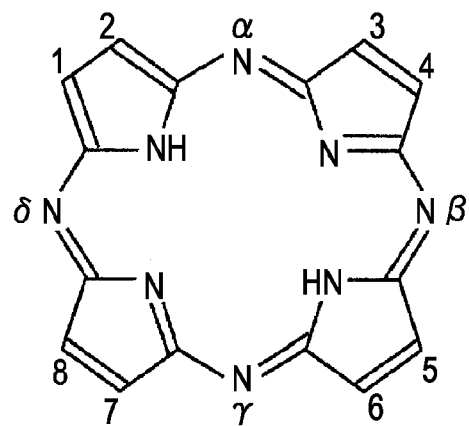
FIG. 42 is a schematic diagram showing tetraazaporphyrin.
Figure 43:
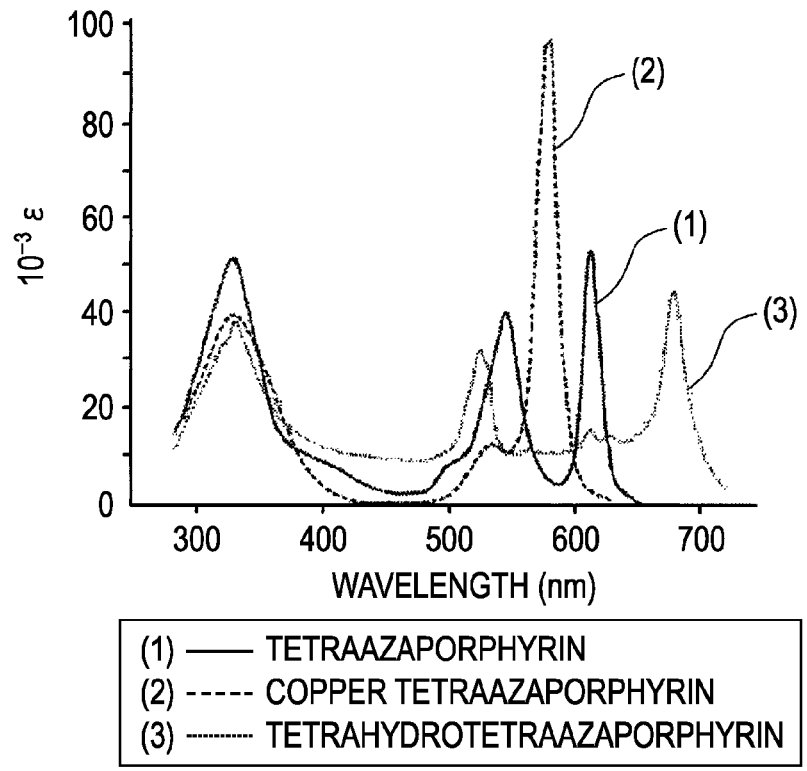
FIG. 43 is a graph showing the results of absorption spectrum measurement of tetraazaporphyrin.
Figure 44:
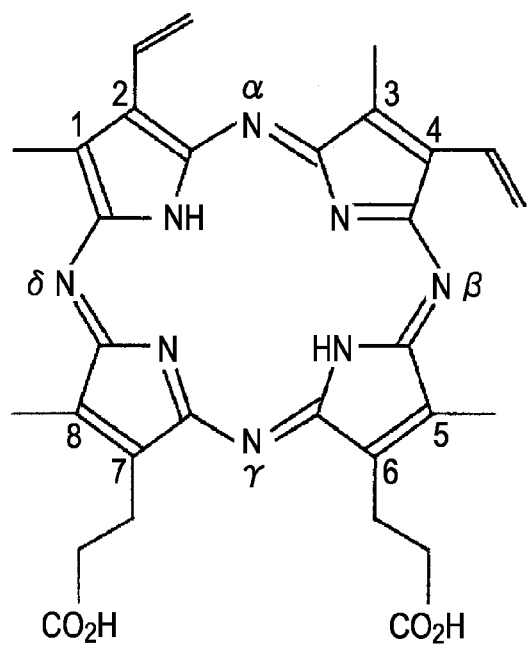
FIG. 44 is a schematic diagram showing a tetraazaporphyrin having vinyl groups at the 2- and 4-positions thereof and propionic acid groups at the 6- and 7-positions thereof.
Figure 45A:
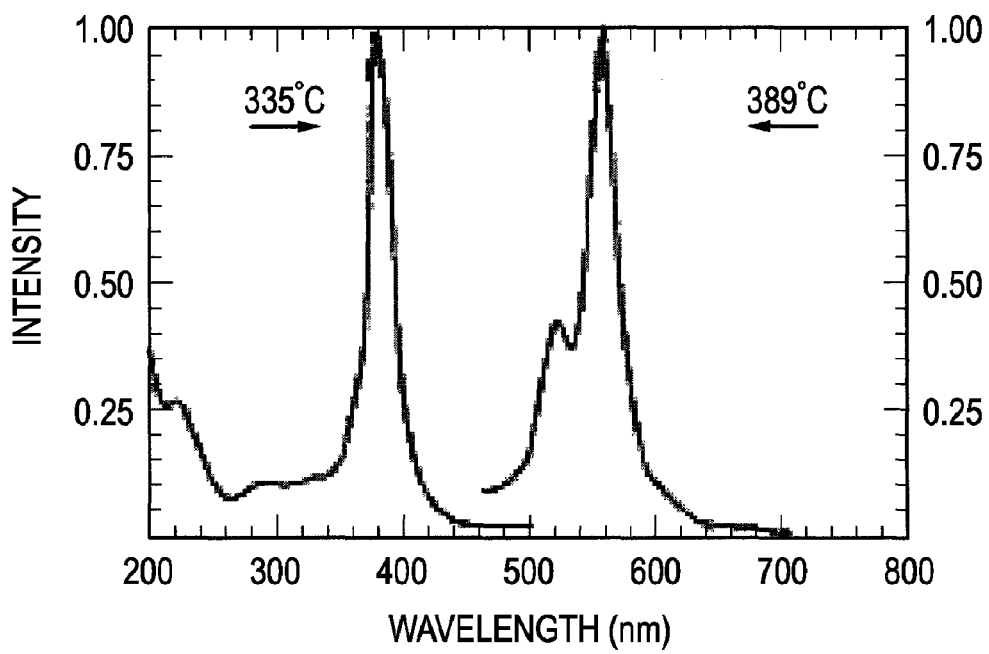
FIGS. 45A and 45B are graphs showing the absorption spectra of freebase octaethylporphyrin and vanadyl octaethylporphyrin, respectively.
Figure 45B:
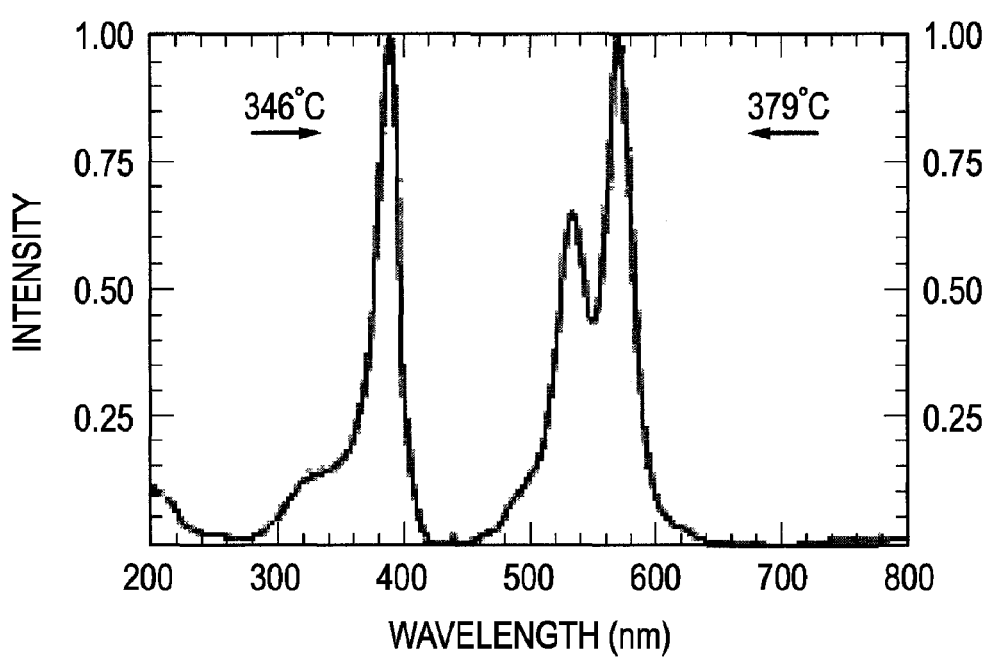
Figure 46A:
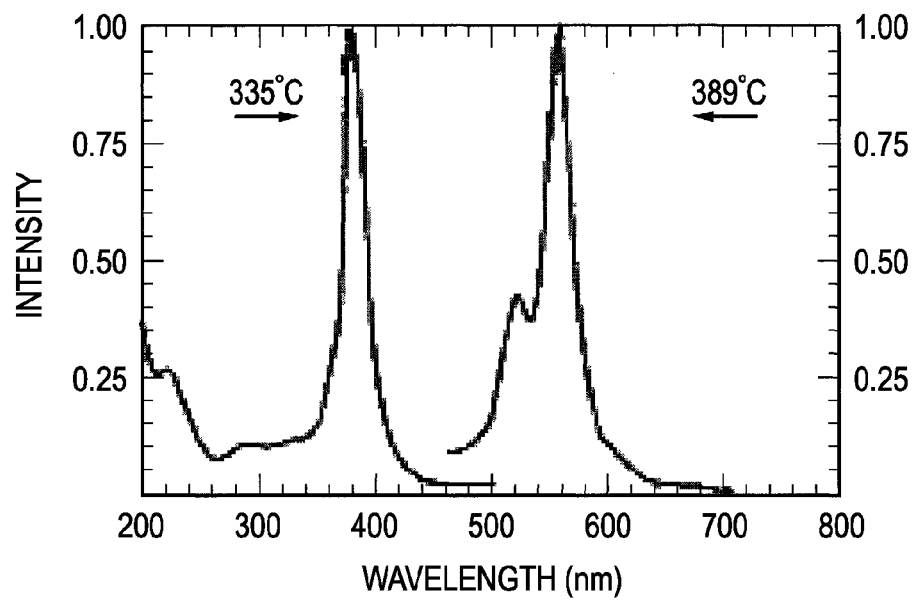
FIGS. 46A and 46B are graphs showing the absorption spectra of nickel octaethylporphyrin and zinc octaethylporphyrin, respectively.
Figure 46B:
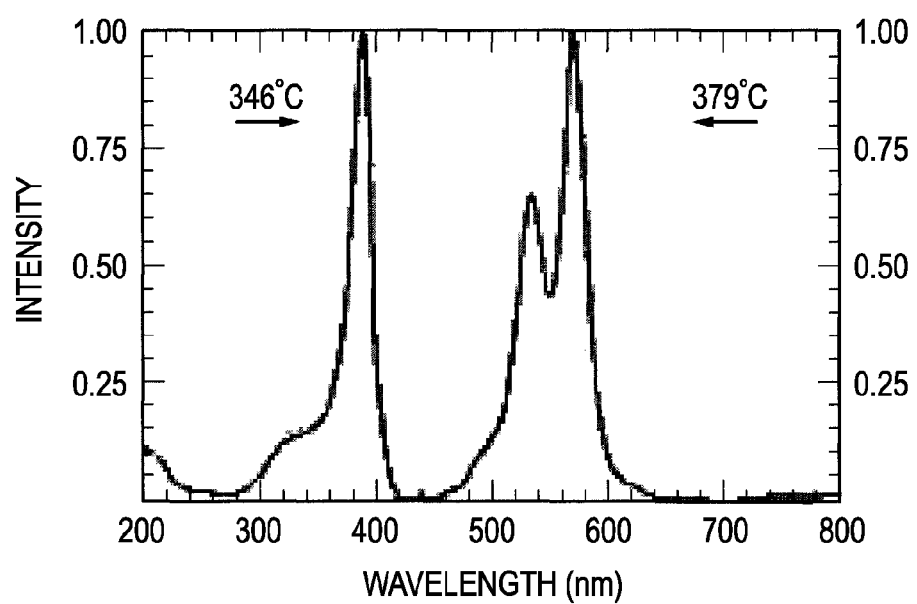
Figure 47A:
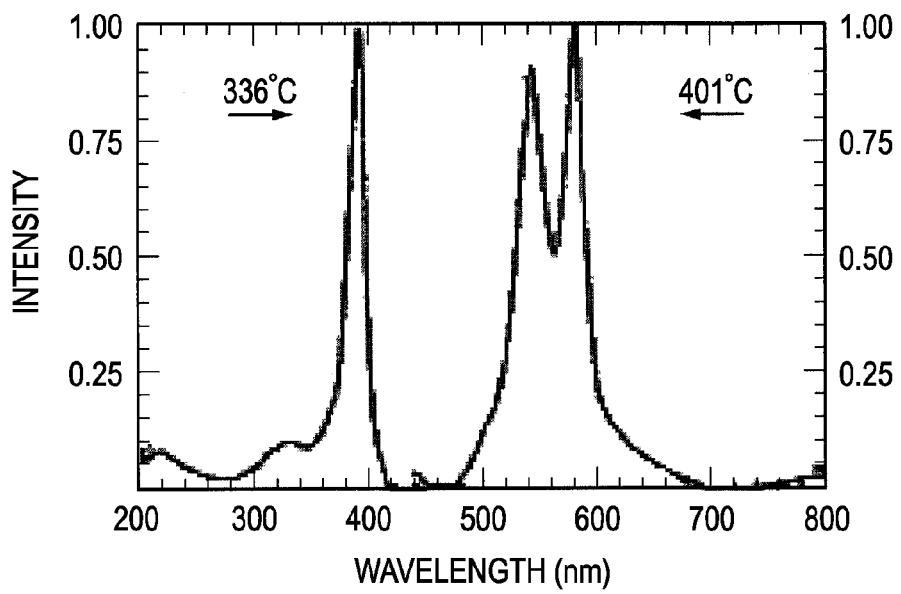
FIGS. 47A and 47B are graphs showing the absorption spectra of magnesium etioporphyrin-I and cobalt octaethylporphyrin, respectively.
Figure 47B:
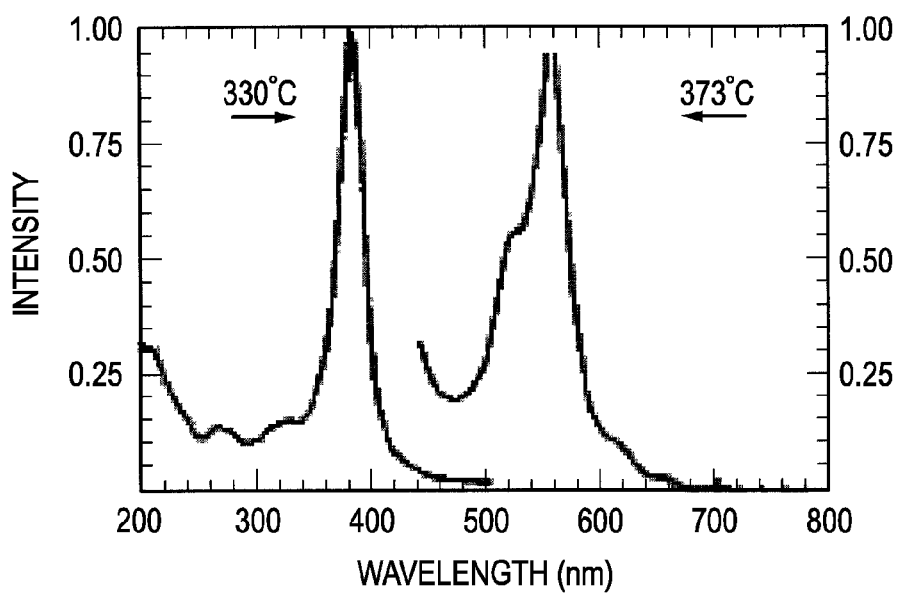
Figure 48A:
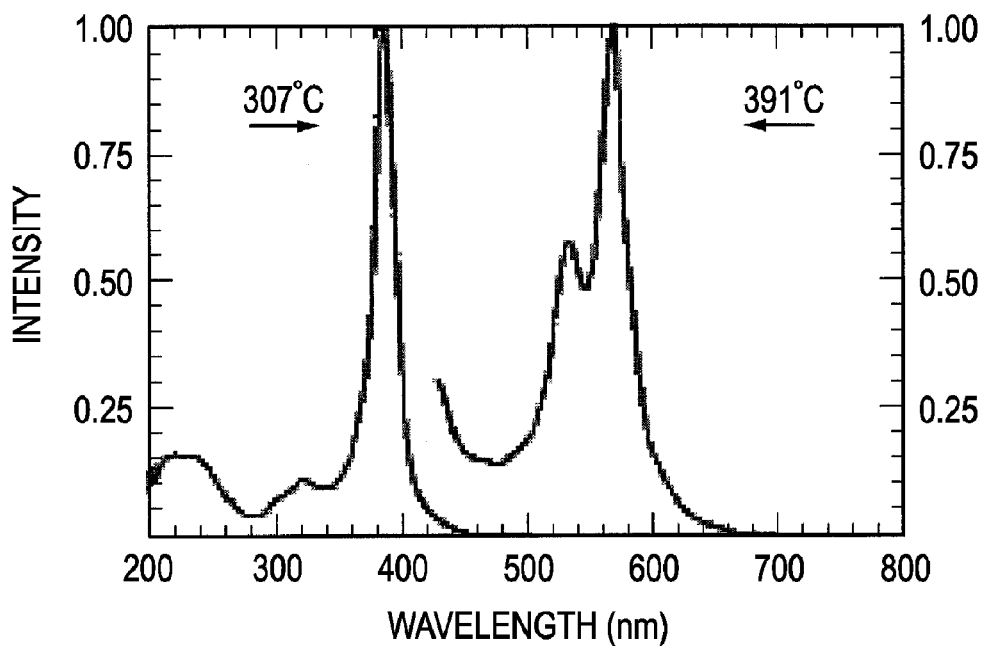
FIGS. 48A and 48B are graphs showing the absorption spectra of copper octaethylporphyrin and palladium octaethylporphyrin, respectively.
Figure 48B:
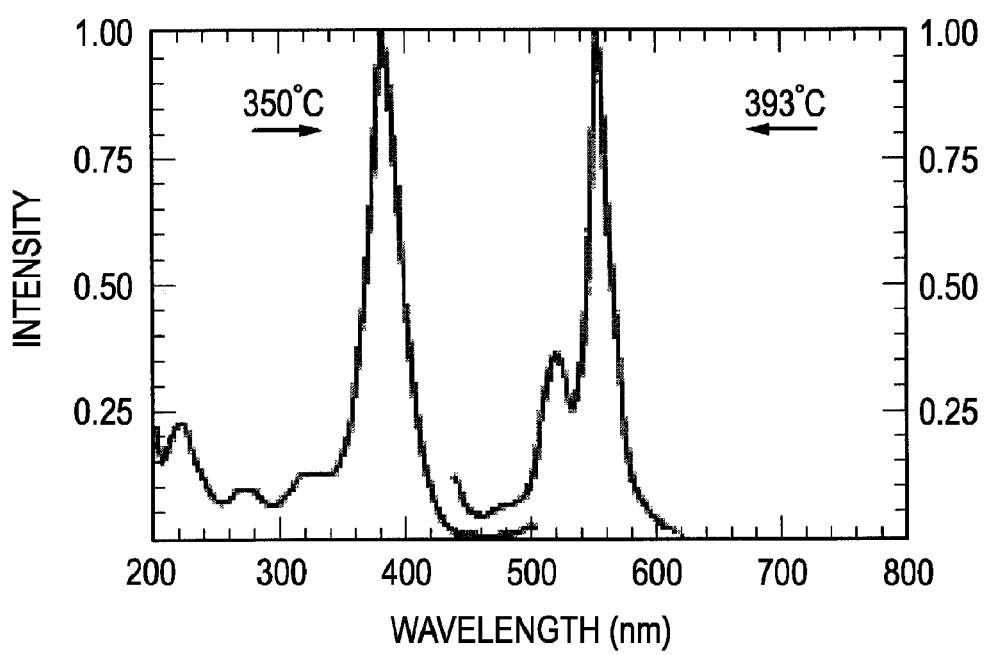

If the carbon atoms at the meso positions (α-, β-, γ-, and δ-positions) of protoporphyrin are substituted by nitrogen atoms, the Soret band around 400 nm disappears, and an intense absorption can be achieved around the Q band. As a practical example, the absorption spectrum of tetraazaporphyrin (see FIG. 42) is shown in FIG. 43 (see Gouterman M., Optical spectra and electronic structure of porphyrins and related rings, in "The Porphyrins, vol. III" (Dolphin D ed.), pp. 1-156, Academic Press, New York, 1978). As shown in FIG. 43, if a metal is coordinated to the center of tetraazaporphyrin, an intense absorption band can be achieved around a wavelength of 580 nm. A tetraazaporphyrin having vinyl groups added to the 2- and 4-positions thereof and propionic acid groups added to the 6- and 7-positions thereof, as shown in FIG. 44, can combine with cytochrome c552.

Fine Control of Absorption Wavelength of Porphyrin by Substitution of Central Metal There are other metals that provide fluorescence properties when introduced into porphyrin. Such metals are shown in Tables 5 and 6 (see Gouterman M., Optical spectra and electronic structure of porphyrins and related rings, in "The Porphyrins, vol. III" (Dolphin D ed.), pp. 11-30, Academic Press, New York, 1978).

TABLE 5

| Valence electron | | | | | |
|---|---|---|---|---|---|
| 2s | Li(I) | Be(II) | | | |
| 3s | Na(I) | Mg(II) | | | |
| 4s3d | K(I) | Cu(II) | Sc(III) | Ti(IV)O | |
| 5s4d | Rb(I) | Sr(II) | Y(III) | Zr(IV) | Nb(V) |
| 6s5d | C(I) | Ba(II) | Lu(II) | Hf(IV) | Ta(V) |
| 7s6d5f | | | | Th(IV) | |

TABLE 6

| | | | | Valence electron |
|---|---|---|---|---|
| | B(III) | CH$_3$ | | 2s |
| | Al(III) | Si(IV)Cl$_2$ | P(V) | 3s3p |
| Zn(II) | Ca(III) | Ge(IV)Cl$_2$ | As(V)(OH$_2$) | 4s4p |
| Cd(II) | In(III) | Sn(IV)Cl$_2$ | Sb(V)(OH$_2$) | 5s5p |
| Hg(II) | Tl(III) | Pb(IV)X$_2$ | Bi(V) | 6s6p |

Figure 49:
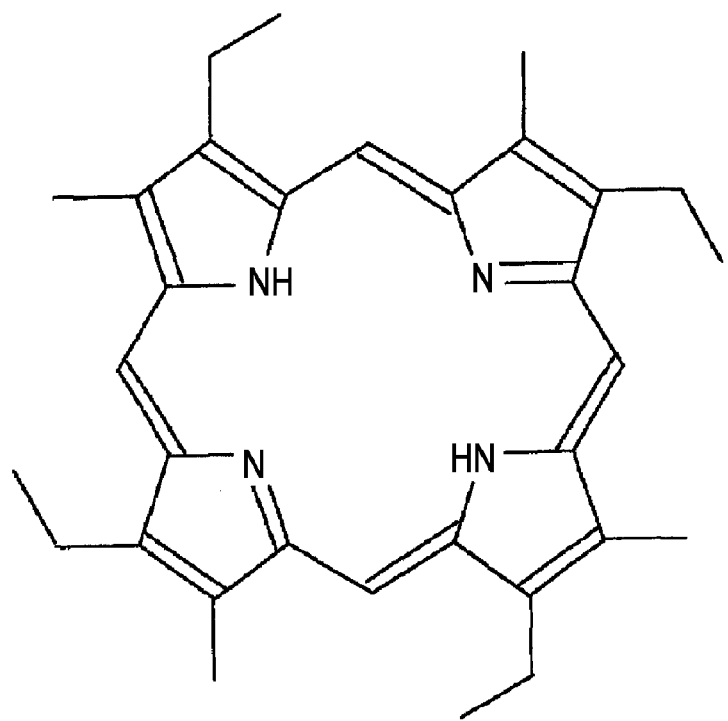
FIG. 49 is a schematic diagram showing octaethylporphyrin.
Figure 50:
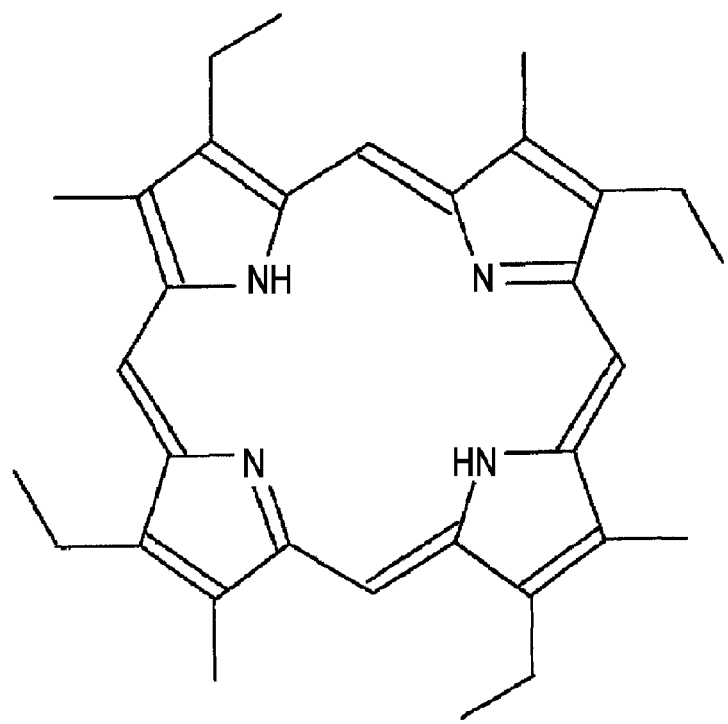
FIG. 50 is a schematic diagram showing etioporphyrin.

FIGS. 45A and 45B, 46A and 46B, 47A and 47B, and 48A and 48B show vapor-phase absorption spectra of octaethylporphyrin complexes and etioporphyrin complexes of the above metals. FIGS. 49 and 50 show the structures of octaethylporphyrin and etioporphyrin, respectively. Fluorescent porphyrins having finely adjusted absorption wavelengths, as shown in FIGS. 45A and 45B, 46A and 46B, 47A and 47B, and 48A and 48B, can be prepared by introducing the metals shown in Tables 5 and 6 into protoporphyrin and the modified porphyrins prepared as described above.

Preparation of Apocytochrome c552

To reconstitute a modified porphyrin into cytochrome c552, the heme is removed from cytochrome c552 in advance. The synthesis of cytochrome c552 having no heme (apocytochrome c552) will be described herein.

A method for preparing apocytochrome c using bovine cytochrome c has been reported (see Sano S., Reconstitution of hemoproteins, in "The Porphyrins, vol. VII" (Dolphin D. ed.), pp. 391-396, Academic Press, New York, 1979). Although thermophile cytochrome c552 differs in amino acid sequence from bovine cytochrome c, the reported method can be used for the synthesis of apocytochrome c552 because a specific amino acid sequence (-Cys-X—X-Cys-His-) for combining with the heme is conserved. This method will be described in detail below.

First, 70 to 80 mg of cytochrome c552 powder is dissolved in ultrapure water and is mixed with 2 mL of glacial acetic acid and 15 mL of 0.8% silver sulfate. The solution is incubated in the dark at 42° C. for four hours and is cooled at 0° C. The solution is then mixed with a ten-fold volume of acetone (containing 0.05 N sulfuric acid) at −20° C. to precipitate the protein. The solution is subjected to centrifugal separation to recover the precipitate. The recovered precipitate is dissolved in a small amount of 0.2 M acetic acid and is dialyzed against 0.2 M acetic acid in the dark at 2° C. to 4° C. in a nitrogen atmosphere. The apocytochrome c552, which is a trimer at this time (pH 5.0), becomes a dimer when mixed with 8% sodium cyanide solution to a pH of 8.7. The solution is then mixed with acetic acid to a pH of 3.5, thereby yielding monomeric apocytochrome c552. Sodium cyanide serves not only to resolve protein aggregates, but also to cleave bonds formed between the sulfur of cysteine and silver during the heme-removing reaction. As a result, apocytochrome c552 having free cysteine SH groups is formed. This apocytochrome c552 is stable at a pH of 3.5 for one hour.

Reconstitution of Apocytochrome c552, Modified Porphyrin, and Metal

A cytochrome c552 modified zinc-porphyrin for green-light or red-light photoelectric conversion is synthesized by combining the prepared modified porphyrin with the apocytochrome c552 prepared as above and introducing a metal shown in Tables 5 and 6 by the following method.

A method for reconstructing bovine cytochrome c, that is, a method for introducing protoporphyrinogen and iron into bovine apocytochrome c has been reported. This method is used to synthesize a cytochrome c552 modified zinc-porphyrin.

First, 1 mL of 8% sodium cyanide solution is added to the apocytochrome c552 prepared as above (the solvent is 0.2 M acetic acid). This is immediately added to a modified porphyrin solution converted into a reduced form with sodium amalgam in advance. The resultant solution is mixed with acetic acid to a pH of 3.5, is mixed with ultrapure water deoxidized in advance to a volume of 45 mL, and is stirred in the dark for 30 minutes while being aerated with nitrogen. After the stirring, the solution is mixed with formic acid to a pH of 2.9 and is automatically oxidized at 3° C. for 45 to 60 minutes under irradiation with a daylight lamp. The solution is dialyzed against 0.02 M acetic acid. Thus, a cytochrome c552 modified porphyrin is yielded.

The introduction of a fluorescent metal such as zinc and the subsequent procedures are carried out in the same manner as in Example 2. That is, a cytochrome c552 modified zinc-porphyrin is yielded by adding a powder of acetate or chloride of the metal to the above cytochrome c552 modified porphyrin solution, followed by protein refolding and purification using a column.

Thus, a cytochrome c552 modified zinc-porphyrin for green-light or red-light photoelectric conversion can be provided.

The third embodiment provides the same advantages as the first embodiment.

4. Fourth Embodiment
Color Imaging Device

A color imaging device according to a fourth embodiment includes red-light photoelectric transducers, green-light photoelectric transducers, and blue-light photoelectric transducers. At least one type of photoelectric transducer is a red-light, green-light, or blue-light photoelectric transducer according to the first embodiment. These photoelectric transducers may be formed on the same substrate, or may be formed on different substrates arranged so as to constitute a color imaging device.

Figure 51:
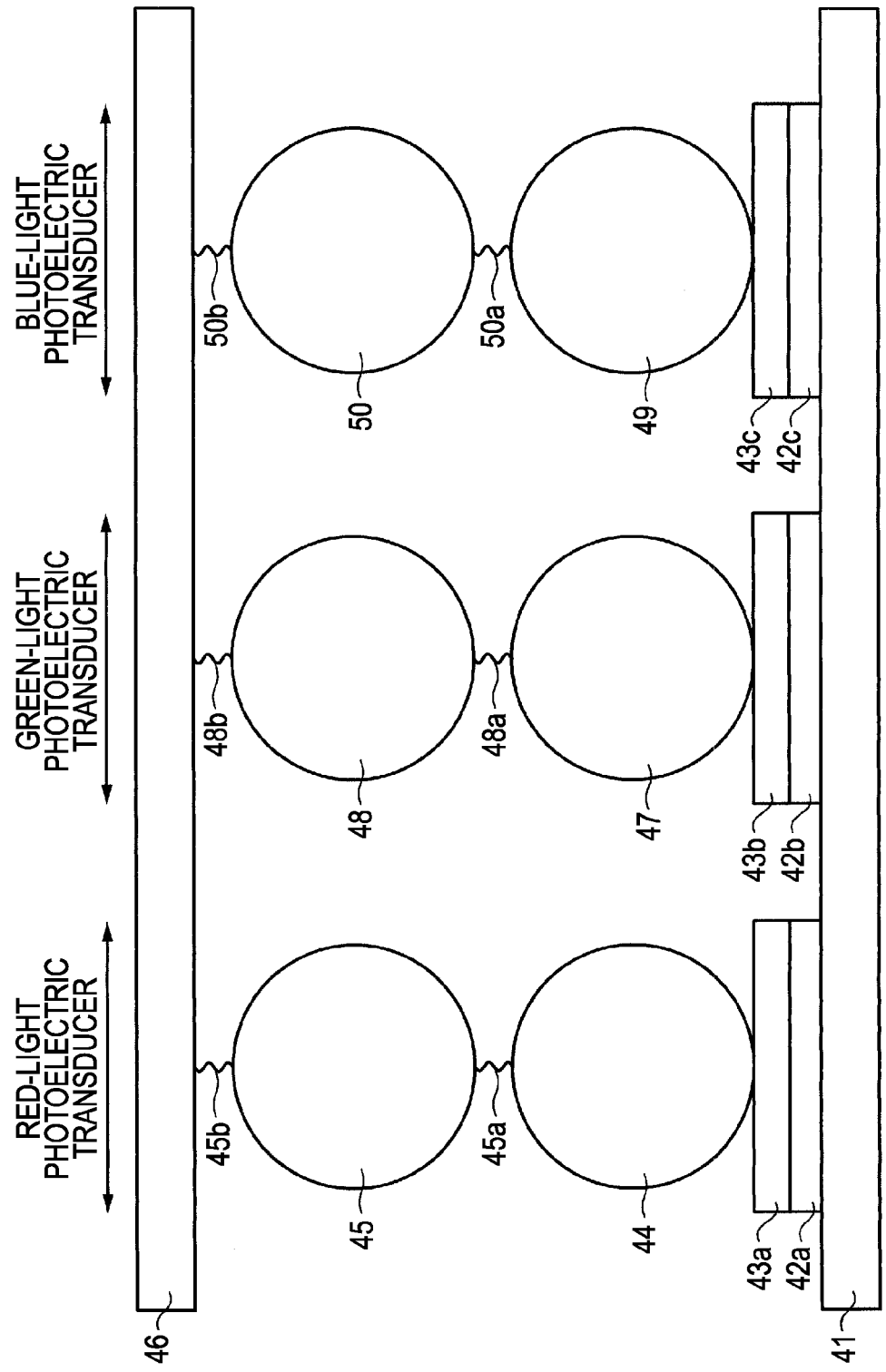
FIG. 51 is a schematic diagram showing a color imaging device according to a fourth embodiment.

FIG. 51 shows an example of the color imaging device, particularly, one pixel region thereof.

As shown in FIG. 51, this color imaging device includes gold electrodes 42a, 42b, and 42c disposed in regions where red-light, green-light, and blue-light photoelectric transducers are formed in each pixel region on a substrate 41. These gold electrodes 42a, 42b, and 42c are electrically insulated from each other. The substrate 41 may be selected as appropriate, and various substrates may be used, including a semiconductor substrate such as a silicon substrate and a transparent substrate such as a glass substrate. In particular, the use of a semiconductor substrate such as a silicon substrate as the substrate 41 allows circuits of the color imaging device, including signal-processing circuits and drive circuits, to be easily formed on the semiconductor substrate by the semiconductor technology. For example, if the substrate 41 used is a conductive substrate, the gold electrodes 42a, 42b, and 42c may be formed on an insulating film, such as a SiO2 film, formed on the surface of the substrate 41.

In the red-light photoelectric transducer section, cytochrome c552 44 is immobilized on the gold electrode 42a with a self-assembled molecular monolayer 43a therebetween and is coupled to a first amino acid residue 45a of an electron transfer protein 45 that absorbs red light. A second amino acid residue 45b of the electron transfer protein 45 is coupled to a counter electrode 46, optionally with a linker, for example, therebetween. The electron transfer protein 45 used may be, for example, a commercially available fluorescent protein (see, for example, [Retrieved on Jul. 15, 2008] Internet <URL: http://www.wako-chem.co.jp/siyaku/info/gene/article/EvrogenSeries.htm>; [Retrieved on Jul. 15, 2008] Internet <URL: http://clontech.takara-bio.co.jp/product/families/gfp/lc_table2.shtml>; and [Retrieved on Jul. 15, 2008] Internet <URL: http://clontech.takara-bio.co.jp/product/catalog/200708_12.shtml>) or a cytochrome c552 modified zinc-porphyrin. In the green-light photoelectric transducer section, cytochrome c552 47 is immobilized on the gold electrode 42b with a self-assembled molecular monolayer 43b therebetween and is coupled to a first amino acid residue 48a of an electron transfer protein 48 that absorbs green light. A second amino acid residue 48b of the electron transfer protein 48 is coupled to the counter electrode 46, optionally with a linker, for example, therebetween. The electron transfer protein 48 used may be, for example, a commercially available fluorescent protein or a cytochrome c552 modified zinc-porphyrin. In the blue-light photoelectric transducer section, cytochrome c552 49 is immobilized on the gold electrode 42c with a self-assembled molecular monolayer 43c therebetween and is coupled to a fluorescent protein 50 that absorbs blue light, such as zinc-substituted cytochrome c552, zinc-substituted cytochrome c, or a commercially available fluorescent protein.

The red-light, green-light, and blue-light photoelectric transducers are arranged on the substrate 41 in the same manner as in, for example, a typical CCD or CMOS color imaging device, and the arrangement may be determined as appropriate.

In other points, the fourth embodiment is similar to the first embodiment.

According to the fourth embodiment, a novel color imaging device, using a protein, that has high definition and high sensitivity and that can be stably used over an extended period of time can be realized.

5. Fifth Embodiment
Color Imaging Device

A color imaging device according to a fifth embodiment includes red-light photoelectric transducers, green-light photoelectric transducers, and blue-light photoelectric transducers. At least one type of photoelectric transducer is a red-light, green-light, or blue-light photoelectric transducer according to the second or third embodiment. These photoelectric transducers may be formed on the same substrate, or may be formed on different substrates arranged so as to constitute a color imaging device.

Figure 52:
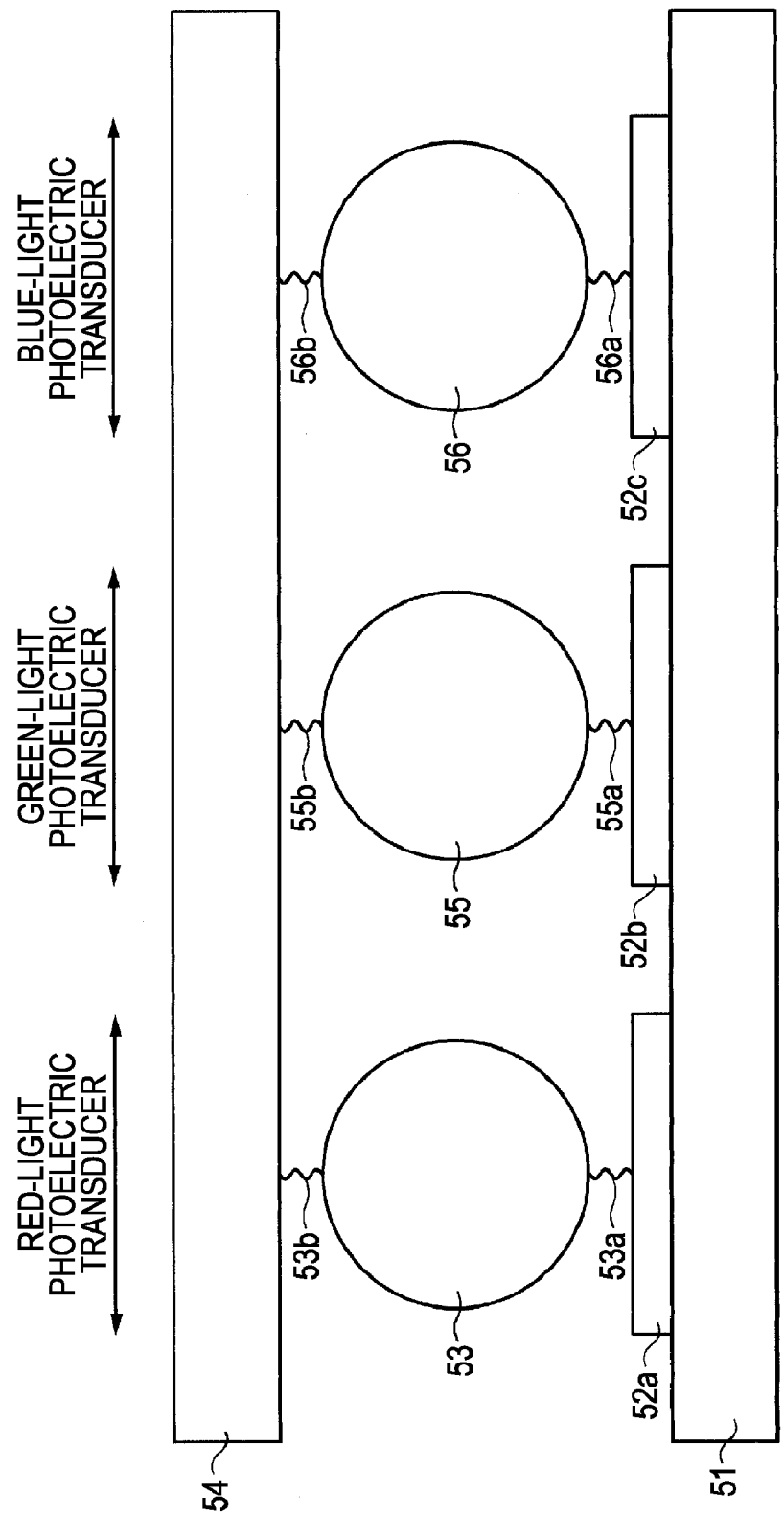
FIG. 52 is a schematic diagram showing a color imaging device according to a fifth embodiment.

FIG. 52 shows an example of the color imaging device, particularly, one pixel region thereof.

As shown in FIG. 52, this color imaging device includes electrodes 52a, 52b, and 52c disposed in regions where red-light, green-light, and blue-light photoelectric transducers are formed in each pixel region on a substrate 51. These electrodes 52a, 52b, and 52c are electrically insulated from each other. The substrate 51 may be selected as appropriate, and various substrates may be used, including a semiconductor substrate such as a silicon substrate and a transparent substrate such as a glass substrate. In particular, the use of a semiconductor substrate such as a silicon substrate as the substrate 51 allows circuits of the color imaging device, including signal-processing circuits and drive circuits, to be easily formed on the semiconductor substrate by the semiconductor technology. For example, if the substrate 51 used is a conductive substrate, the electrodes 52a, 52b, and 52c may be formed on an insulating film, such as a SiO2 film, formed on the surface of the substrate 51.

In the red-light photoelectric transducer section, as in the case of the red-light photoelectric transducer according to the third embodiment, for example, a first amino acid residue 53a of a cytochrome c552 modified zinc-porphyrin 53 that absorbs red light is coupled to the electrode 52a, optionally with a linker, for example, therebetween. A second amino acid residue 53b of the cytochrome c552 modified zinc-porphyrin 53 is coupled to a counter electrode 54, optionally with a linker, for example, therebetween. In the green-light photoelectric transducer section, as in the case of the green-light photoelectric transducer according to the third embodiment, for example, a first amino acid residue 55a of a cytochrome c552 modified zinc-porphyrin 55 that absorbs green light is coupled to the electrode 52b, optionally with a linker, for example, therebetween. A second amino acid residue 55b of the cytochrome c552 modified zinc-porphyrin 55 is coupled to the counter electrode 54, optionally with a linker, for example, therebetween. In the blue-light photoelectric transducer section, as in the case of the blue-light photoelectric transducer according to the second embodiment, a first amino acid residue 56a of zinc-substituted cytochrome c552 56 that absorbs blue light is coupled to the electrode 52c, optionally with a linker, for example, therebetween. A second amino acid residue 56b of the zinc-substituted cytochrome c552 56 is coupled to the counter electrode 54, optionally with a linker, for example, therebetween.

The red-light, green-light, and blue-light photoelectric transducers are arranged on the substrate 51 in the same manner as in, for example, a typical CCD or CMOS color imaging device, and the arrangement may be determined as appropriate.

In other points, the fifth embodiment is similar to the first embodiment.

According to the fifth embodiment, a novel color imaging device, using a protein, that has high definition and high sensitivity and that can be stably used over an extended period of time can be realized.

6. Sixth Embodiment

Photosensor

A photosensor according to a sixth embodiment includes photoelectric transducers using an electron transfer protein having the absorption wavelength corresponding to the wavelength of the light to be detected. In particular, if the photosensor is a color photosensor, it includes red-light photoelectric transducers, green-light photoelectric transducer, and blue-light photoelectric transducers. If the photoelectric transducers are to detect red light, green light, and blue light, the red-light, green-light, and blue-light photoelectric transducers according to the first to third embodiments can be used. Alternatively, if the photoelectric transducers are to detect light with wavelengths other than those of red light, green light, and blue light, photoelectric transducers using cytochrome c552 modified zinc-porphyrin whose absorption wavelengths are adjusted to those wavelengths can be used. These photoelectric transducers may be formed on the same substrate, or may be formed on different substrates arranged so as to constitute a photosensor. The arrangement of the photoelectric transducers on a substrate may be determined as appropriate. For a color photosensor, the photoelectric transducers can be arranged in the same manner as in, for example, a typical CCD or CMOS color imaging device.

In other points, the sixth embodiment is similar to the first embodiment.

According to the sixth embodiment, a novel photosensor, using a protein, that has high definition and high sensitivity and that can be stably used over an extended period of time can be realized.

7. Seventh Embodiment

Photosensor

Figure 53:
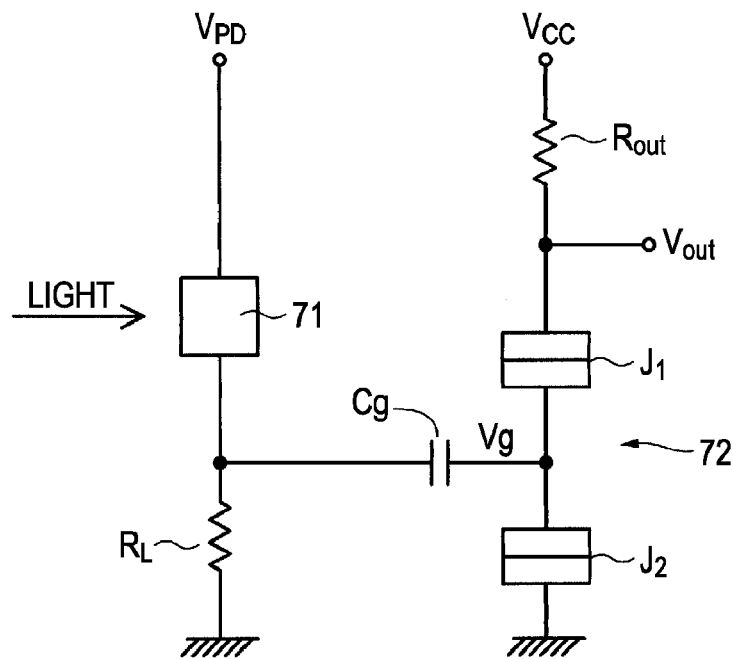
FIG. 53 is a circuit diagram showing a photosensor according to a seventh embodiment.

FIG. 53 is a circuit diagram showing a photosensor according to a seventh embodiment.

As shown in FIG. 53, this photosensor includes a photodiode 71 composed of the photoelectric transducer according to one of the first to third embodiments and a single-electron transistor 72 for amplifying the output of the photodiode 71. The single-electron transistor 72 includes a small tunnel junction $J_1$ on the drain side and a small tunnel junction $J_2$ on the source side. The capacitances of the small tunnel junctions J1 and J2 are referred to as $C_1$ and $C_2$, respectively. For example, one electrode of the photodiode 71 is grounded via a load resistor $R_L$ whereas the other electrode is connected to a positive power supply for supplying a positive voltage $V_{PD}$ for biasing the photodiode 72. On the other hand, the source of the single-electron transistor 72 is grounded whereas the drain is connected to a positive power supply for supplying a positive voltage $V_{cc}$ via an output resistor $R_{out}$. The electrode of the photodiode 71 on the load resistor $R_L$ side and the gate of the single-electron transistor 72 are connected to each other via a capacitor $C_g$.

In the photosensor configured as above, when the photodiode 71 is irradiated with light so that a photocurrent flows, a voltage occurring across the ends of the load resistor $R_L$ charges the capacitor $C_g$, and a gate voltage $V_g$ is applied to the gate of the single-electron transistor 72 via the capacitor $C_g$. A change in gate voltage $V_g$, namely, $\Delta V_g$, is measured by measuring a change in the amount of charge accumulated in the capacitor $C_g$, namely, $\Delta Q = C_g \Delta V_g$. The single-electron transistor 72 used for amplifying the output of the photodiode 71 can measure the change in the amount of charge accumulated in the capacitor $C_g$, namely, $\Delta Q = C_g \Delta V_g$, with sensitivity that is, for example, about a million times that of a common transistor. That is, the single-electron transistor 72 can measure a slight change $\Delta V_g$ in gate voltage $V_g$ so that the resistance of the load resistor $R_L$ may be correspondingly lower. This allows the photosensor to have a significantly higher sensitivity and speed. In addition, thermal noise is suppressed on the single-electron transistor 72 side by a charging effect so that noise occurring on the amplifier circuit side can be suppressed. In addition, the single-electron transistor 72 has significantly low power consumption because it uses a single-electron tunneling effect for its basic operation.

In this photosensor, as described above, the photodiode 71 and the single-electron transistor 72 are capacitively coupled. Because the voltage gain is given by Cg/C1, an output voltage Vout high enough to drive a device connected next to the photosensor can be easily provided if the capacitance C1 of the small tunnel junction J1 is sufficiently low.

Next, a specific example of the structure of the photosensor will be described.

In this example, the single-electron transistor 72 includes metal-insulator junctions, and the photodiode 71 is composed of the photoelectric transducer according to one of the first to third embodiments.

Figure 54:
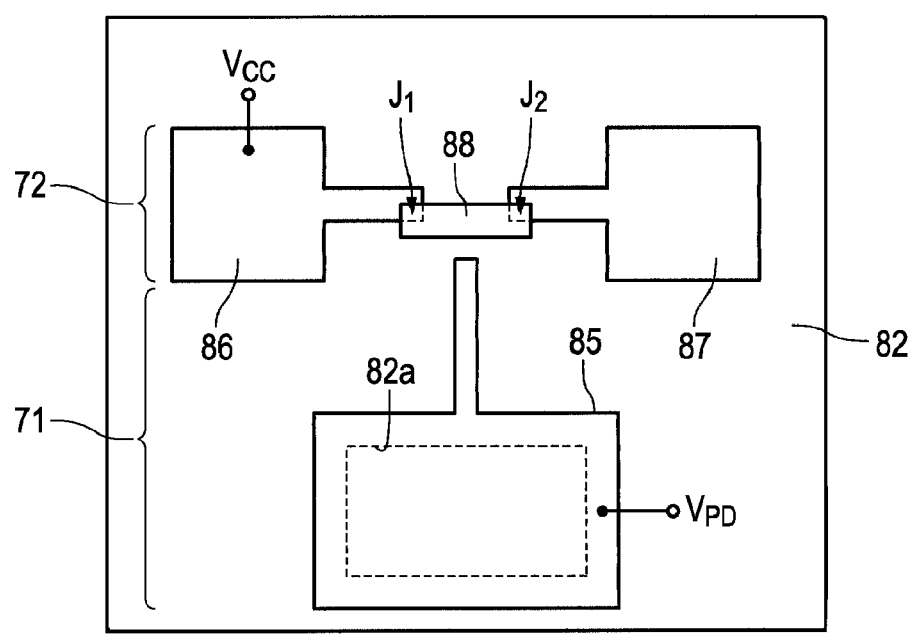
FIG. 54 is a plan view showing an example of the structure of the photosensor according to the seventh embodiment.
Figure 55:
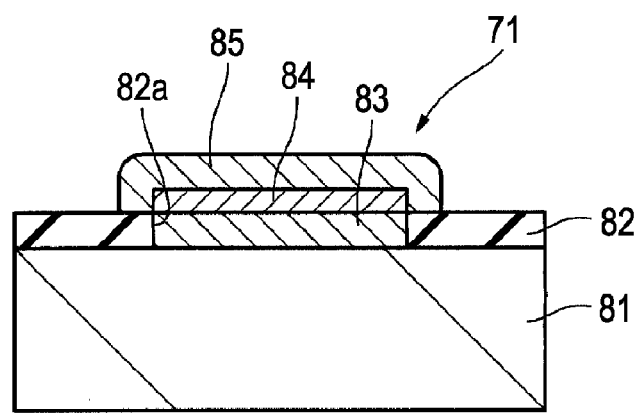
FIG. 55 is a sectional view showing an example of the structure of the photosensor according to the seventh embodiment.

FIG. 54 is a plan view of the photosensor. FIG. 55 is a sectional view of the photodiode 71 in the photosensor, and FIG. 56 is a sectional view of the single-electron transistor 72 in the photosensor.

Figure 56:
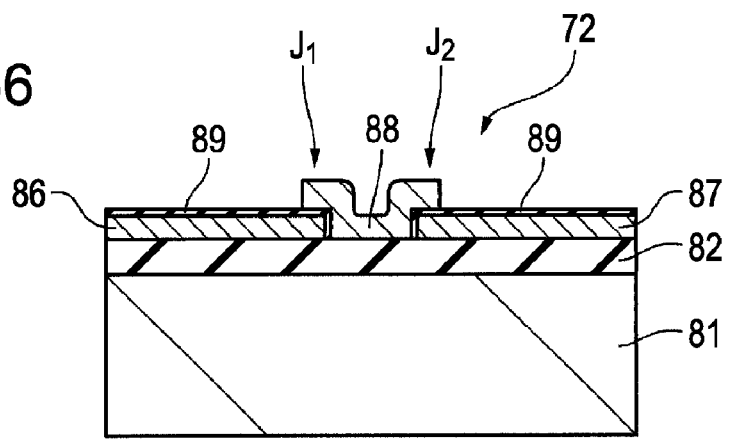
FIG. 56 is a sectional view showing the example of the structure of the photosensor according to the seventh embodiment.

As shown in FIGS. 54, 55, and 56, this photosensor has an insulating film 82 such as an SiO2 film, an SiN film, or a polyimide film on a substrate 81 such as a semiconductor substrate. In the photodiode 71 section, an opening 82a is provided in the insulating film 82. An electrode 83 is disposed on the substrate 81 in the opening 82a. An electron transfer protein 84 having the absorption wavelength corresponding to the wavelength of the light to be detected is immobilized on the electrode 83 directly or cytochrome c552 therebetween, as in the first to third embodiments, and a counter electrode 85 is disposed thereon. In this case, the counter electrode 85 is transparent to the light used for photoexcitation of the electron transfer protein 84 so that the light can be received through the counter electrode 85. The electron transfer protein 84 used may be, for example, an electron transfer protein similar to those used in the photoelectric transducers according to the first to third embodiments.

In the single-electron transistor 72 section, a source electrode 86 and a drain electrode 87 are disposed opposite each other on the insulating film 82. A gate electrode 88 is formed so as to overlap ends of the source electrode 86 and the drain electrode 87. Insulating films 89 having a thickness of, for example, several tenths of a nanometer to several nanometers are formed on the surfaces of the source electrode 86 and the drain electrode 87 at least in the regions overlapped by the gate electrode 88. Thus, the gate electrode 88 overlaps the ends of the source electrode 86 and the drain electrode 87 with the insulating films 89 therebetween. The overlapping regions typically have a size of several hundreds of nanometers by several hundreds of nanometers, or less. In this case, the regions where the gate electrode 88 overlap the source electrode 86 and the drain electrode 87 with the insulating films 89 therebetween correspond to the small tunnel junction J1 and J2, respectively, in FIGS. 54 and 56. The gate electrode 88, the source electrode 86, and the drain electrode 87 are formed of a metal such as aluminum, indium, niobium, gold, or platinum.

A passivation film (not shown) is optionally provided on the entire surface so as to cover the photodiode 71 and the single-electron transistor 72.

In this case, an end of the counter electrode 85 of the photodiode 71 is adjacent to the gate electrode 88 of the single-electron transistor 72. If no passivation film is provided, a capacitor is formed between the end of the counter electrode 85 and the gate electrode 88 with an air layer therebetween, thereby capacitively coupling the counter electrode 85 and the gate electrode 88. If a passivation film is provided, a capacitor is formed between the end of the counter electrode 85 and the gate electrode 88 with the passivation film therebetween, thereby capacitively coupling the counter electrode 85 and the gate electrode 88.

Thus, according to the seventh embodiment, a novel photosensor, using a protein, that can be stably used over an extended period of time can be realized. In addition, this photosensor is configured to amplify the output of the photodiode 71 by the single-electron transistor 72. This allows the photosensor to have a significantly higher speed and sensitivity and lower power consumption than a typical photosensor that amplifies the output of the photodiode by a common transistor.

8. Eighth Embodiment
Color CCD Imaging Device

Next, a color CCD imaging device according to an eighth embodiment will be described. This color CCD imaging device is an interline-transfer CCD including light-sensitive elements, vertical registers, and a horizontal register.

Figure 57:
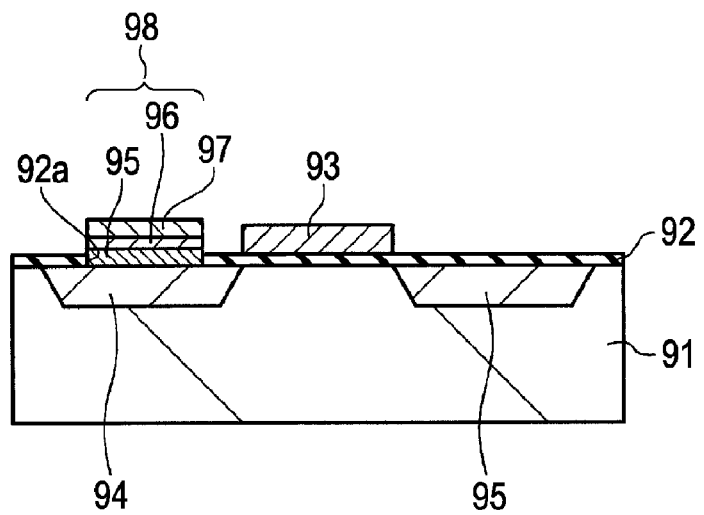
FIG. 57 is a sectional view showing a color CCD imaging device according to an eighth embodiment.

FIG. 57 shows the sectional structure of a light-sensitive element of the color CCD imaging device and a neighboring vertical register. As shown in FIG. 57, a gate-insulating film 92 is formed on a p-type silicon substrate 91 (or on a p-well layer formed in an n-type silicon substrate), and a read-out gate electrode 93 is formed on the gate-insulating film 92. An n-type layer 94 and an n-type layer 95 constituting the vertical register are formed in the p-type silicon substrate 91 on both sides of the read-out gate electrode 93. An opening 92a is formed in the gate-insulating film 92 above the n-type layer 94. A gold electrode 95 is disposed on the n-type layer 94 in the opening 92a. An electron transfer protein 96 similar to those used in the photoelectric transducers according to the first to third embodiments is immobilized on the gold electrode 95, and a counter electrode 97 is disposed thereon. This photoelectric transducer constitutes a light-sensitive element 98. In this case, the counter electrode 97 is transparent to the light used for photoexcitation of the electron transfer protein 96 so that the light can be received through the counter electrode 97. The other structure of the color CCD imaging device (including the arrangement of red, green, and blue light-sensitive elements 98) is similar to that of a typical interline-transfer color CCD imaging device.

In the color CCD imaging device, the gold electrode 95 of the photoelectric transducer constituting the light-sensitive element 98 is positively biased relative to the counter electrode 97. Light incident on the electron transfer protein 96 in the light-sensitive element 98 causes photoexcitation to generate electrons that flow into the n-type layer 94. Then, with a voltage higher than that of the n-type layer 94 being applied to the n-type layer 95 constituting the vertical register, a positive voltage is applied to the read-out gate electrode 93 to form an n-type channel in the p-type silicon substrate 91 under the read-out gate electrode 93 so that the electrons are read out from the n-type layer 94 into the n-type layer 95 through the n-type channel. The charges thus read out are transferred through the vertical register and then through the horizontal register and are output from an output terminal as electrical signals corresponding to a captured image.

According to the eighth embodiment, a novel color CCD imaging device, using the electron transfer protein 96 for the light-sensitive element 98, that has high definition and high sensitivity and that can be stably used over an extended period of time can be realized.

9. Ninth Embodiment
Inverter Circuit

Next, an inverter circuit according to a ninth embodiment will be described.

Figure 58:
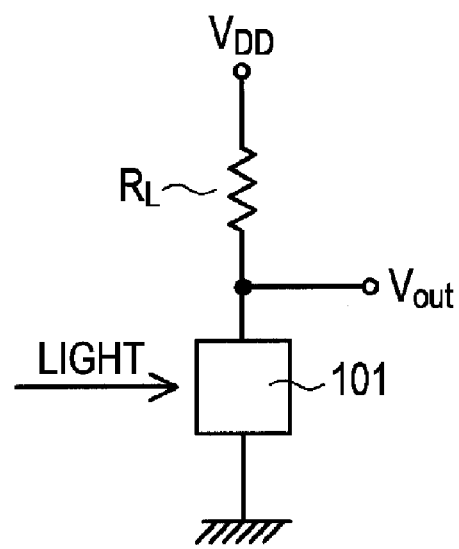
FIG. 58 is a circuit diagram showing an inverter circuit according to a ninth embodiment.

FIG. 58 shows the inverter circuit. As shown in FIG. 58, this inverter circuit includes a photoelectric transducer 101 configured in the same manner as in one of the first to fourth embodiments and a load resistor $R_L$ connected thereto in series. The load resistor $R_L$ is connected to a counter electrode (not shown) of the photoelectric transducer 101. A predetermined positive supply voltage $V_{DD}$ is applied to an end of the load resistor $R_L$, and an electrode of the photoelectric transducer 101 is grounded. When an electron transfer protein (not shown) in the photoelectric transducer 101 is irradiated with light having the absorption wavelength of the electron transfer protein as signal light, the photoelectric transducer 101 is switched on so that a photocurrent flows, thus setting the voltage $V_{out}$ output from an electrode (not shown) to a low level. When the irradiation is terminated, the photoelectric transducer 101 is switched off so that no photocurrent flows, thus setting the voltage $V_{out}$ output from the electrode to a high level.

Figure 59:
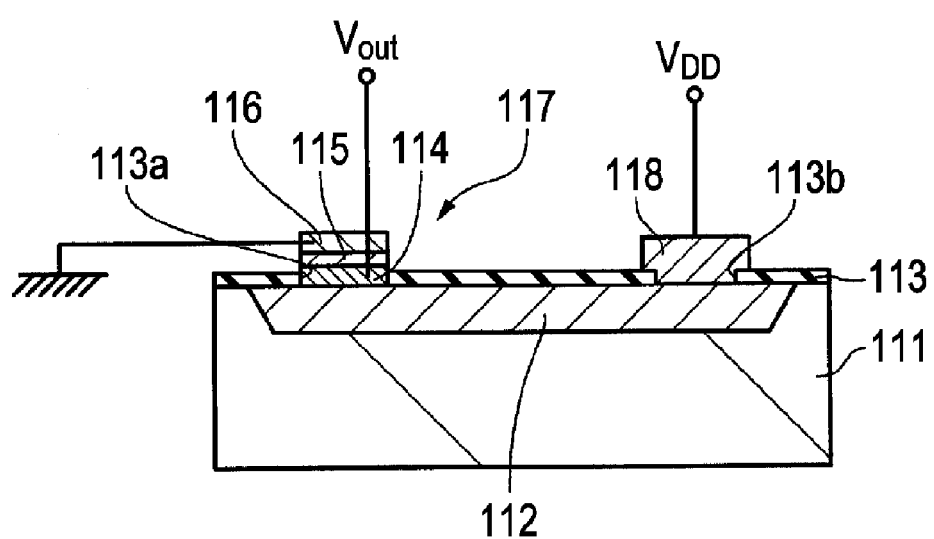
FIG. 59 is a circuit diagram showing an example of the structure of the inverter circuit according to the ninth embodiment.

FIG. 59 shows an example of the structure of the inverter circuit. In this example, as shown in FIG. 59, an n-type layer 112 serving as the load resistor RL is formed in a p-type silicon substrate 111 (or in a p-well layer formed in an n-type silicon substrate). An insulating film 113 such as an SiO2 film is formed on the surface of the p-type silicon substrate 111. Openings 113a and 113b are formed in the insulating film 113 at two ends of the n-type layer 112. A gold electrode 114 is disposed on the n-type layer 112 in the opening 113a. An electron transfer protein 115 similar to those used in the photoelectric transducers according to the first to third embodiments is immobilized on the gold electrode 114, and a counter electrode 116 is disposed thereon. The electrode 114, the electron transfer protein 115, and the counter electrode 116 constitute a photoelectric transducer 117. The electrode 118 is in ohmic contact with the n-type layer 112 via the opening 113b. In addition to the above inverter circuit, various electronic circuits (such as an amplifier circuit) driven by the output voltage Vout may be optionally formed on the p-type silicon substrate 111.

According to the ninth embodiment, a novel inverter circuit, using a protein, that can be stably used over an extended period of time can be configured, and various circuits such as logic circuits can be configured using the inverter circuit.

10. Tenth Embodiment

Photosensor

Figure 60:
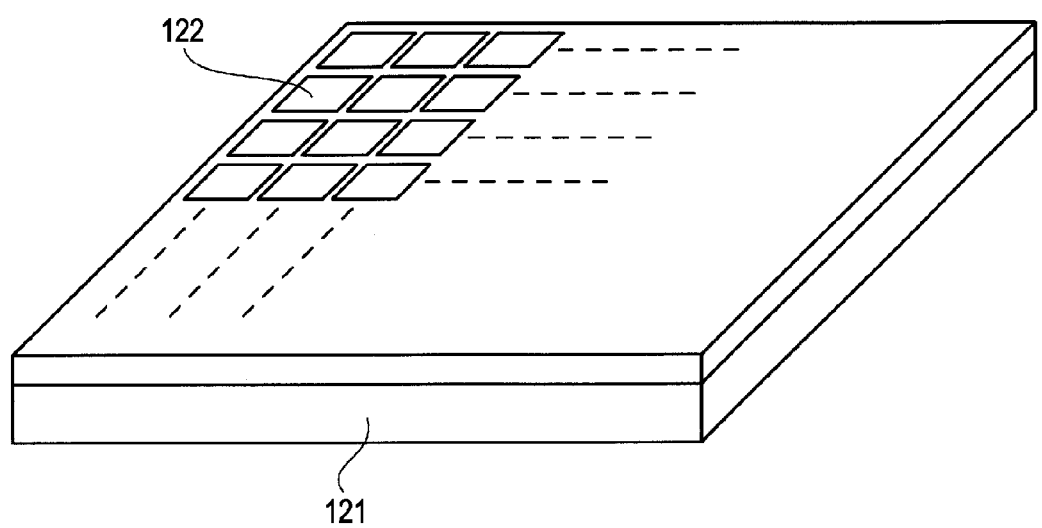
FIG. 60 is a schematic diagram showing a photosensor according to a tenth embodiment.

FIG. 60 shows a photosensor according to a tenth embodiment.

As shown in FIG. 60, this photosensor has light-sensitive elements 122 arranged on a silicon substrate 121 in a two-dimensional matrix and composed of photoelectric transducers similar to those of the first to fourth embodiments. The silicon substrate 121 has an integrated circuit including circuits of the photosensor, such as signal-processing circuits and drive circuits.

Figure 61:
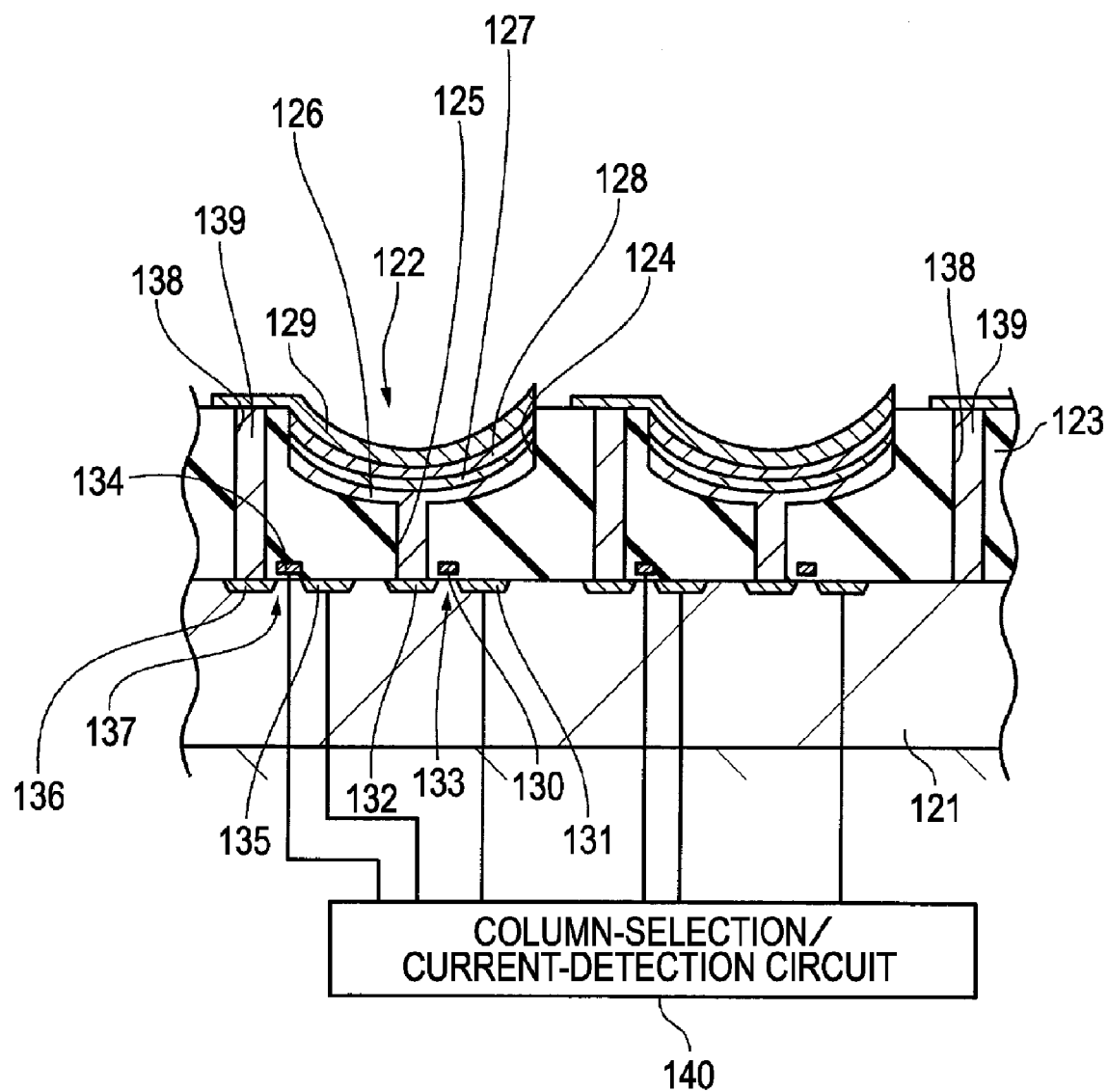
FIG. 61 is a sectional view showing the photosensor according to the tenth embodiment.

FIG. 61 shows the details of the structure of each light-sensitive element 122. As shown in FIG. 61, an insulating film 123 such as an SiO2 film is formed on, for example, a p-type silicon substrate 121. A recess 124 having a predetermined planar shape such as a square shape is formed on the top of the insulating film 123. A contact hole 125 having a predetermined planar shape such as a circular shape is formed in the center of the recess 124. A gold electrode 126 is formed on the bottom surface of the recess 124. The gold electrode 126 is also formed in the contact hole 125. An electron transfer protein 127 is immobilized on the gold electrode 126 directly or with cytochrome c therebetween, as in the first to third embodiments. A solid electrolyte layer 128 is disposed on the electron transfer protein 127, and a counter electrode 129 is disposed on the solid electrolyte layer 128. The gold electrode 126, the electron transfer protein 127, the solid electrolyte layer 128, and the counter electrode 129 constitute a photoelectric transducer. The photoelectric transducer constitutes the light-sensitive element 122.

An n-channel MOSFET 133 is formed on the p-type silicon substrate 121, including a gate electrode 130 formed thereon with a gate-insulating film therebetween, an n-type source region 131, and an n-type drain region 132. The gold electrode 126 is in contact with the drain region 132 of the n-channel MOSFET 133 via the contact hole 125. In addition, an n-channel MOSFET 137 is formed on the p-type silicon substrate 121, including a gate electrode 134 formed thereon with the gate-insulating film therebetween, an n-type source region 135, and an n-type drain region 136. An end of a counter electrode 129 extends to the top of the insulating film 123 outside the recess 124, and the extending portion is in contact with the drain region 136 of the n-channel MOSFET 137 via a metal 139 embedded in a contact hole 138 formed in the insulating film 123. The source region 131 of the n-channel MOSFET 133 and the gate electrode 134 and the source region 135 of the n-channel MOSFET 137 are connected to a column-selection/current-detection circuit 140.

Figure 62:
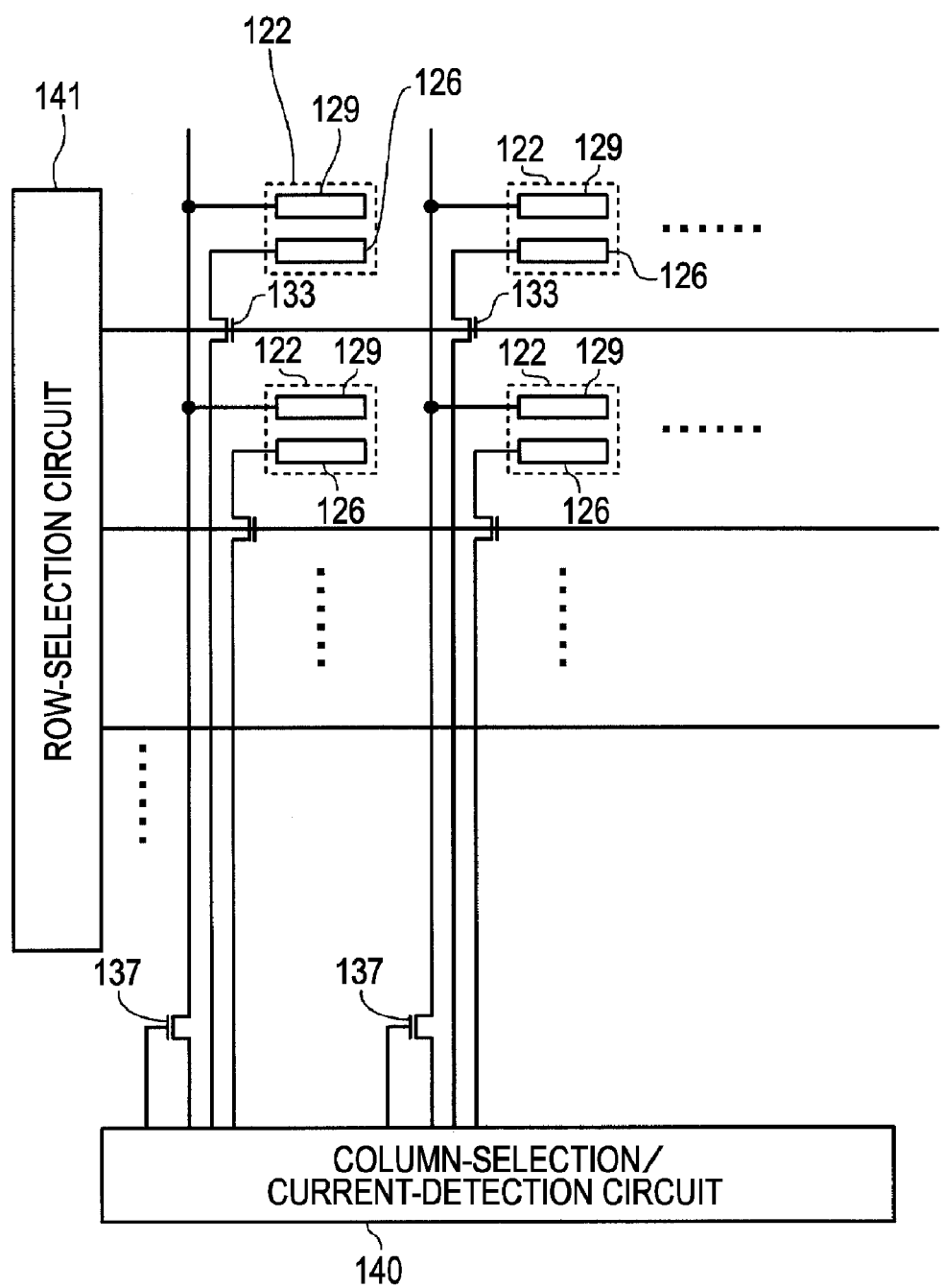
FIG. 62 is a circuit diagram showing the photosensor according to the tenth embodiment.

FIG. 62 shows an example of the circuit configuration of the photosensor. As shown in FIG. 62, a row-selection circuit 141 and the column-selection/current-detection circuit 140 select the light-sensitive elements 122 arranged on the silicon substrate 121 in a two-dimensional matrix and detect a photocurrent from the light-sensitive elements 122. The row-selection circuit 141 and the column-selection/current-detection circuit 140 can be configured in the same manner as those of a typical semiconductor memory.

According to the tenth embodiment, a novel photosensor, using an electron transfer protein for the light-sensitive elements 122, that has high definition and high sensitivity and that can be stably used over an extended period of time can be realized.

While embodiments and examples of the present application have been specifically described above, the invention is not limited to the above embodiments and examples; various modifications are permitted without departing from the spirit of the invention.

For example, the values, structures, configurations, shapes, materials, etc. used in the above embodiments and examples are merely illustrative, and different values, structures, configurations, shapes, materials, etc. may be selected as appropriate.

In addition, the photoelectric transducers according to the first to third embodiments may be used in combination to configure a device such as a color imaging device or a photosensor.

Figure 36:
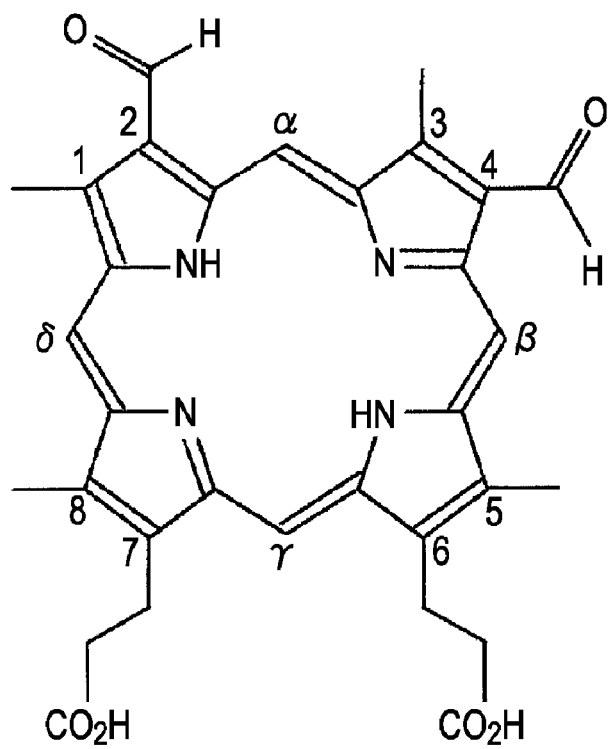
FIG. 36 is a schematic diagram showing diformyldeuteroporphyrin.
Figure 37:
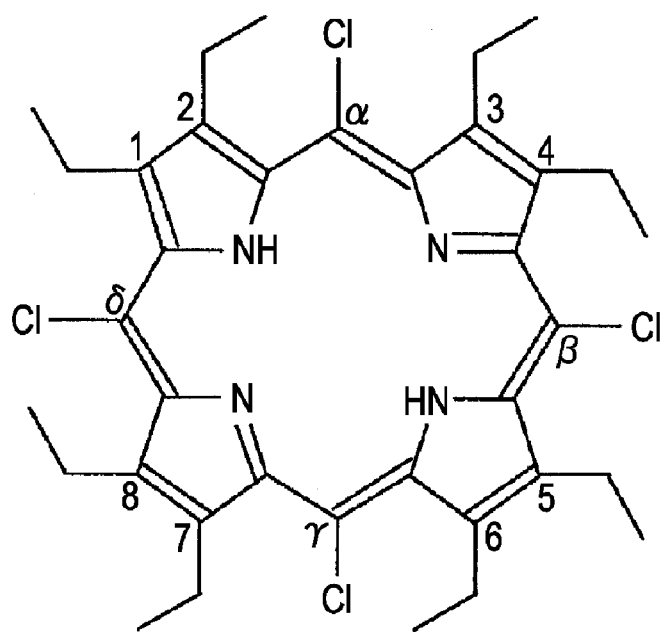
FIG. 37 is a schematic diagram showing esotetrachlorooctaethylporphyrin.
Figure 38:
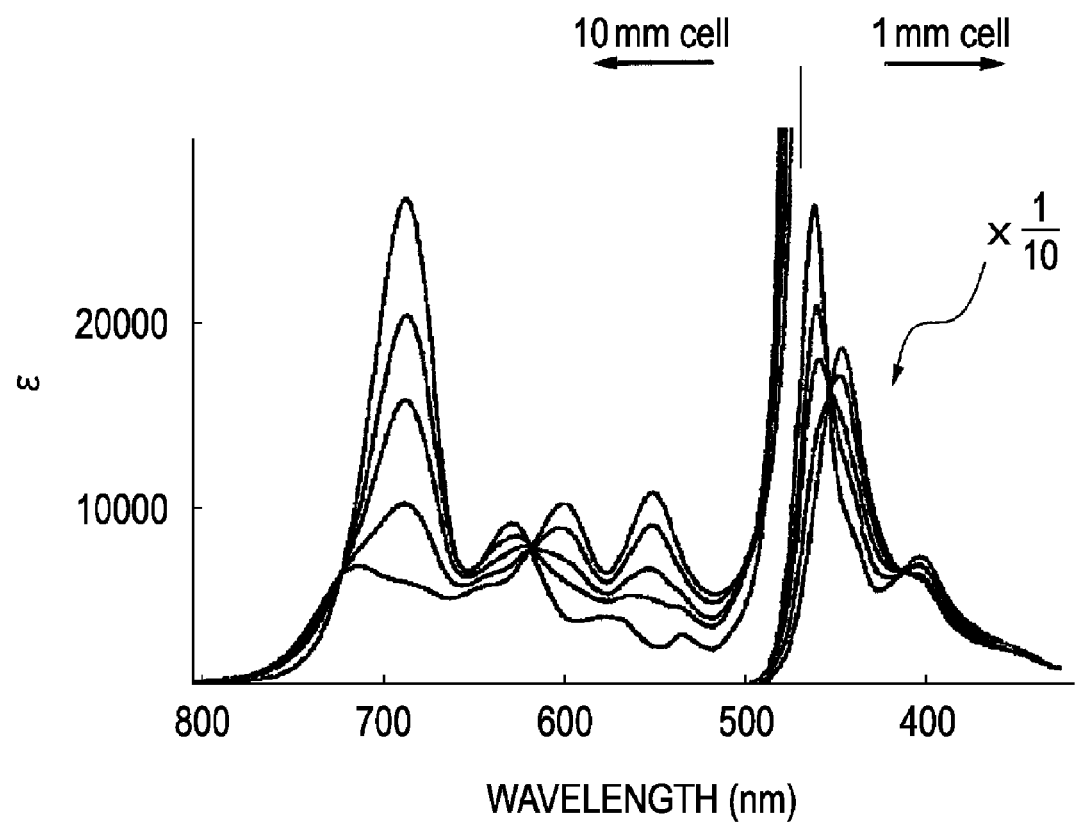
FIG. 38 is a graph showing the results of absorption spectrum measurement of mesotetrachlorooctaethylporphyrin.
Figure 39:
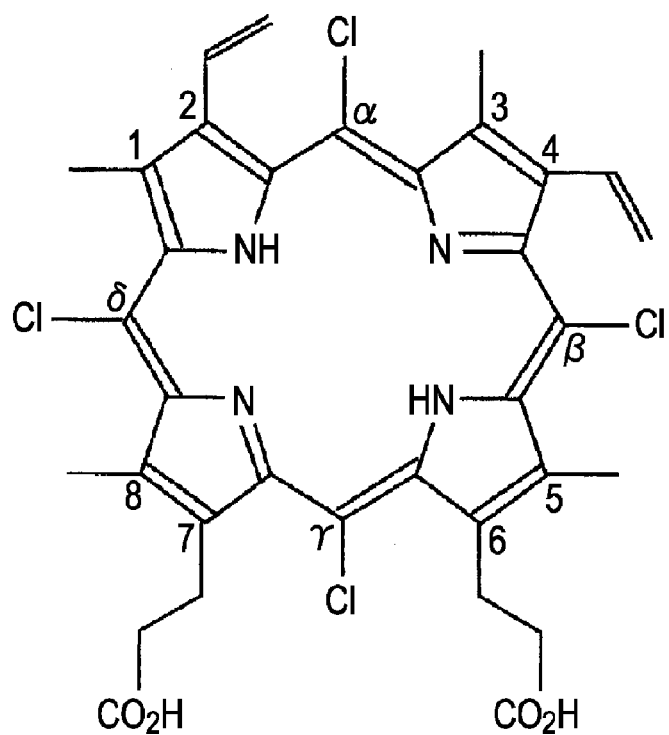
FIG. 39 is a schematic diagram showing mesotetrachloroporphyrin.

Furthermore, a molecular device according to an embodiment or the mechanism thereof may be applied to configure a monomolecular optical switching device or a molecular wire proposed in Patent Document 4 (see FIGS. 36 to 38 of the document).

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The invention claimed is:

1. A molecular device comprising:
a gold electrode;
cytochrome c552 or a derivative or variant thereof immobilized on the gold electrode; and
an electron transfer protein coupled to the cytochrome c552 or the derivative or variant thereof;
wherein electrons or holes, or both, are transferred through the electron transfer protein by transition of electrons between molecular orbitals of the electron transfer protein.

2. The molecular device according to claim 1, wherein the cytochrome c552 or the derivative or variant thereof is immobilized with a hydrophobic portion thereof facing the gold electrode.

3. The molecular device according to claim 2, wherein the cytochrome c552 or the derivative or variant thereof is coupled to the gold electrode with a self-assembled molecular monolayer therebetween.

4. The molecular device according to claim 3, wherein the self-assembled molecular monolayer is formed using a hydrophobic thiol and a hydrophilic thiol.

5. The molecular device according to claim 1, wherein the molecular orbitals are a first molecular orbital localized in a first amino acid residue of the electron transfer protein and a second molecular orbital localized in a second amino acid residue of the electron transfer protein and having the maximum transition probability per unit time for the first molecular orbital, electrons or holes, or both, being transferred between the first and second amino acid residues.

6. The molecular device according to claim 5, wherein the first and second amino acid residues constitute start and end points of the transfer of electrons or holes.

7. The molecular device according to claim 5, wherein electrons or holes are generated from one of the first and second molecular orbitals by photoexcitation.

8. The molecular device according to claim 1, wherein the electron transfer protein is zinc-substituted cytochrome c or a metal-substituted cytochrome c552.

9. An imaging device comprising molecular devices, each including:
   a gold electrode;
   cytochrome c552 or a derivative or variant thereof immobilized on the gold electrode; and
   an electron transfer protein coupled to the cytochrome c552 or the derivative or variant thereof;
   wherein electrons or holes, or both, are transferred through the electron transfer protein by transition of electrons between molecular orbitals of the electron transfer protein.

10. A photosensor comprising a molecular device including:
    a gold electrode;
    cytochrome c552 or a derivative or variant thereof immobilized on the gold electrode; and
    an electron transfer protein coupled to the cytochrome c552 or the derivative or variant thereof;
    wherein electrons or holes, or both, are transferred through the electron transfer protein by transition of electrons between molecular orbitals of the electron transfer protein.

11. An electronic apparatus comprising a molecular device including:
    a gold electrode;
    cytochrome c552 or a derivative or variant thereof immobilized on the gold electrode; and
    an electron transfer protein coupled to the cytochrome c552 or the derivative or variant thereof;
    wherein electrons or holes, or both, are transferred through the electron transfer protein by transition of electrons between molecular orbitals of the electron transfer protein.

12. A molecular device comprising a metal-substituted cytochrome c552 or a derivative or variant thereof or a cytochrome c552 modified zinc-porphyrin;
    wherein electrons or holes, or both, are transferred through the metal-substituted cytochrome c552 or the derivative or variant thereof or the cytochrome c552 modified zinc-porphyrin by transition of electrons between molecular orbitals of the metal-substituted cytochrome c552 or the derivative or variant thereof or the cytochrome c552 modified zinc-porphyrin.

13. An imaging device comprising molecular devices, each including a metal-substituted cytochrome c552 or a derivative or variant thereof or a cytochrome c552 modified zinc-porphyrin;
    wherein electrons or holes, or both, are transferred through the metal-substituted cytochrome c552 or the derivative or variant thereof or the cytochrome c552 modified zinc-porphyrin by transition of electrons between molecular orbitals of the metal-substituted cytochrome c552 or the derivative or variant thereof or the cytochrome c552 modified zinc-porphyrin.

14. A photosensor comprising a molecular device including a metal-substituted cytochrome c552 or a derivative or variant thereof or a cytochrome c552 modified zinc-porphyrin;
    wherein electrons or holes, or both, are transferred through the metal-substituted cytochrome c552 or the derivative or variant thereof or the cytochrome c552 modified zinc-porphyrin by transition of electrons between molecular orbitals of the metal-substituted cytochrome c552 or the derivative or variant thereof or the cytochrome c552 modified zinc-porphyrin.

15. An electronic apparatus comprising a molecular device including a metal-substituted cytochrome c552 or a derivative or variant thereof or a cytochrome c552 modified zinc-porphyrin;
    wherein electrons or holes, or both, are transferred through the metal-substituted cytochrome c552 or the derivative or variant thereof or the cytochrome c552 modified zinc-porphyrin by transition of electrons between molecular orbitals of the metal-substituted cytochrome c552 or the derivative or variant thereof or the cytochrome c552 modified zinc-porphyrin.

* * * * *